(12) United States Patent
Funaki

(10) Patent No.: US 7,242,042 B2
(45) Date of Patent: Jul. 10, 2007

(54) SOLID STATE IMAGE SENSING DEVICE AND MANUFACTURING AND DRIVING METHODS THEREOF

(75) Inventor: Masaki Funaki, Ichikawa (JP)

(73) Assignee: Victor Company of Japan, Ltd., Yokohama (JP)

( * ) Notice: Subject to any disclaimer, the term of this patent is extended or adjusted under 35 U.S.C. 154(b) by 0 days.

(21) Appl. No.: 11/671,693

(22) Filed: Feb. 6, 2007

(65) Prior Publication Data
US 2007/0134836 A1    Jun. 14, 2007

Related U.S. Application Data

(62) Division of application No. 11/044,864, filed on Jan. 28, 2005, now Pat. No. 7,193,257.

(30) Foreign Application Priority Data

Jan. 29, 2004   (JP) ............................... 2004-021895
Sep. 3, 2004    (JP) ............................... 2004-256494

(51) Int. Cl.
*H01L 31/062* (2006.01)

(52) U.S. Cl. ...................... 257/291; 257/292; 257/294; 257/423; 257/414; 438/48

(58) Field of Classification Search .................. None
See application file for complete search history.

(56) References Cited

FOREIGN PATENT DOCUMENTS

| JP | 60-206063   | 10/1985 |
|----|-------------|---------|
| JP | 10-041493   | 2/1998  |
| JP | 11-195778   | 7/1999  |
| JP | 2001-160620 | 6/2001  |

*Primary Examiner*—Evan Pert
*Assistant Examiner*—Tan Tran
(74) *Attorney, Agent, or Firm*—Connolly Bove Lodge & Hutz LLP

(57) ABSTRACT

A solid state image sensing device is composed of a second conductive type well area 33, a photoelectric conversion area 40, a ring shaped gate electrode 35, a transfer gate electrode 41, a second conductive type drain area 38, a second conductive type source area 36, and a first conductive type source neighborhood area 37.

1 Claim, 34 Drawing Sheets

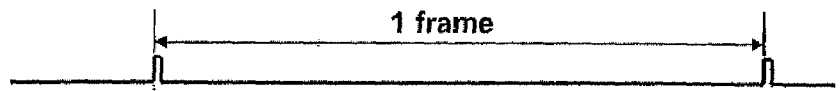
Fig. 3(a)
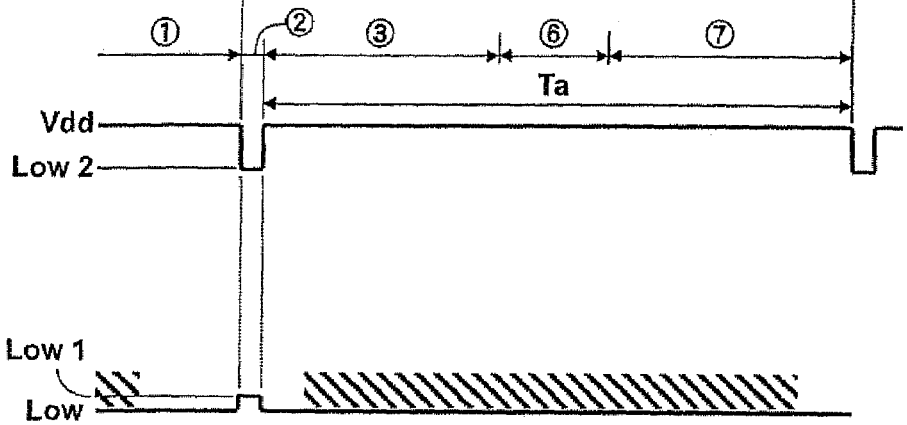
Fig. 3(b)
Fig. 3(c)
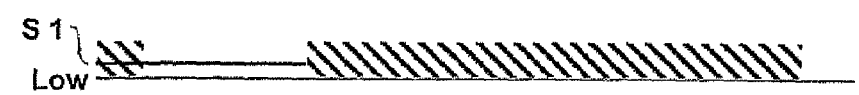
Fig. 3(d)
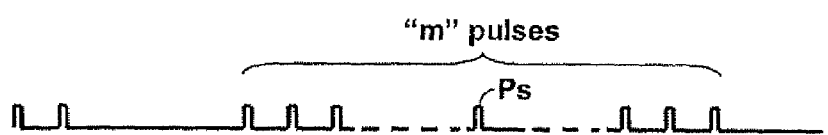
Fig. 3(e)
Fig. 3(f)

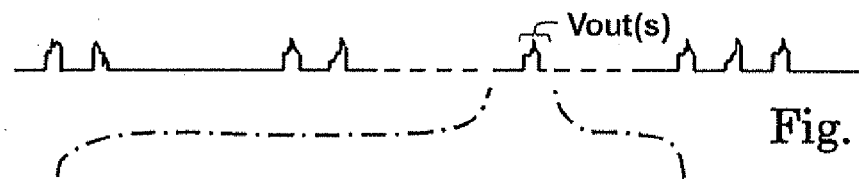
Fig. 3(g)
Fig. 3(h)
Fig. 3(i)
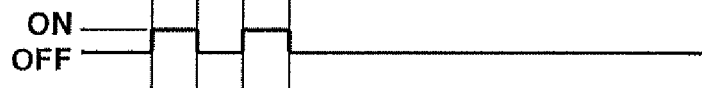
Fig. 3(j)
Fig. 3(k)
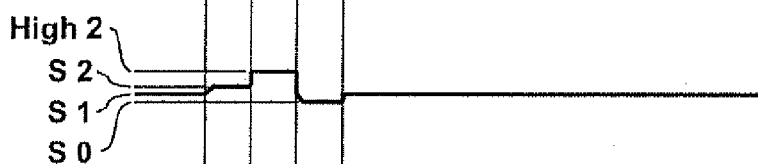
Fig. 3(l)
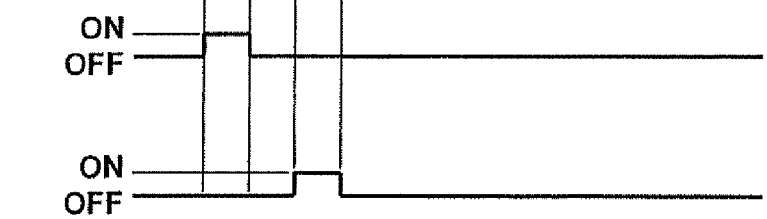
Fig. 3(m)
Fig. 3(n)
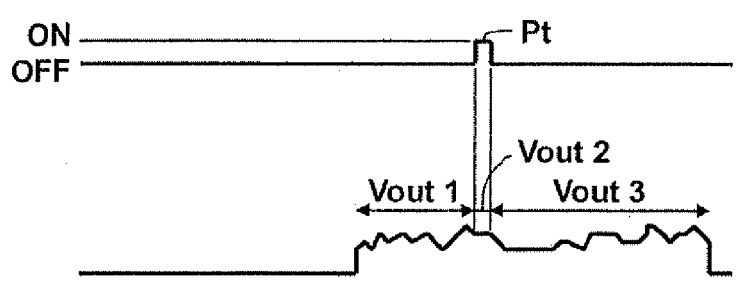
Fig. 3(o)
Fig. 3(p)

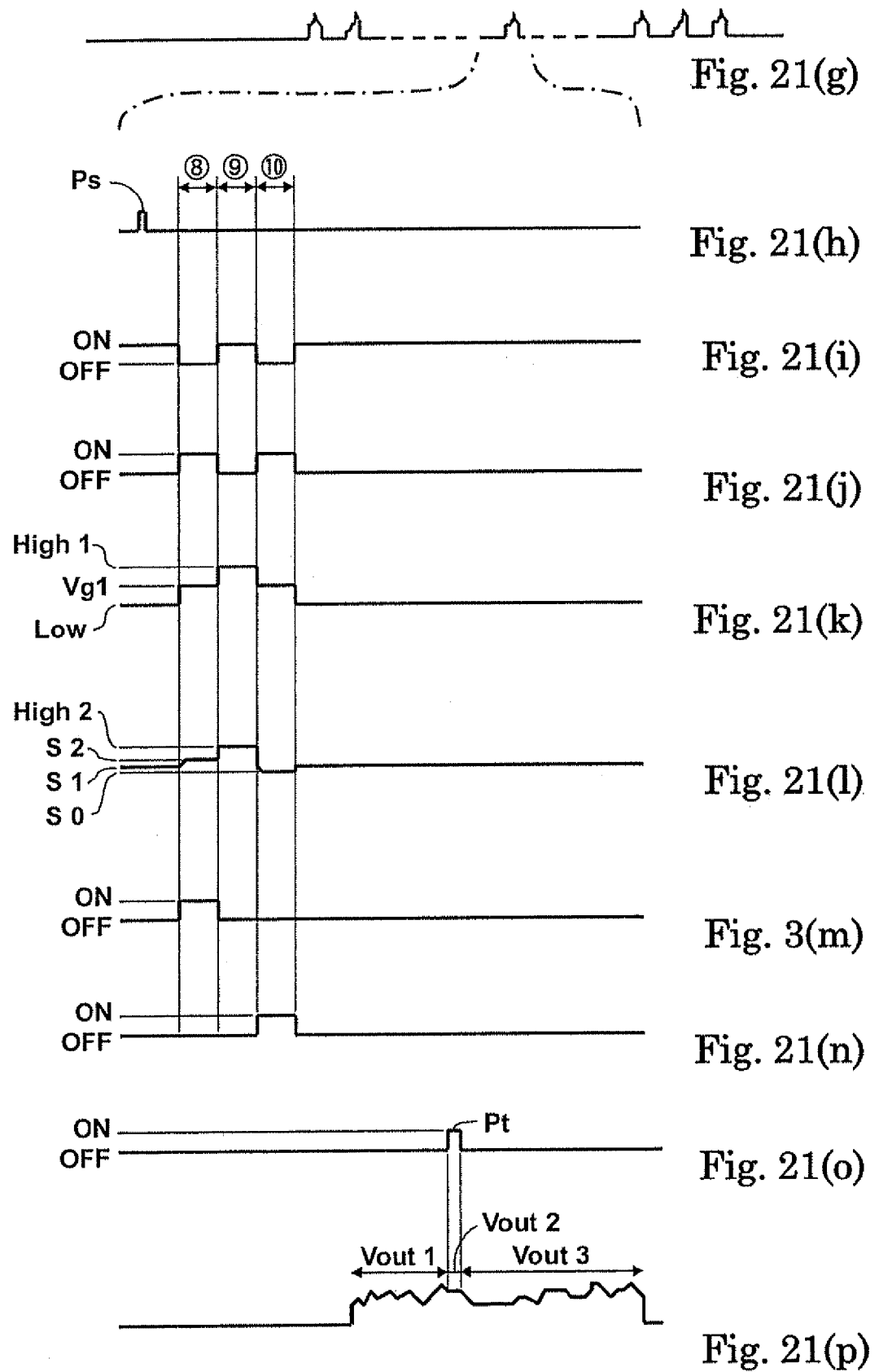

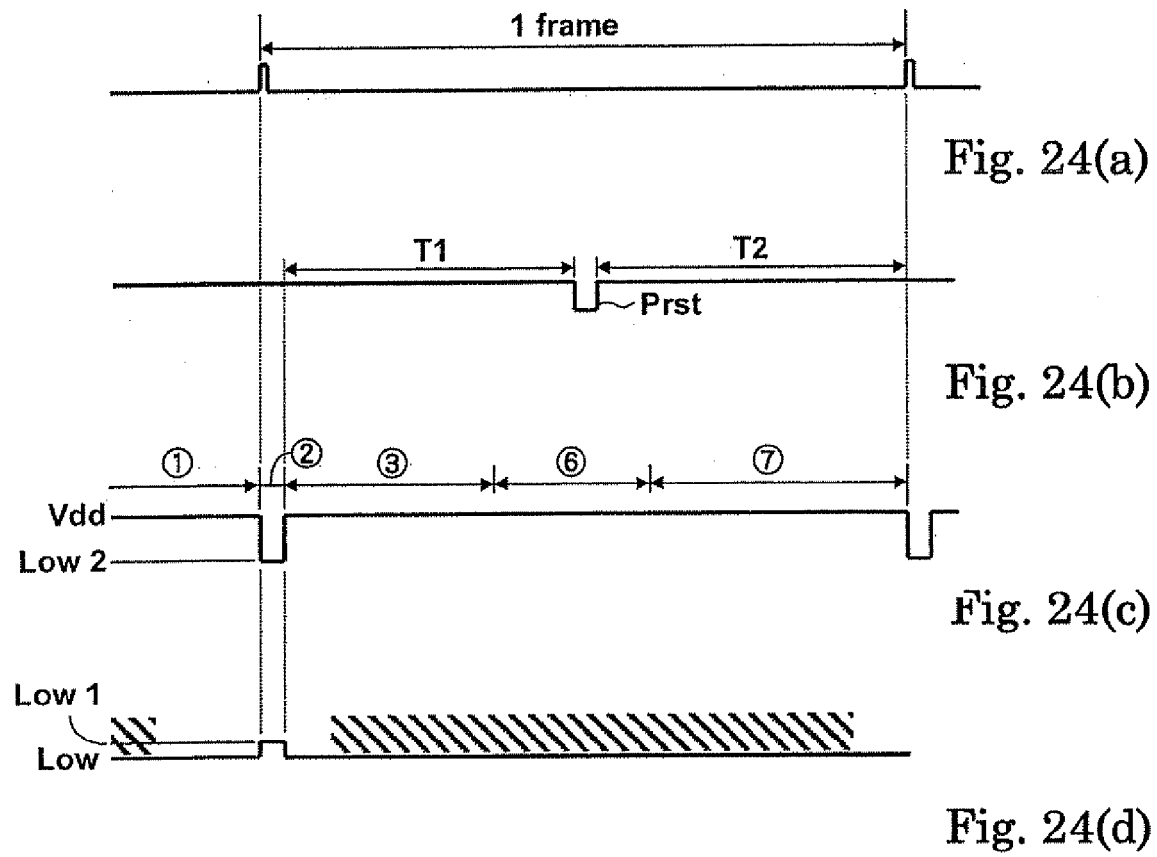
Fig. 24(a)
Fig. 24(b)
Fig. 24(c)
Fig. 24(d)
Fig. 24(e)
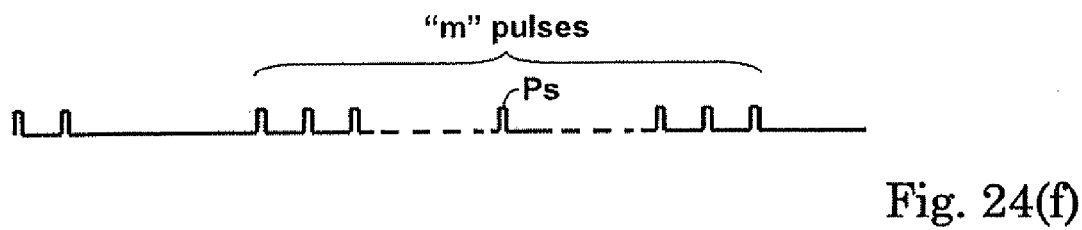
Fig. 24(f)
Fig. 24(g)

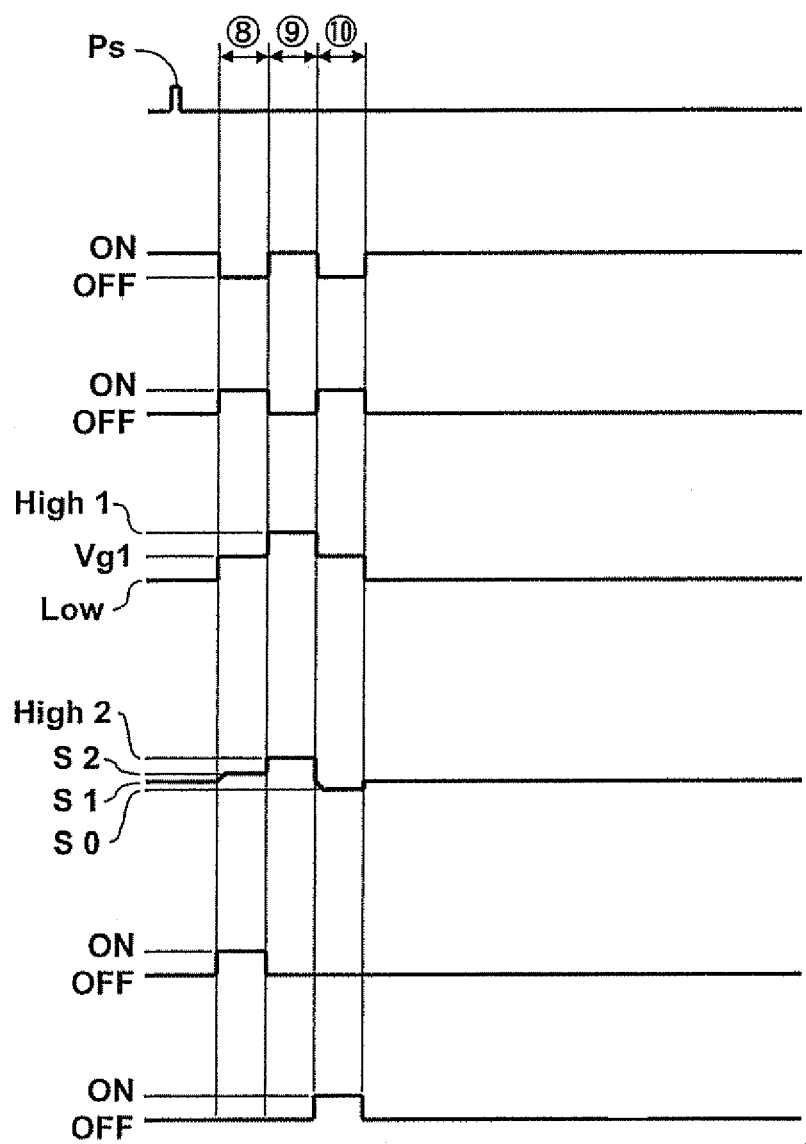

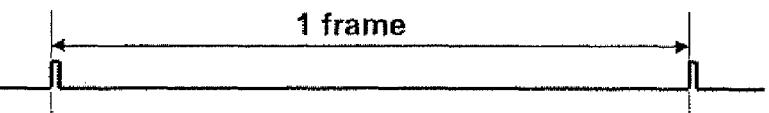
Fig. 30(a)
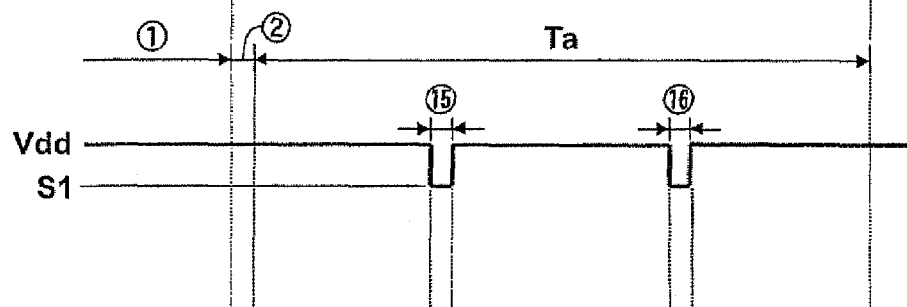
Fig. 30(b)
Fig. 30(c)
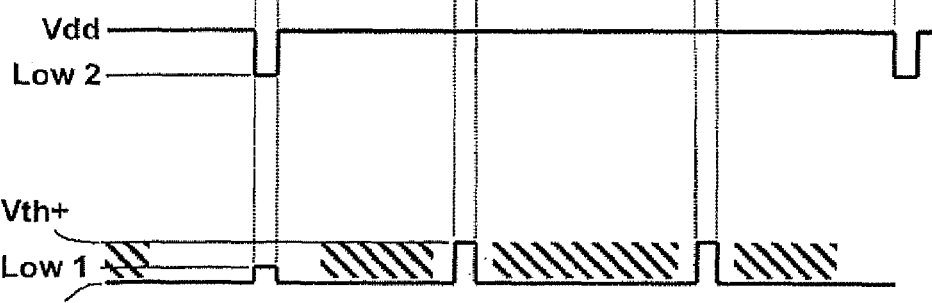
Fig. 30(d)
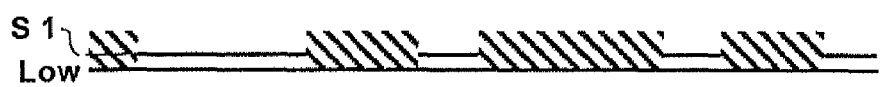
Fig. 30(e)
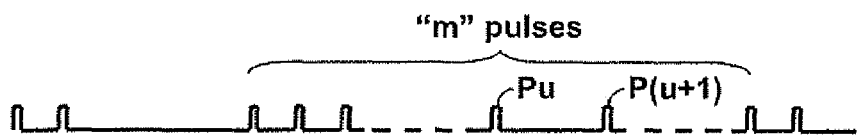
Fig. 30(f)
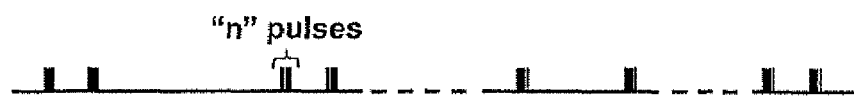
Fig. 30(g)

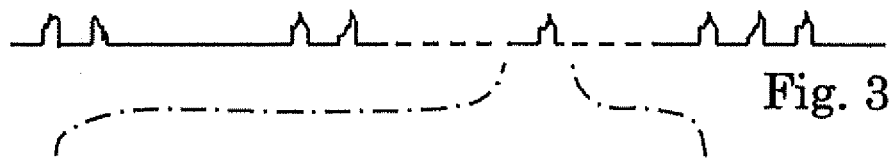
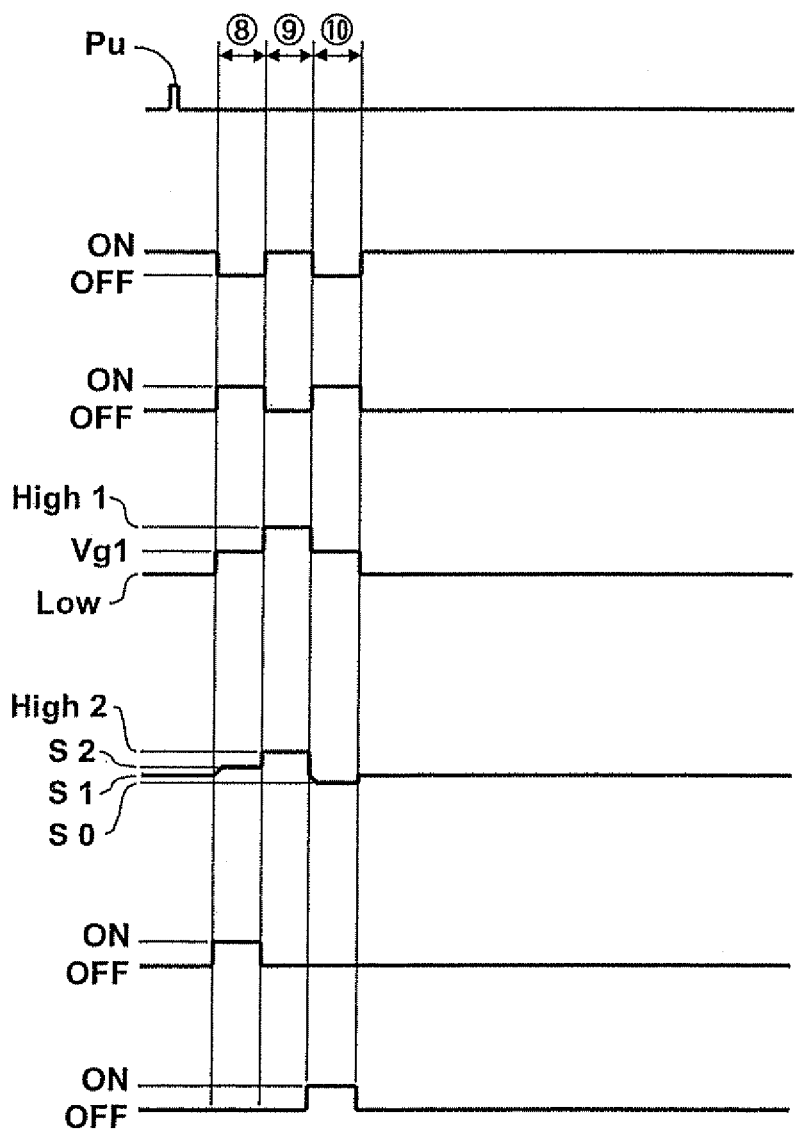
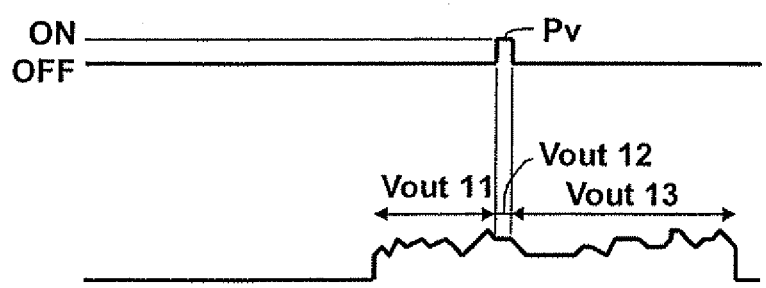

SOLID STATE IMAGE SENSING DEVICE AND MANUFACTURING AND DRIVING METHODS THEREOF

This application is a Divisional of application Ser. No. 11/044,864, filed on Jan. 28, 2005 now U.S. Pat. No. 7,193,257, and for which priority is claimed under 35 U.S.C. § 120; and this application claims priority of Application No. 2004-021895 filed in Japan on Jan. 29, 2004 and Application No. 2004-256464 filed in Japan on Sep. 3, 2004 under 35 U.S.C. § 119; the entire contents of all are hereby incorporated by reference.

BACKGROUND OF THE INVENTION

1. Field of the Invention

The present invention relates to a solid state image sensing device, and manufacturing and driving methods thereof, particularly, relates to a solid state image sensing device provided with an amplifying element having a ring shaped gate electrode in each pixel and manufacturing and driving methods thereof.

2. Description of the Related Art

Solid state image sensing devices are divided broadly into two types: the one is a charge coupled device (CCD) and the other is a complimentary metal oxide semiconductor (CMOS) image sensor. The CCD out of the two types of solid state image sensing devices transfers an electric charge, which is obtained through photoelectric conversion process by a photo diode, outside a pixel. The electric charge is converted into a voltage signal and amplified, and then outputted outside the CCD chip.

On the other hand, in the case of a CMOS image sensor, the CCD image sensor converts an electric charge, which is obtained through the photoelectric conversion process by a photo diode, into an electrical signal such as a voltage signal and a current signal in a pixel, and then the electrical signal is outputted outside the pixel. Almost all CMOS image sensors are provided with a transistor for amplifying in each pixel. Consequently, a CMOS image sensor is often provided with more than three transistors in one pixel. A lot of space of one pixel is devoted to these transistors, so that a CMOS image sensor is said to be disadvantageous to miniaturization in comparison with a CCD.

In this connection, a type of image sensor having only one or two transistors in one pixel has been developed. A transistor provided in such a type of image sensor is characterized by having a ring shaped gate electrode. Generally, diffusion in the middle of the ring of the ring shaped gate electrode functions as a source of the transistor. However, the diffusion is isolated from other diffusion by the ring shaped gate electrode, so that configuration of the transistor enables to be simplified. In this regard, such a type of image sensor should be categorized as one type of CMOS image sensor as far as the image sensor is provided with a MOSFET (Metal Oxide Semiconductor Field Effect Transistor) for amplifying in each pixel.

The most typical example of such an image sensor is a solid state image sensing device called the CMD (Charge Modulation Device), which was disclosed in the Japanese publication of unexamined patent applications No. 60-206063/1985.

FIG. 32 is a cross sectional view of the solid state image sensing device called the CMD according to the first prior art. In FIG. 32, the conventional solid state image sensing device is composed of a p⁻-type substrate 501, an n⁻-type epitaxial layer 502 that is grown with constituting a channel area on the p-type substrate 501, an n⁺-type circular source diffusion layer 503 that is formed by adding n-type impurities into the n⁻-type epitaxial layer 502, an n⁺-type drain diffusion layer 504 that is concentrically formed with completely surrounding the n⁺-type circular source diffusion layer 503, a source electrode 505, and a drain electrode 506, wherein the source electrode 505 and the drain electrode 506 is made from aluminum and jointed to the n⁺-type circular source diffusion layer 503 and the n⁺-type drain diffusion layer 504 respectively.

Further, a p-type gate area 507 is formed on the surface of the n⁻-type epitaxial layer 502 through a process such as the ion implantation method so as to cove over the n⁺-type source diffusion layer 503 and the n⁺-type drain diffusion layer 504.

Furthermore, a concentric insulative gate is formed by providing a gate electrode 509 made from a transparent conductive material on the surface of the n⁻-type epitaxial layer 503 between the n⁺-type circular source diffusion layer 503 and the n⁺-type drain diffusion layer 504 with sandwiching a gate insulative film 508 so as to completely surround the n⁺-type circular source diffusion layer 503.

In the CMD having the above-mentioned configuration, a depletion layer is formed by applying certain voltage to the gate electrode 509, and conducted to be a light receiving section, that is, a so-called photo gate type light receiving element, which is simple in configuration such that one transistor combines a light receiving element with an amplifying element. Electric charges pooled right under the gate electrode 509 make threshold voltage of the transistor change by the substrate effect, make an output voltage of the source change, and result in an electrical signal. A hole is discharged to the substrate when a high voltage is applied to the source electrode 505 and the gate electrode 509 after the electrical signal is read out.

However, the photo gate type light receiving element mentioned above is weak in sensitivity in comparison with an buried photo diode that is commonly used in a CCD because light is absorbed while the light passes through the gate electrode 509.

Further, there exists a problem such that noise easily occurs in an interfacial area of the gate insulative film 508 although the gate area 107 as a p-well directly contacts with the interfacial area of the gate insulative film 508.

Furthermore, there exists another problem such that generated electric charges are evenly distributed over the gate electrode 509 by this configuration, and resulting in degrading efficiency of converting an electric charge into voltage.

In order to improve the problems, the Japanese publication of unexamined patent applications No. 11-195778/1999 disclosed a solid state image sensing device. The solid state image sensing device is in the configuration that is provided with not only a light receiving diode and an insulative gate type field effect transistor (FET) sharing a well area but also a concentrated buried layer (carrier pocket), which is provided adjacent to a source diffusion area in the well area under a channel area of the FET.

FIG. 33 is a cross sectional view of the solid state image sensing device according to the second prior art disclosed in the Japanese publication of unexamined patent applications No. 11-195778/1999. In FIG. 33, the solid state image sensing device is a ring shaped MOSFET, which is provided with an n-well 612 that is formed on the surface of a p⁺-type substrate 611, an buried p-well 613 that is formed in the n-well 612, a ring shaped gate electrode 614 that is formed on the buried p-well 613, an n⁺-type drain diffusion layer 615 that is also formed on the buried p-well 613 so as to surround the outer circumferential area of the gate electrode 614, and an n+-type source diffusion layer 616 that is formed in the middle of the ring shaped gate electrode 614.

In this configuration, the buried p-well 613, which is provided under the n+-type drain diffusion layer 615 of the ring shaped MOSFET, is conducted to be an buried photo diode. Then, a p+ area (hereinafter referred to as carrier pocket) 617 is formed in an area adjacent to the n+-type source diffusion layer 616 of the MOSFET as a highly concentrated buried layer of which concentration of p-type impurity is increased. By this configuration, since an electric potential of the carrier pocket 617 is the lowest in the buried p-well 613, a hole generated by incident light in the buried photo diode provided under the n+-type drain diffusion layer 615 moves inside the buried p-well 613, and is concentrated in the carrier pocket 617. Consequently, voltage of an area adjacent to the source increases and threshold of the MOSFET decreases, so that change of the threshold results in an electrical signal. Holes concentrated in the carrier pocket 617 are discharged by applying a high voltage across a wiring 618 for the source electrode 616 and another wiring 619 for the gate electrode 614 after the electrical signal is read out.

As mentioned above, in the conventional solid state image sensing device, all electric charges generated by incident light move through a substrate as the buried p-well 613 without passing over the surface of the substrate in which noise easily occurs. Therefore, the conventional solid state image sensing device is characterized by low noise.

Further, generated electric charges are concentrated in the neighborhood of the source diffusion layer 616, so that the conventional solid state image sensing device is also characterized in that efficiency of converting an electric charge into voltage increases more.

The solid state image sensing devices disclosed in the Japanese publication of unexamined patent applications Nos. 60-206063/1985 and 11-195778/1999 adopt a so-called electric rolling shutter imaging system. The electric rolling shutter imaging system is such an imaging system that imaging time is shifted at each line or by each pixel. Such a rolling shutter imaging system causes a problem such that a picture being imaged is distorted when imaging a moving object or panning a camera. Consequently, a so-called frame shutter or global shutter imaging system in which time information is aligned at whole pixels is desirable for the imaging system. In the case of a CCD, electric charges generated by photo diodes in whole pixels are simultaneously transferred to a transfer path of the CCD, so that the frame shutter is accomplished.

The Japanese publication of unexamined patent applications No. 10-41493/1998 has disclosed the solid state image sensing device, which was provided with the ring shaped gate electrode and realized the frame shutter.

FIG. 34 is a cross sectional view of the solid state image sensing device according to the third prior art disclosed in the Japanese publication of unexamined patent applications No. 11-195778/1999. In FIG. 34, the solid state image sensing device is provided with a p-type substrate 721, an n-type semiconductor area (hereinafter referred to as n-well) 722 that is formed on the p-type substrate 721, a p-type semiconductor area 723 that is formed on a part of the n-well 722 constituting a unit pixel, and an n+-type semiconductor area 724 in highly concentrated form that is formed on the p-type semiconductor area 723, wherein these n+-type semiconductor area 724, p-type semiconductor area 723 and n-well 722 constitute a light receiving section that is called a photo diode sensor. The p-type semiconductor area 723 is equivalent to an area in where a signal charge generated by the photoelectric conversion is accumulated.

Further, a p-type semiconductor area 725 is formed on a part of the n-well 722 that constitutes a unit pixel, and then a ring shaped gate electrode 727 is formed above the surface of the p-type semiconductor area 725 with sandwiching a gate insulative film 726.

Furthermore, an n+-type source area 728 and an n+-type drain area 729 is formed in the p-type semiconductor area 725, wherein the n+-type source area 728 is formed in an area disposed right under the center portion of the ring shaped gate electrode 727, and wherein the n+-type drain area 729 is formed in another area corresponding to the outer peripheral area of the ring shaped gate electrode 727. Then the source electrode 731 is formed above the n+-type source area 728 with sandwiching the gate insulative film 726. Consequently, a CMOS transistor for reading out signals is formed, wherein the p-type semiconductor area 725 provided right under the gate electrode 727 functions as a signal charge accumulating section.

In addition thereto, a transfer gate electrode 730 is formed on the gate insulative film 726 in an area, which is allocated between the light receiving section and the CMOS transistor, above the n+-type semiconductor area 724.

As mentioned above, the conventional solid state image sensing device according to the third prior art shown in FIG. 34 is added with one transfer gate electrode 730, which is allocated in the area between the buried photo diode as the light receiving section and the ring shaped gate electrode 727. The conventional solid state image sensing device transfers signal charges, which are obtained through the photoelectric conversion in the light receiving section and accumulated in the p-type semiconductor area 723, to the p-type semiconductor area 725 disposed under the ring shaped gate electrode 727 by means of the transfer gate electrode 730 simultaneously with respect to whole pixels. Consequently, the frame shutter is accomplished. The conventional solid state image sensing device shown in FIG. 34 is identical to the conventional CMD according to the second prior art shown in FIG. 33 as far as the not buried p-type semiconductor area 725 spreads over whole area disposed under the ring shaped gate electrode 727.

The conventional solid state image sensing devices having the conventional ring shaped gate electrode resulted in following problems.

In the case of the conventional solid state image sensing device according to the second prior art disclosed in the Japanese publication of unexamined patent applications No. 11-195778/1999, as shown in FIG. 33, the carrier pocket 617 is constituted by providing a p+-area in the buried p-well 613, so that the p+-area is inevitably led to be excessively high in concentration. Consequently, voltage for resetting an electric charge in the carrier pocket 617 becomes higher. High voltage as high as 7 to 8 volts, for example, is essential. Since high voltage is essential to be applied as mentioned above, power consumption increases, and resulting in a problem such that a booster circuit is necessary to be provided.

In order to decrease the resetting voltage, it has only to reduce p+ concentration of the carrier pocket 617. However, it is impossible, in principle, to reduce the p+ concentration of the carrier pocket 617 lower than concentration of the buried p-well 613.

Further, an effect of concentrating electric charges is degraded otherwise the p+ concentration of the carrier pocket 617 is sufficiently higher than that of the p-well 613.

Consequently, it should be understood that there exists restriction for designating a range of p+ concentration of the carrier pocket 617.

On the other hand, for the purpose of realizing the frame shutter, it just has to provide one transfer gate electrode as the same manner as the conventional solid state image sensing device according to the third prior art disclosed in the Japanese publication of unexamined patent applications No. 10-41493/1998 shown in FIG. 34. However, the configuration of the transistor having the ring shaped gate electrode is identical to that of the conventional CMD according to the second prior art disclosed in the Japanese publication of unexamined patent applications No. 11-195778/1999, and the p-well is provided in whole area disposed under the ring shaped gate electrode, so that concentrating electric charges in the source area is disabled. Consequently, there exists a problem such that efficiency of converting an electric charge into voltage is degraded.

SUMMARY OF THE INVENTION

Accordingly, in consideration of the above-mentioned problems of the prior arts, an object of the present invention is to provide a solid state image sensing device and a manufacturing method thereof, wherein the solid state image sensing device enables to discharge electric charges accumulated in an area disposed under a ring shaped gate electrode to a substrate even in low voltage and to realize the frame shutter, and wherein the manufacturing method enables to manufacture the solid state image sensing device with a high degree of accuracy.

Another object of the present invention is to provide a solid state image sensing device and a driving method thereof, wherein the solid state image sensing device is provided with an amplifying element having a ring shaped gate electrode in a pixel, and wherein exposure time enables to be variable in the solid state image sensing device.

A further object of the present invention is to provide a solid state image sensing device and a manufacturing method thereof, wherein the solid state image sensing device enables to suppress noise, which occurs in an interfacial area of a gate insulative film under a ring shaped gate electrode.

In order to achieve the above object, the present invention provides, according to an aspect thereof, a solid state image sensing device in which a plurality of unit pixels containing a transistor for outputting a light signal having a ring shaped gate electrode and a photo diode is regularly arranged on a first conductive type substrate, each of the plurality of unit pixels comprising: a second conductive type well area provided over a surface of the first conductive type substrate; a first conductive type photoelectric conversion area of the photo diode provided in the second conductive type well area; the ring shaped gate electrode provided in an area other than the photoelectric conversion area on the second conductive type well area with sandwiching a gate insulative film; a transfer gate electrode provided in an area disposed between the ring shaped gate electrode and the first conductive type photoelectric conversion area, and formed on the gate insulative film above the second conductive type well area with sandwiching the gate insulative film; a second conductive type drain area in high concentration provided at least in a part of an area on the surface of the second conductive type well area, wherein the area excludes regions for the ring shaped gate electrode and the transfer gate electrode, and electrically combined with the second conductive type well area; a second conductive type source area provided in an area confronting with a center opening of the ring shaped gate electrode on the second conductive type well area; and a first conductive type source neighborhood area provided in the second conductive type well area so as to surround the second conductive type source area and not so as to reach to the second conductive type drain area.

According to another aspect of the present invention, there provided a manufacturing method of a solid state image sensing device in which a plurality of unit pixels containing a transistor for outputting a light signal having a ring shaped gate electrode and a photo diode is regularly arranged on a first conductive type substrate, the manufacturing method comprising steps of: forming a first conductive type source neighborhood area in a prescribed area allocated in a second conductive type well area provided over a surface of the first conductive type substrate; forming the ring shaped gate electrode on the second conductive type well area with sandwiching a gate insulative film, wherein a center opening of the ring shaped gate electrode is arranged to be allocated above the first conductive type source neighborhood area; forming a first conductive type high concentration area in the first conductive type source neighborhood area by injecting first conductive type impurity in high concentration into the first conductive type source neighborhood area through the ring shaped gate electrode as a mask; forming a second conductive type surface layer in high concentration by injecting second conductive type impurity into the first conductive type high concentration area through the ring shaped gate electrode as a mask; forming a side wall spacer on an inner wall of the center opening of the ring shaped gate electrode; and forming a second conductive type source area of the transistor for outputting a light signal on the second conductive type surface layer by injecting second conductive type impurity in high concentration into the second conductive type surface layer through the side wall spacer.

Other object and further features of the present invention will be apparent from the following detailed description when read in conjunction with the accompanying drawings.

BRIEF DESCRIPTION OF DRAWINGS

FIGS. 3(a) to 3(p) are timing charts for explaining operations in a driving method of the solid state image sensing device shown in FIG. 2.

FIGS. 30(a) to 30(q) are timing charts for explaining operations in a driving method of the solid state image sensing device according to the fourteenth embodiment of the present invention.

DETAILED DESCRIPTION OF THE PREFERRED EMBODIMENTS

First Embodiment

Figure 1A:
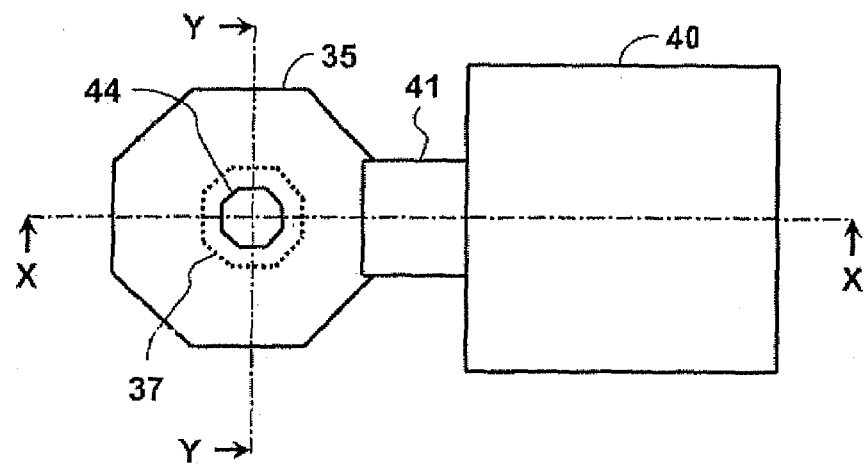
FIG. 1(a) is a plan view of a solid state image sensing device according to a first embodiment of the present invention.

FIG. 1(a) is a plan view of a solid state image sensing device according to a first embodiment of the present invention.

Figure 1B:
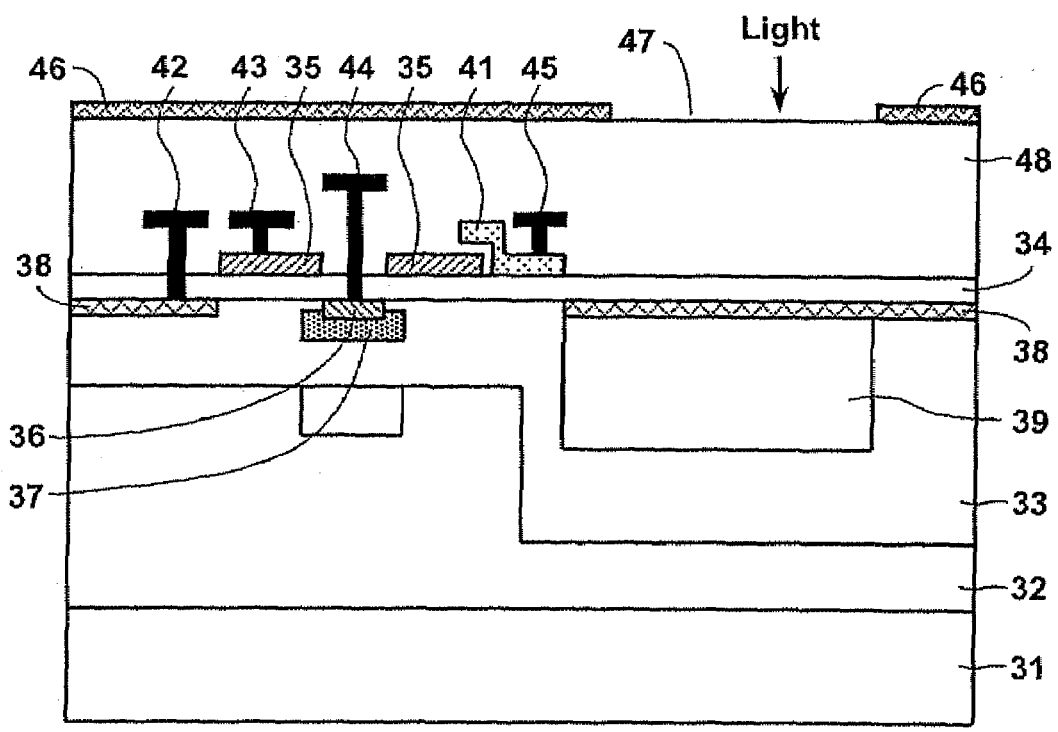
FIG. 1(b) is a fragmentary cross sectional view taken along line X-X of FIG. 1(a).

FIG. 1(b) is a fragmentary cross sectional view taken along line X-X of FIG. 1(a).

Figure 2:
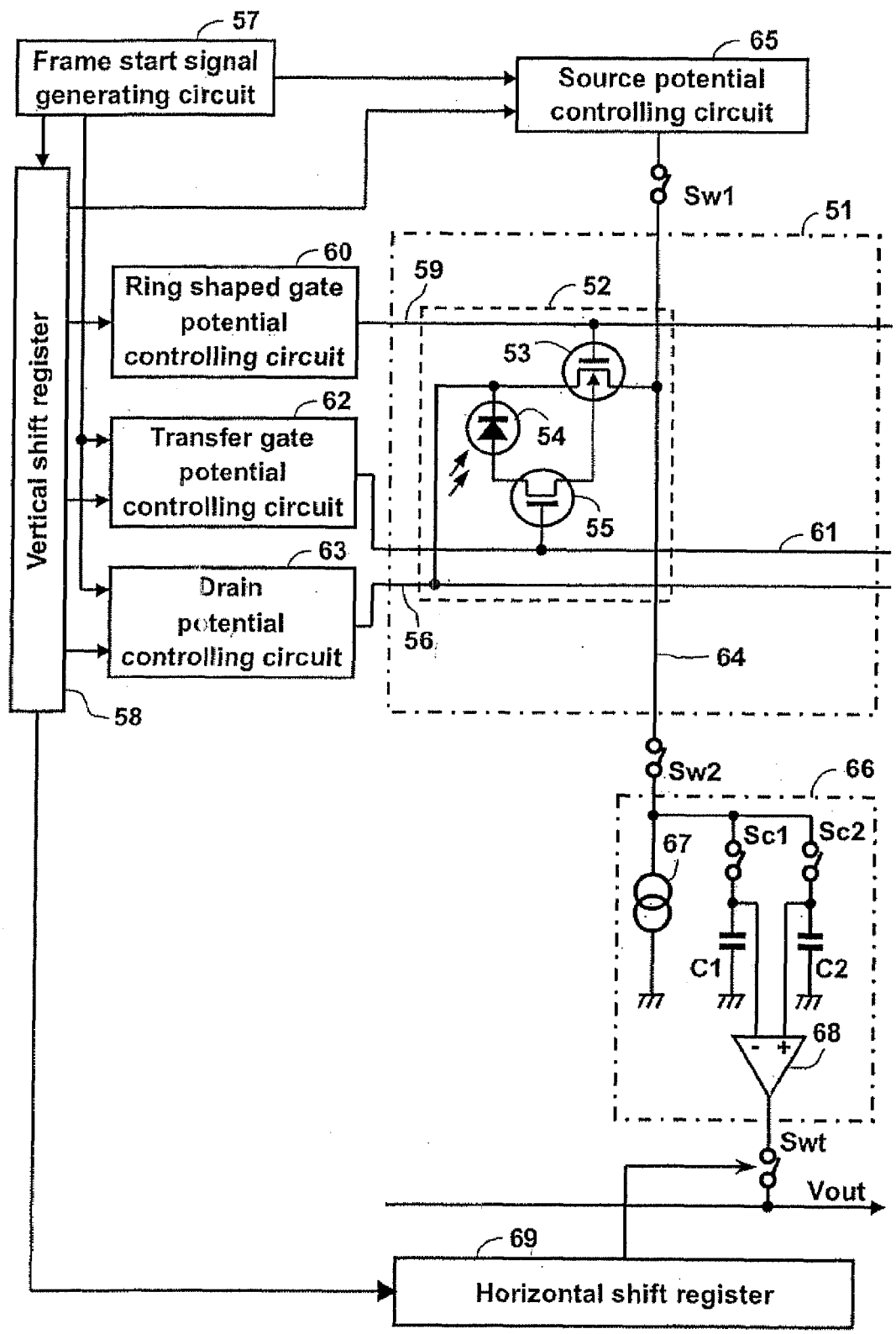
FIG. 2 is a diagram exhibiting a pixel configuration and a total configuration of the solid state image sensing device according to the first embodiment of the present invention.

FIG. 2 is a diagram exhibiting a pixel configuration and a total configuration of the solid state image sensing device according to the first embodiment of the present invention.

FIGS. 3(a) to 3(p) are timing charts for explaining operations in a driving method of the solid state image sensing device shown in FIG. 2.

FIGS. 4(a) to 4(h) are conceptual electric potential diagrams for explaining operations in the solid state image sensing device shown in FIG. 2.

Figure 5:
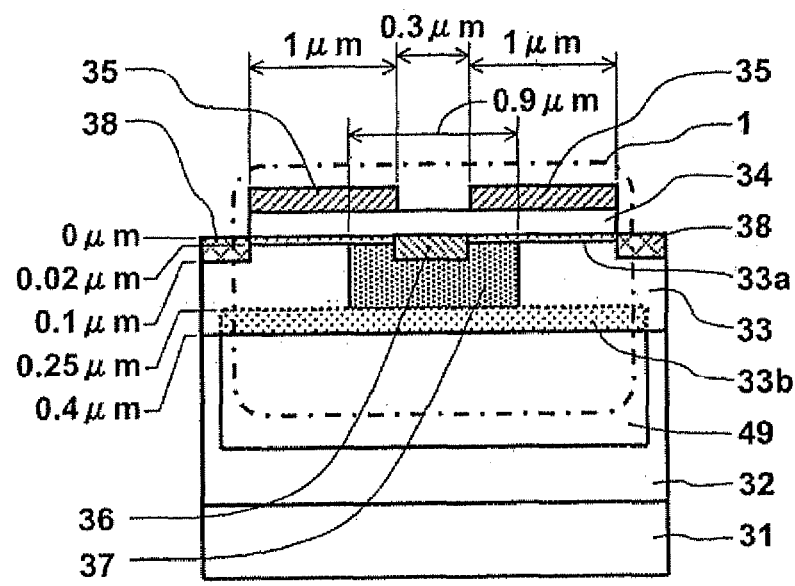
FIG. 5 is a fragmentary cross sectional view taken along line Y-Y of FIG. 1(a).

FIG. 5 is a fragmentary cross sectional view taken along line Y-Y of FIG. 1(a).

Figure 6:
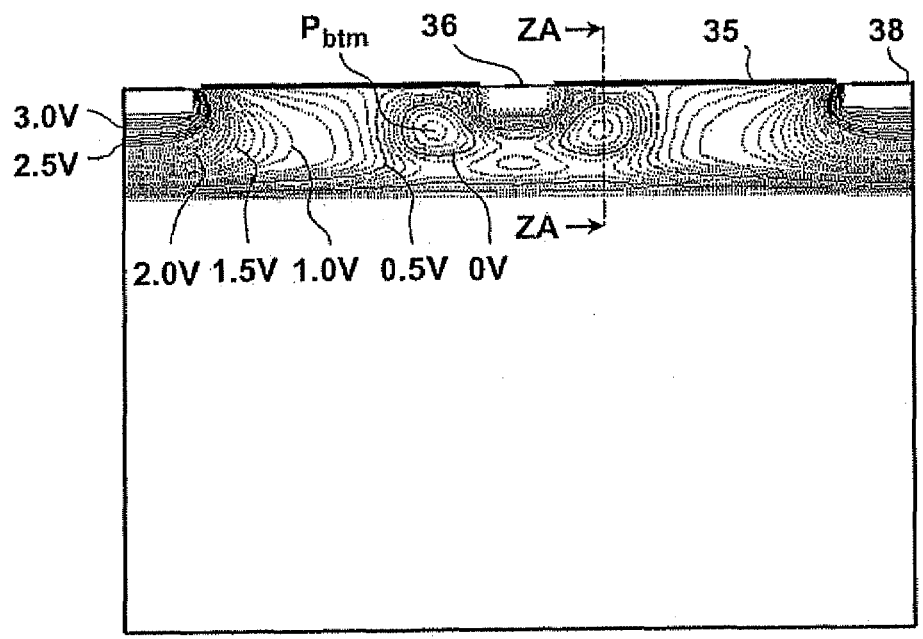
FIG. 6 is a diagram showing an example of calculating an electric potential profile that is simulated with respect to an area shown by a chain line in FIG. 5.

FIG. 6 is a diagram showing an example of calculating an electric potential profile that is simulated with respect to an area shown by a chain line in FIG. 5.

Figure 7:
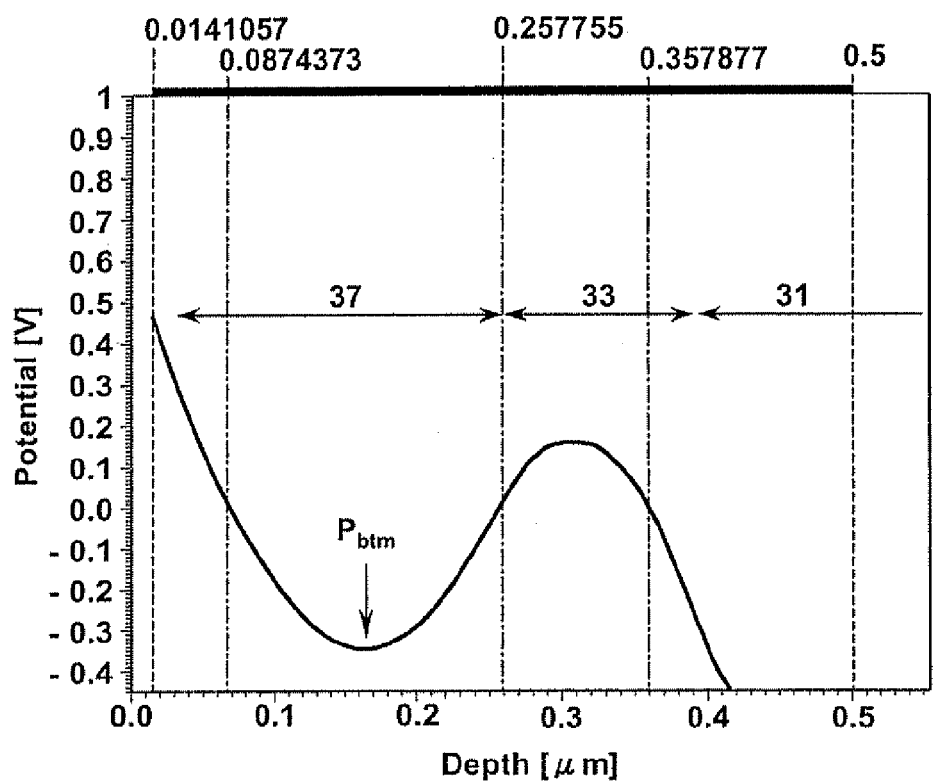
FIG. 7 is an electric potential diagram in a cross sectional view taken along line ZA-ZA of FIG. 6.

FIG. 7 is an electric potential diagram in a cross sectional view taken along line ZA-ZA of FIG. 6.

Figure 8:
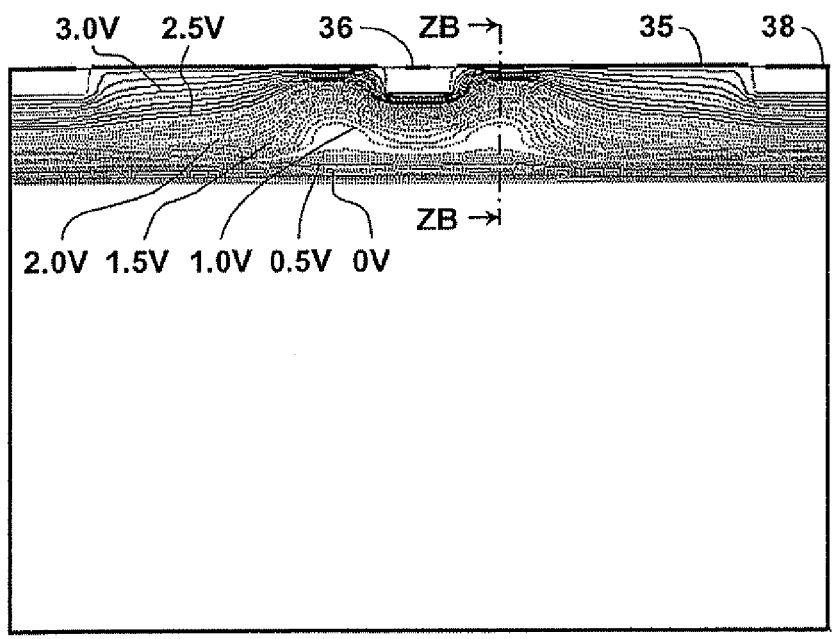
FIG. 8 is a diagram showing an example of an electric potential profile that is simulated with respect to an area shown by a chain line in FIG. 5 when discharging electric charges.

FIG. 8 is a diagram showing an example of an electric potential profile that is simulated with respect to an area shown by a chain line in FIG. 5 when discharging electric charges.

Figure 9:
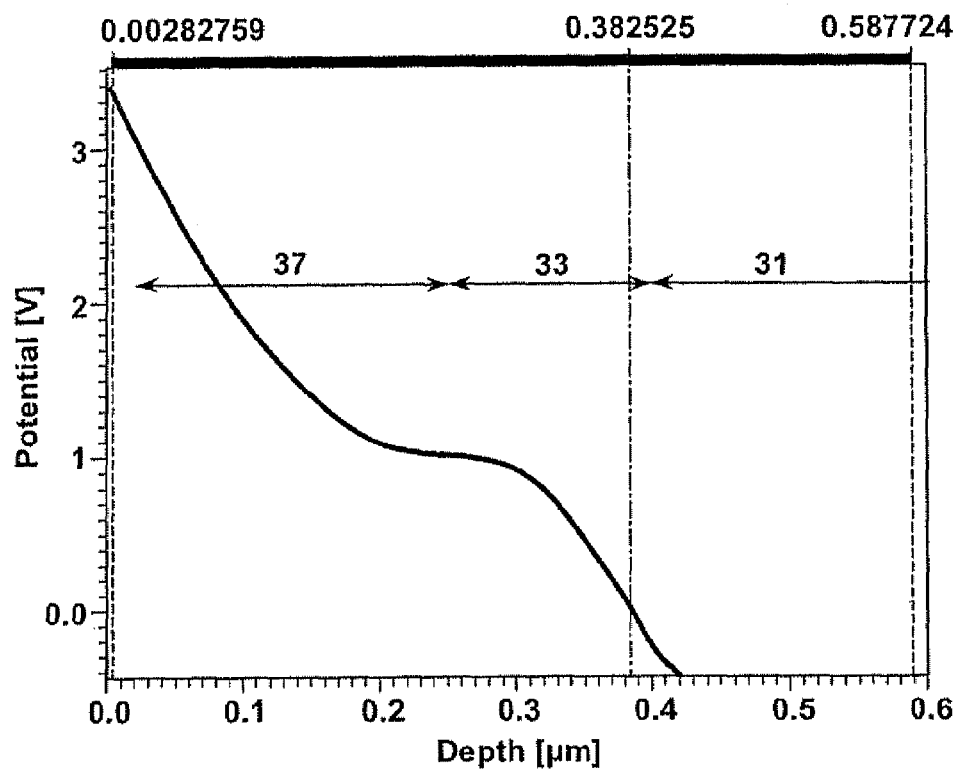
FIG. 9 is an electric potential diagram in a cross sectional view taken along line ZB-ZB of FIG. 8.

FIG. 9 is an electric potential diagram in a cross sectional view taken along line ZB-ZB of FIG. 8.

Figure 10:
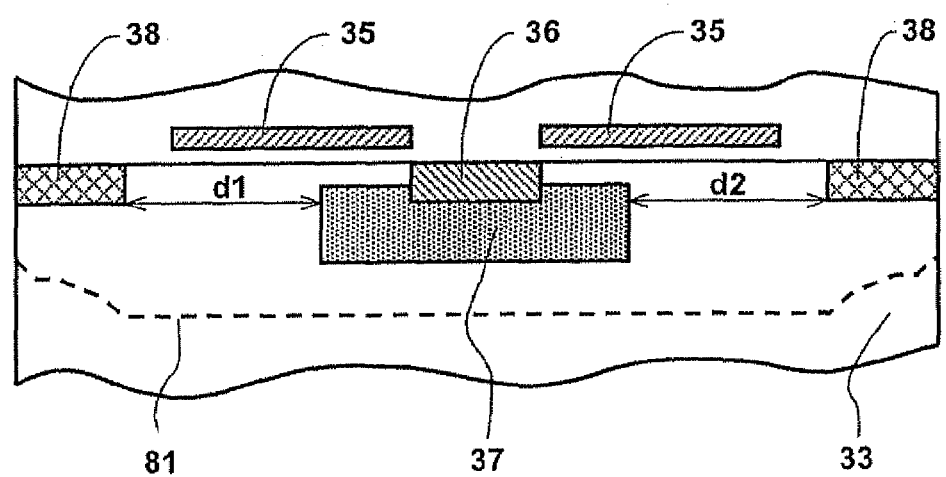
FIG. 10 is a cross sectional view taken along line Y-Y of FIG. 1(a) showing a depletion layer appeared under the ring shaped gate electrode.

FIG. 10 is a cross sectional view taken along line Y-Y of FIG. 1(a) showing a depletion layer appeared under the ring shaped gate electrode.

In FIGS. 1(a) and 1(b), a solid state image sensing device according to the first embodiment of the present invention is composed of a first conductive type substrate (hereinafter referred to as p$^+$-type substrate) 31, a p$^-$-type epitaxial layer 32 that is grown on the p$^+$-type substrate 31, a second conductive type well (hereinafter referred to as n-well) 33 formed on the surface of the p$^-$-type epitaxial layer 32, a gate insulative film 34 formed on the n-well 33, and a ring shaped gate electrode 35 as a first gate electrode that is formed above the n-well 33 with sandwiching the gate insulative film 34.

Further, a second conductive type source area (hereinafter referred to as n+-type source area) 36 is formed on the surface of the n-well 33 with confronting with a center opening area of the ring shaped gate electrode 35. With abutting to the n+-type source area 36, a first conductive type source neighborhood area (hereinafter referred to as source neighborhood p-type area) 37 is formed. A second conductive type drain area (hereinafter referred to as n+-type drain area) 38 is formed in an outer peripheral area of the n-well 33 away from the n+-type source area 36 and the source neighborhood p-type area 37.

Furthermore, there exists a first conductive type photoelectric conversion area (hereinafter referred to as buried p−-type area) 39 buried in the n-well 33 under the n+-type drain area 38. These buried p−-type area 39 and n+-type drain area 38 constitute a buried photo diode 40 shown in FIG. 1(a).

Between the buried photo diode 40 and the ring shaped gate electrode 35, there exists a transfer gate electrode 41 as a second gate electrode. The n+-type drain area 38, the ring shaped gate electrode 35, the n+-type source area 36, and the transfer gate electrode 41 is connected with metal wiring 42, 43, 44 and 45 respectively.

Further, a light shading film 46 is formed on a transparent insulative layer 48 that is formed on the gate insulative film 34 with isolating the metal wiring 42, 43, 44 and 45 separately, wherein an opening section 47 is perforated on the light shading film 46 at a portion confronting with the buried photo diode 40. The light shading film 48 is made from a metal or an organic film. Light reaches the buried photo diode 40 through the opening section 47, and then the light is conducted through the photoelectric conversion thereat.

Figure 33:
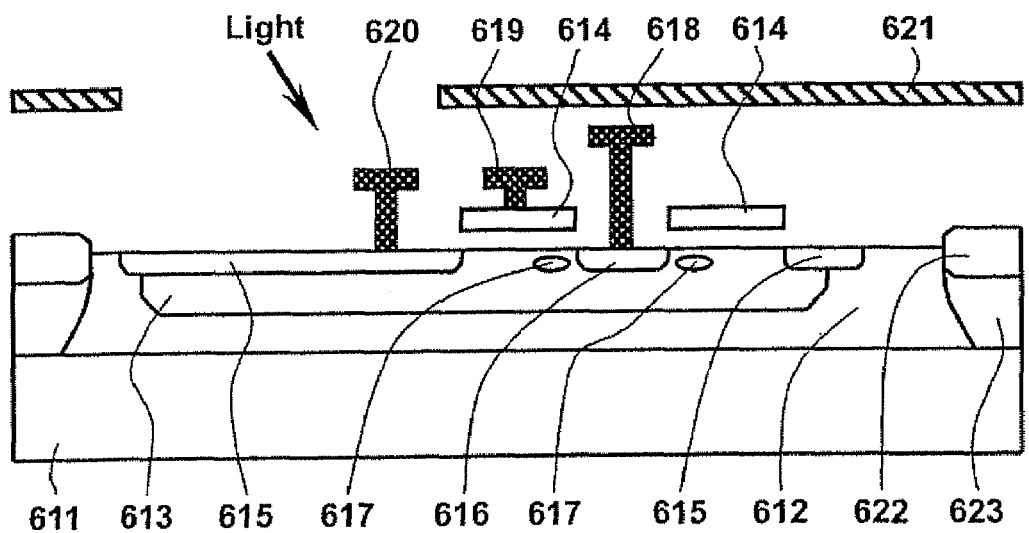
FIG. 33 is a second cross sectional view of a solid state image sensing device according to the second prior art.
Figure 34:
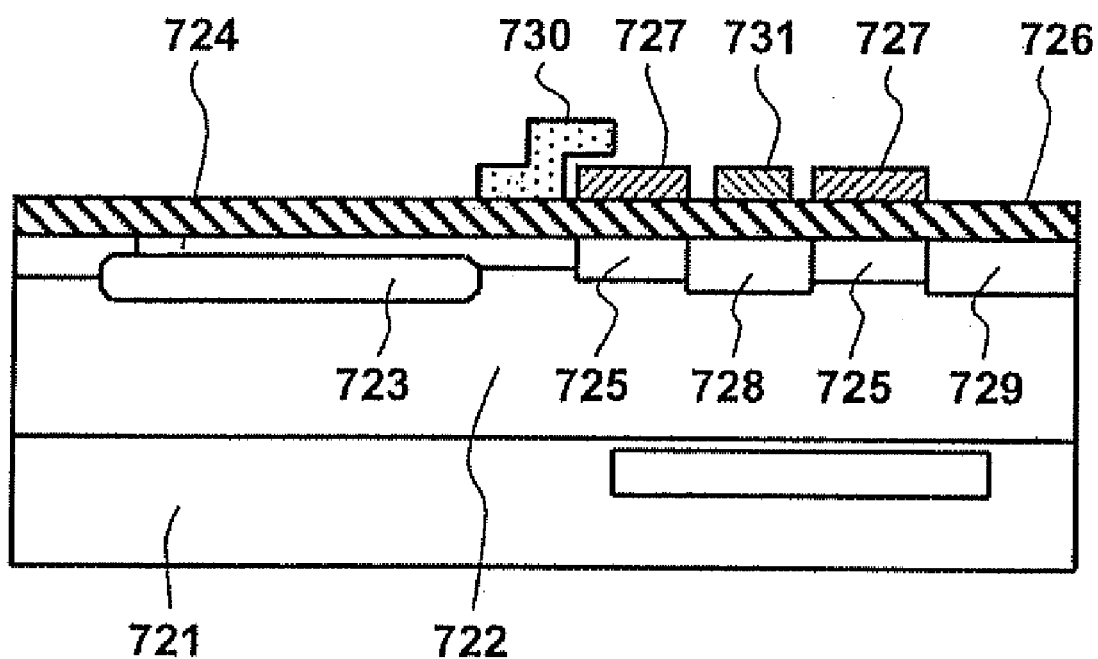
FIG. 34 is a third cross sectional view of a solid state image sensing device according to the third prior art.

In the meanwhile, a major constitutional difference between the solid state image sensing device according to the present invention and that of the second and third prior arts shown in FIGS. 33 and 34 is configuration of the ring shaped gate electrode and its neighboring area. In the case of the conventional solid state image sensing devices according to the second and third prior arts shown in FIGS. 33 and 34, there exists the p-type (first conductive type) area such as the buried p-well 613 and the p-type semiconductor area 725 in the whole area under the ring shaped gate electrodes 614 and 727. However, in the case of the solid state image sensing device according to the first embodiment of the present invention shown in FIG. 1(b), a p-type (first conductive type) area, that is, the source neighborhood p-type area 37 is provided only in the area abutting to the n+-type source area 36. Almost all area under the ring shaped gate electrode 35 is provided with an n-type (second conductive type) area, that is, the n-well 33.

In the above-mentioned configuration of the solid state image sensing device according to the first embodiment of the present invention, advantage in designing is explained next. In the case of the conventional solid state image sensing device according to the second prior art shown in FIG. 33, in order to concentrate electric charges in the neighborhood of the n+-type source diffusion layer 616, the carrier pocket 617 that is a highly doped p+ area is provided in the p-well 13. On the other hand, in the case of the solid state image sensing device according to the first embodiment of the present invention, as shown in FIG. 1(b), the p-type area or the source neighborhood p-type area 37 exists only in the neighborhood of the n+-type source area 36. Therefore, concentration of the source neighborhood p-type area 37 enables to be lowered. Consequently, reset voltage that is utilized for discharging holes or electric charges, which are accumulated in the source neighborhood p-type area 37, to the p+-type substrate 31 enables to be lowered.

In addition thereto, the conventional solid state image sensing device according to the third prior art shown in FIG. 34 lacks the idea of concentrating electric charges in the source neighboring area.

With referring to FIG. 2, a pixel configuration and a total configuration of the solid state image sensing device according to the first embodiment of the present invention is explained next. In FIG. 2, a pixel is allocated in a pixel bedding area 51 in "m" lines and "n" columns. One pixel 52 allocated at a line "s" and a column "t" out of the pixels allocated in "m" lines and "n" columns is illustrated in an equivalent circuit as a representative pixel in FIG. 2. As shown in FIG. 2, the pixel 52 is composed of a ring shaped gate MOSFET (Metal Oxide Semiconductor Field Effect Transistor) 53, a photo diode 54, and a transfer gate MOSFET 55. A drain terminal of the ring shaped gate MOSFET 53 is connected to a drain electrode wiring 56, which is equivalent to the metal wiring 42 shown in FIG. 1(b), together with a cathode side terminal of the photo diode 54. A source terminal and a drain terminal of the transfer gate MOSFET 55 is connected to an anode side terminal of the photo diode 54 and a back gate terminal of the ring shaped gate MOSFET 53 respectively.

The above-mentioned ring shaped gate MOSFET 53 is equivalent to an n-channel MOSFET having the n+-type source area 36 and the n+-type drain area 38, wherein the source neighborhood p-type area 37, which is provided right under the ring shaped gate electrode 35, is assumed as a gate area in FIG. 1(b).

Further, in FIG. 1(b), the above-mentioned transfer gate MOSFET 55 is equivalent to a p-channel MOSFET in which each of the n-well 33 provided right under the transfer gate electrode 41, the buried p−-type area 39 of the photo diode 40, and the source neighborhood p-type area 37 is assumed as a gate area, a source area, and a drain area respectively.

In FIG. 2, a frame start signal generating circuit 57 is provided for emitting a frame start signal to initiate action to read out a signal of one frame from each pixel of pixels allocated in the pixel bedding area 51 in "m" lines and "n" columns. It should be understood that the frame start signal enables to be supplied from outside of an image sensing device. The frame start signal is supplied to a vertical shift register 58. The vertical sift register 58 outputs a signal for initiating to read a pixel at a specific line out from the pixels in "m" lines.

A pixel at each line is connected to controlling circuits for controlling respective electric potentials of a ring shaped gate electrode, a transfer gate electrode, and a drain electrode. These controlling circuits are supplied with an output signal from the vertical shift register 58. A ring shaped gate electrode of each pixel at the line "s", for example, is connected to a ring shaped gate potential controlling circuit 60 through a wiring 59 for ring shaped gate electrode. A transfer gate electrode of each pixel at the line "s" is connected to a transfer gate potential controlling circuit 62 through a wiring 61 for transfer gate electrode. A drain electrode of each pixel at the line "s" is connected to a drain potential controlling circuit 63 through a wiring 56 for drain electrode. Each of the controlling circuits 60, 62 and 63 is supplied with an output signal from the vertical shift register 58.

In this connection, the ring shaped gate electrode is controlled on the basis of each line, so that the ring shaped gate electrode is wired in the horizontal direction. However, the transfer gate electrode is controlled simultaneously on the basis of whole pixels, so that a wiring direction is not specified in either horizontal or vertical. In FIG. 2, hereupon, the wiring direction is illustrated in the horizontal direction. The drain potential controlling circuit 63 controls the whole pixels simultaneously. However, there is some possibility of being controlled by each line, so that the drain potential controlling circuit 63 is illustrated in FIG. 2 as it is connected to both the frame start signal generating circuit 57 and the vertical shift register 58.

The source electrode of the ring shaped gate MOSFET 53 allocated in the pixel 52 is divided into two branches through a wiring 64 for source electrode that is equivalent to the metal wiring 44 in FIG. 1(b). One branch is connected to a source potential controlling circuit 65 for controlling electric potential of the source electrode through a switch Sw1, and the other branch is connected to a signal reading-out circuit 66 through another switch Sw2. The signal reading-out circuit 66 is actually connected to each column. However, only one signal reading-out circuit 66 connected to the column "t" is illustrated in FIG. 2. When reading out a signal from the pixel 52, the switch Sw1 is turned off and the other switch Sw2 is turned on. When controlling a source potential of the ring shaped gate MOSFET 53, the switch Sw1 is turned on and the other switch Sw2 is turned off. A signal is outputted in the vertical direction, so that a wiring direction of the source electrode is vertical.

The signal reading-out circuit 66 is constituted as follows. An output signal of the pixel 52 is conducted through the source terminal of the ring shaped gate MOSFET 53. The wiring 64 is connected with a load such as an electric current source 67. Consequently, the signal reading-out circuit 66, the electric current source (load) 67 and the ring shaped gate MOSFET 53 constitutes a so-called source follower circuit. The electric current source 67 is connected with each one terminal of capacitors C1 and C2 through switches Sc1 and Sc2 in parallel. Each of the one terminal of the capacitors C1 and C2 is also connected to an inversion input terminal and a non-inversion input terminal of a differential amplifier 68 respectively while each of the other terminal of the capacitors C1 and C2 is grounded. An electric potential difference between the capacitors C1 and C2 is outputted from the differential amplifier 68.

The signal reading-out circuit 66 is called as a CDS (correlated double sampling) circuit. There is provided with various kinds of CDS circuits other than the one shown in FIG. 2. Therefore, it should be understood that a CDS circuit is not limited to the one shown in FIG. 2. A signal outputted form the signal reading-out circuit 66 is transmitted through an output switch Swt. A switching operation of the output switch Swt is controlled by a signal outputted from a horizontal shift register 69.

Figure 4A:
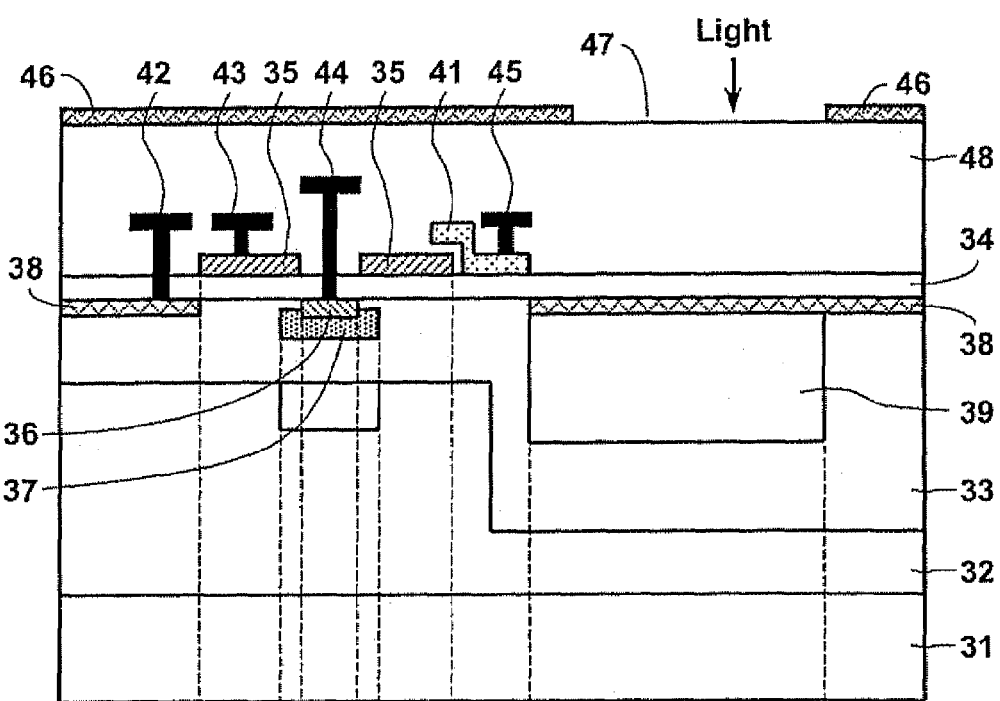
FIGS. 4(a) to 4(h) are conceptual electric potential diagrams for explaining operations in the solid state image sensing device shown in FIG. 2.

With referring to FIGS. 3(a) to 3(p) and 4(a) to 4(h), a driving method of the solid state image sensing device shown in FIG. 2 according to the first embodiment of the present invention is explained next. A cross sectional view of a solid state image sensing device shown in FIG. 4(a) is identical to that shown in FIG. 1(b), so that its descriptions are omitted.

FIG. 3(a) is a waveform of a frame start signal that is outputted from the frame signal generating circuit 57. FIG. 3(b) is an electric potential diagram of a transfer gate control signal outputted from each transfer gate potential controlling circuit 62 of all pixels. FIG. 3(c) is an electric potential diagram of a ring shaped gate control signal outputted from each ring shaped gate potential controlling circuit 60 of all pixels. In FIG. 3(c), a shaded area shows an electric potential that varies by a line. In other words, an electric potential of a ring shaped gate electrode varies by a line. FIG. 3(d) is an electric potential diagram of a source control signal outputted from each source potential controlling circuit 65 of all pixels. In FIG. 3(d), a shaded area shows an electric potential that varies by a column. In other words, an electric potential of a source electrode varies by a column.

Figure 4B:

During a period ① shown in FIG. 3(b), light penetrates into an buried photo diode such as the buried photo diode 40 in FIG. 1(a) and the photo diode 54 in FIG. 2 and a pair of one electron and one hole is generated by the photoelectric conversion in the buried photo diode. As shown in FIG. 4(b), a hole 71 is accumulated in the buried p⁻-type area 39 of the buried photo diode 40 or the photo diode 54. In this connection, an electric potential of the transfer gate electrode 41 is the same as a drain potential Vdd, and the transfer gate MOSFET 55 is in the OFF state. Accumulating holes in the buried p⁻-type area 39 is simultaneously conducted while a reading-out operation in a previous frame is performed.

Further, during a period Ta in FIG. 3(b), electric charges are accumulated in the photo diode such as the buried photo diode 40 in FIG. 1(a) and the photo diode 54 in FIG. 2, wherein the period Ta is basically equivalent to the period ①. Operations of accumulating electric charges in the photo diode are detailed next.

During a succeeding period ② after the period ① in FIG. 3(b), when reading out a previous frame is completed, as shown in FIG. 3(a), a frame start signal is emitted and initiates to start to read out a next frame. Firstly, a hole is transferred from the photo diode such as the buried photo diode 40 in FIG. 1(a) and the photo diode 54 in FIG. 2 to the source neighborhood p-type area of the ring shaped gate electrode, that is, the source neighborhood p-type area 37 of the ring shaped gate electrode 35 in FIG. 1(b) simultaneously in the whole pixels. Consequently, as shown in FIG. 3(b), an electric potential of the transfer gate electrode equivalent to the reference sign 41 in FIG. 1(b) is reduced to Low2 by a transfer gate control signal outputted from the transfer gate potential controlling circuit 62, and the transfer gate MOSFET 55 becomes the ON state.

The electric potential Low2 is designated to be higher than an electric potential Low1 shown in FIG. 3(c), which is an electric potential of a control signal applied to the ring shaped gate electrode 35 of the ring shaped gate MOSFET 53.

Figure 4C:
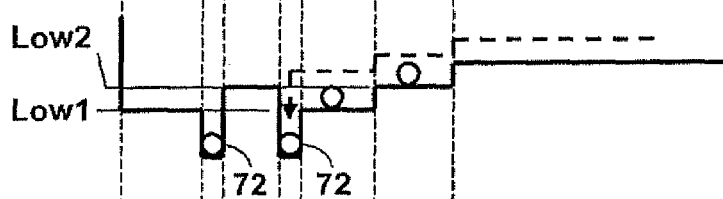
Figure 4D:
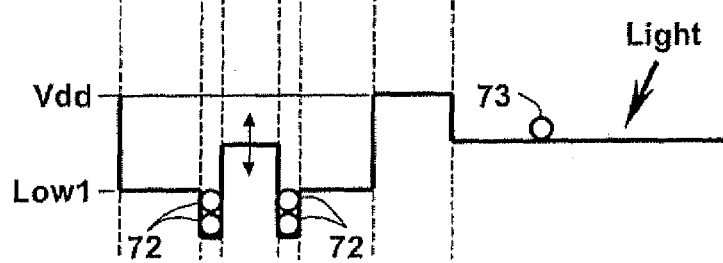
Figure 4E:
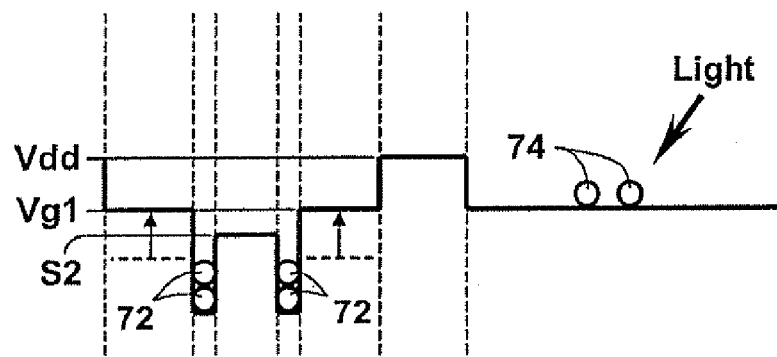
Figure 4F:
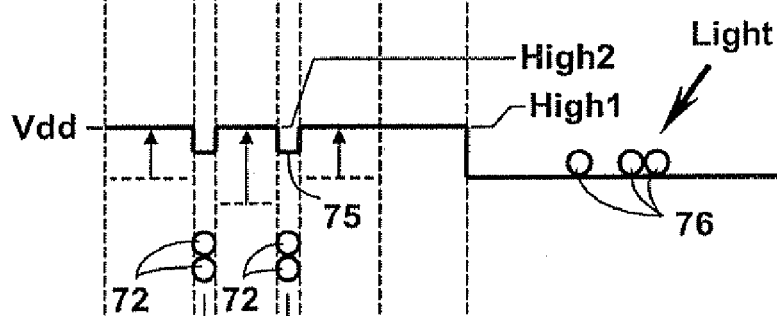
Figure 4G:
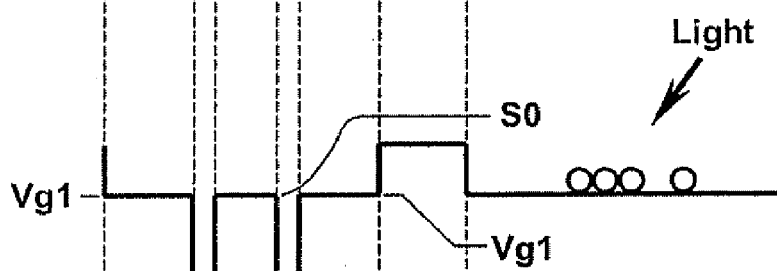

Further, as shown in FIG. 4(c), the electric potential Low2 makes gradient of electric potential of areas disposed under the transfer gate electrode 41 and the ring shaped gate electrode 35 gradual. It should be understood that the electric potential Low1 enables to be set to either zero volt or higher.

Each source potential of the whole pixels as well as a source potential supplied to the source electrode of the ring shaped gate MOSFET 53 from the source potential controlling circuit 65 through the switch Sw1 and, as shown in FIG. 3(d), the wiring 64 is set to an electric potential S1, wherein the electric potential S1 is higher than the electric potential Low1. Then, the ring shaped gate MOSFET 53 is turned off, and resulting in blocking an electric current flowing through the ring shaped gate MOSFET 53. Consequently, an electric charge or the hole 71 accumulated in the photo diode or each of the buried p⁻-type area 39 of the whole pixels is simultaneously transferred to an area under the ring shaped gate electrode 35 corresponding to respective pixels.

In the area disposed under the ring shaped gate electrode 35, as shown in FIG. 4(*c*), the source neighborhood p-type area 37 is the lowest in electric potential, so that the hole 71 accumulated in the photo diode reaches at the source neighborhood p-type area 37 and is accumulated therein as a hole 72. Accumulating the hole 72 results in raising an electric potential of the source neighborhood p-type area 37.

During a period ③, as shown in FIG. 3(*b*), the electric potential of the transfer gate electrode returns to the drain potential Vdd, and resulting in turning the transfer gate MOSFET 55 off. Then, a pair of one electron and one hole is generated again in the buried photo diode such as the buried photo diode 40 in FIG. 1(*a*) and the photo diode 54 in FIG. 2 by the photoelectric conversion. Consequently, as shown in FIG. 4(*d*), a hole 73 is accumulated in the buried p⁻-type area 39 of the buried photo diode 40. The accumulating operation is continued until a next period for transferring an electric charge.

On the other hand, an operation of reading out a signal from a pixel is sequentially conducted by a unit of line. Therefore, as shown in FIG. 3(*c*), an electric potential of the ring shaped gate electrode 35 in a pixel is maintained at "Low" until the pixel has a turn being read out while the hole 72 is accumulated in the source neighborhood p-type area 37.

Further, relationship between electric potentials "Low" and "Low1" is "0 (ground level)≦Low≦Low1".

FIG. 3(*e*) is a diagram showing an array of "m" pulses outputted from the vertical shift register 58. FIG. 3(*f*) is a diagram showing an array of pulses outputted from the horizontal shift register 69, wherein each pulse contains "n" pulses. FIG. 3(*g*) is a diagram showing an output signal Vout, wherein each waveform corresponds to "n" pulses shown in FIG. 3(*f*). In FIG. 3(*g*), one waveform Vout(s) is a waveform of an output signal of all pixels at the line "S". FIG. 3(*h*) shows the pulse Ps at the line "s" that is outputted from the vertical shift register 58. FIG. 3(*i*) shows a switching operation of the switch Sw1. FIG. 3(*j*) shows a switching operation of the other switch Sw2. FIG. 3(*k*) shows an electric potential of the ring shaped gate electrode 35 at the line "s". FIG. 3(*l*) shows a source potential of the ring shaped MOSFET 53. FIG. 3(*m*) shows a switching operation of the switch Sc1. FIG. 3(*n*) shows a switching operation of the switch Sc2.

During a period ⑥ in FIG. 3(*b*), a signal is read out from a pixel. With respect to an operation of reading out a signal from a pixel, explanation is given to the pixel 52 at the line "s" and the column "t" as a representative of the pixels in the pixel bedding area 51 in "m" lines and "n" columns. In FIGS. 3(*h*) to 3(*n*); reference signs ⑧, ⑨ and ⑩ are a period of storing an output while a hole exists, a period of exhausting a hole into the substrate, and a period of storing an output while no hole exists respectively, wherein the periods ⑧, ⑨ and ⑩ occur during the period ⑥ for reading out a signal from a pixel at the line "s" in FIG. 3(*b*). When an output signal of the vertical shift register 58 is in low level during the period ⑧ as shown in FIG. 3(*h*) while the holes 72 are accumulated in the source neighborhood p-type area 37, an output signal of the vertical shift register 58 shown in FIG. 3(*e*) raises an electric potential of the ring shaped gate electrode 35 from "Low" to "Vg1" as shown in FIG. 3(*k*) by a control signal outputted from the ring shaped gate potential controlling circuit 60. In FIG. 3(*e*), a pulse Ps is a pulse at the line "s" in "m" pulses outputted from the vertical shift register 58.

The electric potential "Vg1" satisfies a following inequality among the electric potentials "Low", "Low1" and "Vdd". "Low≦Low1≦Vg1≦Vdd", but "Low<Vdd".

Further, during the period ⑧, the switch Sw1 is turned off as shown in FIG. 3(*i*), the switch Sw2 is turned on as shown in FIG. 3(*j*), the switch Sc1 is turned on as shown in FIG. 3(*m*), and the switch Sc2 is turned off as shown in FIG. 3(*n*).

Consequently, the source follower circuit that is constituted by the signal reading-out circuit 66, the electric current source (load) 67 and the ring shaped gate MOSFET 53 is activated, and then, as shown in FIG. 3(*l*), a source potential of the ring shaped gate MOSFET 53 becomes "S2" during the period ⑧, wherein S2=(Vg1−Vth1). The electric potential "Vth1" is a threshold voltage of the ring shaped gate MOSFET 53 when a hole exists. The source potential S2 is stored in the capacitor C1 through the switch Sc1 that is turned on.

FIG. 4(*e*) exhibits potential status of the solid state image sensing device during the period ⑧. During the period ⑧, as shown in FIG. 4(*e*), a number of holes 74 accumulated in the buried p⁻-type area 39 of the buried photo diode 40 increases by the photoelectric conversion effect more than the number of holes 73 in FIG. 4(*d*) accumulated in the period ③.

During the period ⑨, as shown in FIG. 3(*k*), a control signal outputted from the ring shaped gate potential controlling circuit 60 raises an electric potential of the ring shaped gate electrode 35 from "Vg1" to "High 1". At the same time, as shown in FIGS. 3(*i*) and 3(*j*), the switches Sw1 and Sw2 are turned on and off respectively. In addition thereto, as shown in FIG. 3(*l*), an output signal from the source potential controlling circuit 65 raises a source potential of the ring shaped gate MOSFET 53 from "S2" to "High 2" simultaneously, where "High 1>Low 1" and "High 2>Low 1".

The electric potentials "High 1" and "High 2" are acceptable to be either a same value or different values. However, for the purpose of simpler designing, it is desirable for them that "High 1≦Vdd" and "High 2≦Vdd". In addition thereto, they shall be set to an appropriate electric potential such that an electric current will not flow through the ring shaped gate MOSFET 53 even when the ring shaped gate MOSFET 53 happens to be turned on.

Consequently, as shown by a reference sign 75 in FIG. 4(*f*), an electric potential of the source neighborhood p-type area 37 rises, and the holes 72 cross over a barrier of the n-well 33, and result in being exhausted into the p⁻-type epitaxial layer 32. FIG. 4(*f*) is illustrated as "High 1=High 2=Vdd" hereupon.

Further, during the period ⑨, as shown in FIG. 4(*f*), a number of holes 76 accumulated in the buried p⁻-type area 39 of the buried photo diode 40 increases by the photoelectric conversion effect, more than the number of holes 74 in FIG. 4(*e*) accumulated in the period ⑧.

During the period ⑩ shown in FIG. 3(*h*), a signal is read out from a pixel again as same manner as the period ⑧. However, as shown in FIGS. 3(*m*) and 3(*n*), it is different from the period ⑧ that the switches Sc1 and Sc2 are turned off and on respectively. As shown in FIG. 3(*k*), a gate potential of the ring shaped gate MOSFET 35 is "Vg1" exactly the same as the period ⑧. However, in the period ⑩, as shown in FIG. 4(*g*), no hole exists in the source neighborhood p-type area 37 since the holes 72 are exhausted into the p⁻-type epitaxial layer 32 as shown in FIG. 4(*f*). Consequently, as shown in FIG. 3(*l*), a source potential of the ring shaped gate MOSFET 35 becomes "S0"

in the period ⑥, where S0=(Vg1−Vth0). The electric potential "Vth0" is a threshold voltage of the source potential of the ring shaped gate MOSFET 35 when no hole exists in the source neighborhood p-type area 37.

The source potential "S0" is stored in the capacitor C2 through the switch Sc2, wherein the switch Sc2 is turned on as shown in FIG. 3(n). The differential amplifier 68 outputs electric potential difference between the capacitors C1 and C2. In other words, the differential amplifier 68 outputs voltage of (Vth0−Vth1). The outputted voltage (Vth0−Vth1) is equivalent to change of threshold voltage caused by a hole charge.

FIG. 3(o) shows a switching operation of the output switch Swt that is controlled by a pulse Pt at the column "t" outputted from the horizontal shift register 69, wherein the switch Swt is turned on by the pulse Pt. FIG. 3(p) shows a waveform of an output signal Vout that corresponds to the waveform Vout(s) shown in FIG. 3(g), wherein the output signal Vout shows signals outputted from the "n" columns of pixels at the line "s". Based on an output pulse Pt at the column "t" in FIG. 3(o) out of a plurality of pulses shown in FIG. 3(f) outputted from the horizontal shift register 69, the switch Swt in FIG. 2 is turned on. While the switch Swt is turned on, as shown in FIG. 3(p), change of threshold voltage is outputted from the pixel 52 at the column "t" as an output signal "Vout 2".

Further, in FIG. 3(p), "Vout 1" is an output signal equivalent to pixels at column one to column "t−1" and "Vout 3" is an output signal equivalent to pixels at column "t+1" to column "n".

Figure 4H:
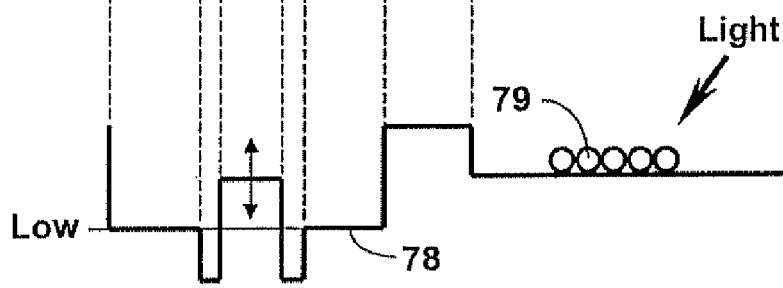

During a period ⑦ shown in FIG. 3(b), an electric potential of the ring shaped gate electrode 35 of the line "s" is "Low" as shown in FIG. 3(c) and shown by a reference sign 78 in FIG. 4(h). The electric potential "Low" is maintained until a signal processing is completed through all lines while no hole exists in the source neighborhood p-type area 37. As shown in FIG. 4(h), holes 79 are accumulated in the buried p−-type area 39 of the buried photo diode 40 by the photoelectric conversion effect even in the period ⑦. In FIG. 4(h), the source potential fluctuates when reading out pixels at a line "s+1" to the line "m". After that, the process returns back to the period ① and repeats transferring holes again. Accordingly, an output signal (Vout) shown in FIG. 3(g) is read out from each line.

Actual differences between the present invention and the prior art are detailed next. In the case of the conventional solid state image sensing device according to the second prior art shown in FIG. 33, the Carrier pocket (p+ area) 617 is formed in the buried p-well 613. Therefore, there essentially exists concentration difference in the buried p-well 613. On the contrary, in the case of the first embodiment of the present invention shown in FIG. 1(b), the source neighborhood p-type area 37 enables to be formed in uniform concentration. Concentration of the source neighborhood p-type area 37 enables to be kept constant at $5E16 \text{ cm}^{-3}$, for example.

An exemplary solid state image sensing device according to the first embodiment of the present invention is shown in FIG. 5, which is a cross sectional view taken along line Y-Y of FIG. 1(a). Basically, FIG. 5 is identical to FIG. 1(b), so that the same components are numbered by the same reference signs and their details are omitted. In FIG. 5, reference signs 33a, 33b and 49 is a surface region of the n-well 33, a bottom region of the n-well 33 and a p+-type area respectively. As shown in FIG. 5, the ring shaped gate electrode 35 is shaped in a ring of 1 μm wide having a center hole of diameter 0.3 μm.

Further, the source neighborhood p-type area 37 is 0.9 μm wide and its concentration is $5E16 \text{ cm}^{-3}$ and formed at a depth ranging from 0.02 μm to 0.25 μm measured from the surface of the n-well 33. The n+-type source area 36 and the n+-type drain area 38 is $1E20 \text{ cm}^{-3}$ in concentration and formed at a depth ranging from 0 μm to 0.1 μm measured from the surface of the n-well 33 respectively.

Furthermore, concentration of the p+-type substrate 31, the p−-type epitaxial layer 32, the n-well 33, the surface region 33a, the bottom region 33b, and the p+-type area 49 is set to be $1E20 \text{ cm}^{-3}$, $1E15 \text{ cm}^{-3}$, $1E16 \text{ cm}^{-3}$, $5E17 \text{ cm}^{-3}$, $7E16 \text{ cm}^{-3}$, and $1E18 \text{ cm}^{-3}$ in concentration respectively.

More, the gate insulative film 34 is formed in 10 nm thick.

An electric potential profile of an area 1 shown by a chain line in FIG. 5 is exhibited in FIG. 6, wherein the profile is simulated with defining that each electric potential of the ring shaped gate electrode 35 and the n+-type drain area 38 is 0 V and 3 V respectively. It is apparent from FIG. 6 that there exists a low potential region in the source neighborhood p-type area 37. In FIG. 6, a reference sign Pbtm shows a bottom of potential, that is, a point of lowest potential in the low potential region. A cross sectional view taken along line ZA-ZA of FIG. 6 is shown in FIG. 7. FIG. 7 exhibits an electric potential profile in the vertical direction. A hole assembles in a lowest potential area. In this connection, it should be understood by FIGS. 6 and 7 that holes assemble in the bottom of potential Pbtm and are accumulated therein when the holes are transferred to an area disposed under the ring shaped gate electrode 35 under the electric potential conditions as shown in FIGS. 6 and 7.

Another electric potential profile of the area 1 in FIG. 5 is exhibited in FIG. 8, wherein the profile is simulated with defining that each electric potential of the ring shaped gate electrode 35 and the n+-type source area 36 is set to 3 V respectively as same as that of the n+-type drain area 38. A cross sectional view taken along line ZB-ZB of FIG. 8 is shown in FIG. 9 that exhibits an electric potential profile in the vertical direction. As it is apparent from FIGS. 8 and 9, the bottom of potential Pbtm disappears.

Further, a recessed portion does not exist in a curve of the electric potential profile, and the curve slopes smoothly throughout all areas from the area disposed under the ring shaped gate electrode 35 to the p+ substrate 31. Consequently, it is confirmed that holes accumulated in the bottom of potential Pbtm are surely exhausted to the p+ substrate 31 by extremely low voltage of 3V. It is caused by that concentration of the source neighborhood p-type area 37 enables to be reduced.

As mentioned above, with referring to FIGS. 5-9, it is assured that the solid state image sensing device according to the first embodiment of the present invention enables to realize a source neighborhood p-type area in uniform concentration, which was never realized by the conventional solid state image sensing device shown in FIG. 33. However, it should be understood that a source neighborhood p-type area is not necessary to be in uniform concentration, and that concentration is acceptable to be distributed within the source neighborhood p-type area.

Functions and operations of the n-well 33 excluding p-type areas disposed under the ring shaped gate electrode 35 are detailed.

According to the present invention, it is a principle of the solid state image sensing device that an electric potential of the source neighborhood p-type area 37 varies by holes accumulated therein, and the varied electric potential is read out as a change of threshold voltage. Consequently, the change of threshold voltage is made more remarkable by increasing capacitance between the source neighborhood p-type area 37 and the n⁺-type source area 36 and between the source neighborhood p-type area 37 and the ring shaped gate electrode 35, and by decreasing capacitance between the source neighborhood p-type area 37 and the other electrodes such as the n⁺-type drain area 38 and the transfer gate electrode 41.

With respect to capacitance between the source neighborhood p-type area 37 and the transfer gate electrode 41, distance between them is essentially long, so that the capacitance is relatively small. On the contrary, with respect to capacitance between the source neighborhood p-type area 37 and the n⁺-type drain area 38, the n-well 33 is connected to the n⁺-type drain area 38, so that an electric potential of the n-well 33 becomes Vdd.

Further, the n-well 33 directly contacts with the source neighborhood p-type area 37, so that capacitance between the source neighborhood p-type area 37 and the n⁺-type drain area 38 becomes larger.

It is conducted hereupon that a region of the n-well 33 disposed under the ring shaped gate electrode 35 is an n⁻-type in lower concentration and a depletion layer is made to expand easily. Concept of a depletion layer is illustrated in FIG. 10 although it can be recognized by FIG. 6. In FIG. 10, an n⁻-type region of the n-well 33 disposed under the ring shaped gate electrode 35 is easily depleted in case an electric potential of the ring shaped gate electrode 35 is set to be lower than the power source voltage Vdd of the n-well 33. Consequently, the n⁻-type region of the n-well 33 is surely depleted as shown by a border of depletion layer 81 in FIG. 10 in case the power source voltage Vdd is set to 3.3 V and the gate potential Vg1 of the ring shaped gate electrode 35 is set to 1.5 V, for example, when reading out a signal. In this connection, capacitance between the source neighborhood p-type area 37 and the n⁺-type drain area 38 becomes extremely smaller in case a depletion layer expands between them as mentioned above.

Accordingly, holes accumulated in the source neighborhood p-type area 37 affect the ring shaped gate electrode 35 and the n⁺-type source area 36 extremely, and resulting in enhancing a signal output more. Designating each of distance d1 and d2 between the source neighborhood p-type area 37 and the n⁺-type drain area 38 in FIG. 10 depends upon their capacitance values to be designed.

It should be understood that a solid state image sensing device having different features from the solid state image sensing device according to the first embodiment of the present invention shown in FIGS. 1(*a*) and 1(*b*) enables to be manufactured.

Second Embodiment

A second embodiment of the present invention is explained next.

Figure 11:
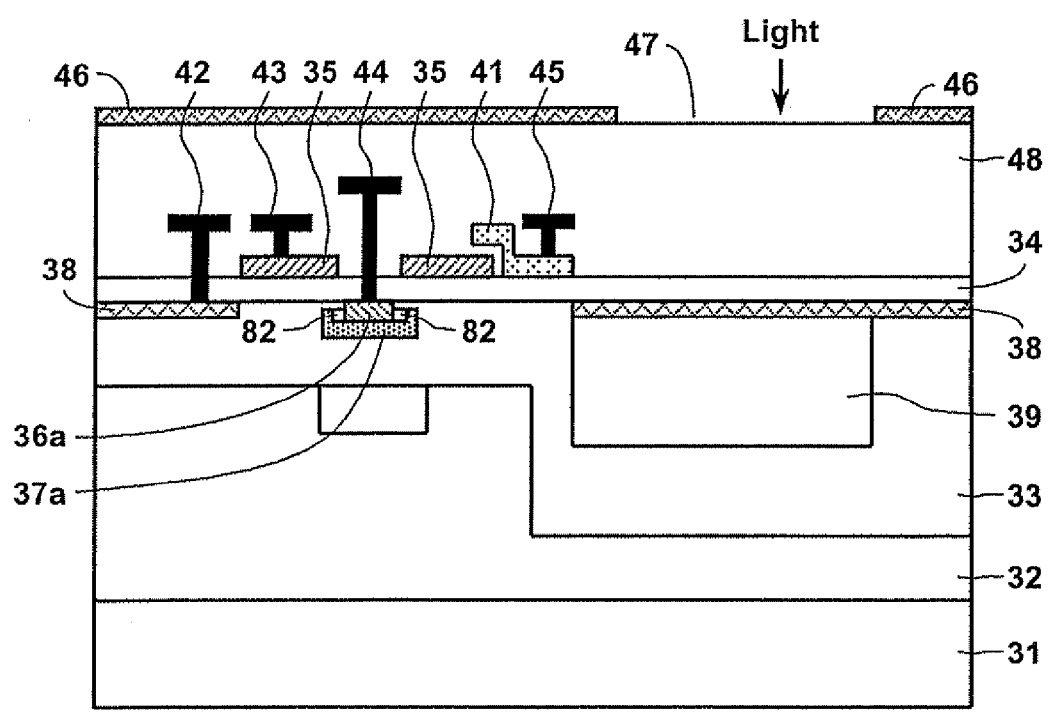
FIG. 11 is a cross sectional view of a solid state image sensing device according to a second embodiment of the present invention.

FIG. 11 is a cross sectional view of a solid state image sensing device according to a second embodiment of the present invention.

A solid state image sensing device according to the second embodiment is identical to that of the first embodiment except for a source area and its neighboring area, so that the same components are numbered by the same reference signs and their details are omitted.

As shown in FIG. 11, a first conductive type high concentration area 82 (hereinafter referred to as a ring shaped p⁺-type area 82) is formed in an area of a source neighborhood p-type area 37a with surrounding an n⁺-type source area 36a. By this configuration, an electric charge is concentrated in the ring shaped p⁺-type area 82 more, so that voltage conversion efficiency of hole enables to be improved more.

Third Embodiment

A third embodiment of the present invention is explained next.

Figure 12:
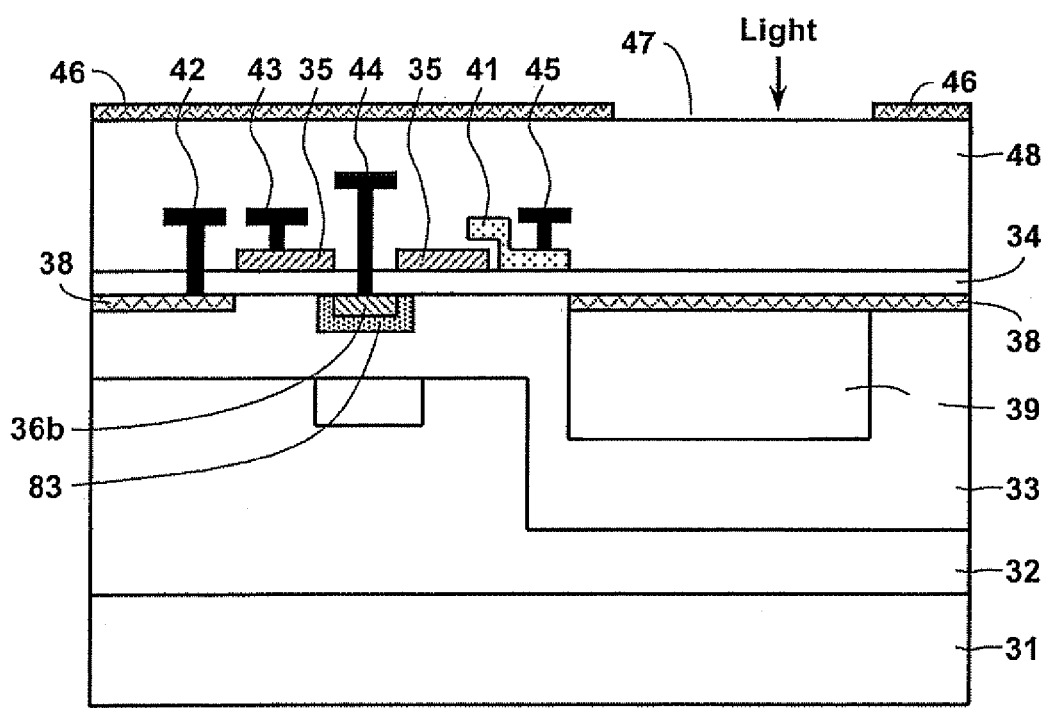
FIG. 12 is a cross sectional view of a solid state image sensing device according to a third embodiment of the present invention.

FIG. 12 is a cross sectional view of a solid state image sensing device according to a third embodiment of the present invention.

A solid state image sensing device according to the third embodiment is identical to that of the first embodiment except for a source area and its neighboring area, so that the same components are numbered by the same reference signs and their details are omitted.

As shown in FIG. 12, the solid state image sensing device of the third embodiment is characterized by a source neighborhood p-type area 83 of which a part directly contacts with the gate insulative film 34, and the source neighborhood p-type area 83 surrounds an n⁺-type source area 36b totally. In a case of the third embodiment, the p⁺-type area 82 of the second embodiment is not necessary to be buried, so that the configuration of the source neighborhood p-type area 83 and its neighboring area is made to be simpler, and resulting in a merit of being manufactured easier. On the contrary, the solid state image sensing device according to the third embodiment is apt to be affected by noise, which is caused by dark current from the gate insulative film 34, in case an area of the source neighborhood p-type area 83 directly contacting with the gate insulative film 34 is extremely large. However, the noise enables to be improved by shrinking sufficiently the area of the source neighborhood p-type area 83 directly contacting with the gate insulative film 34.

Fourth Embodiment

A fourth embodiment of the present invention is explained next.

Figure 13:
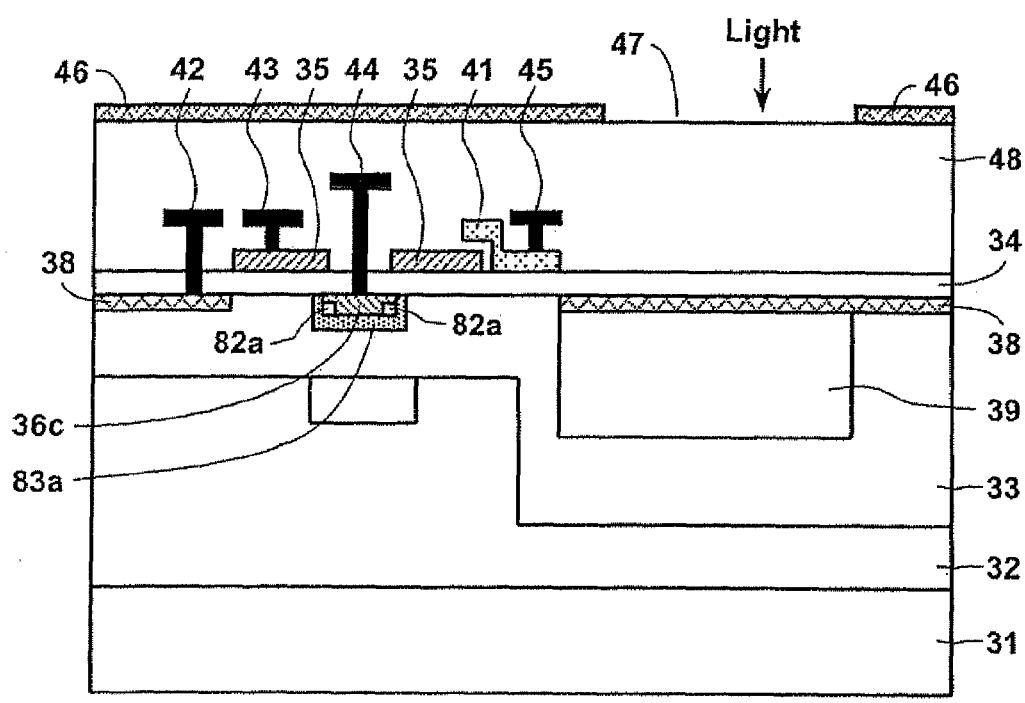
FIG. 13 is a cross sectional view of a solid state image sensing device according to a fourth embodiment of the present invention.

FIG. 13 is a cross sectional view of a solid state image sensing device according to a fourth embodiment of the present invention.

A solid state image sensing device according to the fourth embodiment is identical to that of the first embodiment except for a source area and its neighboring area, so that the same components are numbered by the same reference signs and their details are omitted.

The solid state image sensing device of the fourth embodiment is a combination of that of the second embodiment and that of the third embodiment in a configuration of a source area and its neighboring area. As shown in FIG. 13, a first conductive type area in high concentration (hereinafter referred to as ring shaped p⁺-type area) 82a is buried in an area of a source neighborhood p-type area 83a with surrounding an n⁺-type source area 36c. However, a peripheral area of the source neighborhood p-type area 83a directly contacts with the gate insulative film 34. The solid state image sensing device according to the fourth embodiment is relatively complicated in configuration. However, such a configuration adopts the merits of the second embodiment and the third embodiment.

Fifth Embodiment

A fifth embodiment of the present invention is explained next.

Figure 14:
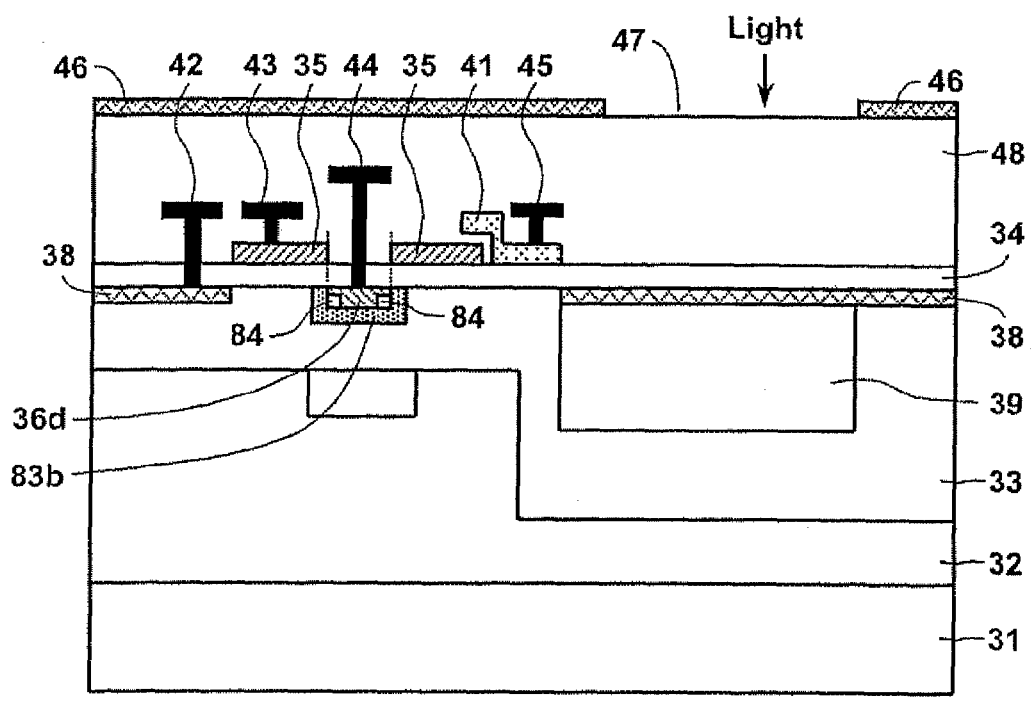
FIG. 14 is a cross sectional view of a solid state image sensing device according to a fifth embodiment of the present invention.

FIG. 14 is a cross sectional view of a solid state image sensing device according to a fifth embodiment of the present invention.

A solid state image sensing device according to the fifth embodiment is identical to that of the fourth embodiment except for a source area and its neighboring area, so that the same components are numbered by the same reference signs and their details are omitted.

The solid state image sensing device of the fifth embodiment is similar to that of the fourth embodiment except for allocation of the p⁺-type area 82a in the source neighborhood p-type area 83a. In a case of the fifth embodiment, as shown in FIG. 14, a first conductive type high concentration area (hereinafter referred to as a p⁺-type area) 84 is allocated within a prescribed area of a first conductive type source neighborhood area (hereinafter referred to as source neighborhood p-type area) 83b with surrounding a second conductive type source area (hereinafter referred to as n⁺-type source area) 36d, wherein the prescribed area is disposed right under the center opening area of the ring shaped gate electrode 35, not under the ring shaped gate electrode 35. In other words, an outer circumference of the ring shaped p⁺-type area 84 is settled inside the inner circumference of the ring shaped gate electrode 35.

As mentioned above, major difference between the fifth embodiment and the fourth embodiment is allocation of the p⁺-type area 84. The solid state image sensing device of the fifth embodiment enables to be manufactured easier than that of the fourth embodiment.

By the above-mentioned configuration, the p⁺-type area 84 enables to be produced through self-aligning by the ring shaped gate electrode 35, to be detailed later. Producing the p⁺-type area 84 through the self-aligning enables to make positional fluctuation of the p⁺-type area 84 extremely smaller than that of the p⁺-type area 84 being produced by using a mask, and resulting in reducing fluctuation in characteristic of each pixel.

With referring to FIGS. 15(a) to 15(f), a manufacturing method of the solid state image sensing device according to the fifth embodiment is explained next.

FIGS. 15(a) to 15(f) are cross sectional views showing a manufacturing process of the solid state image sensing device according to the fifth embodiment. In FIGS. 15(a) to 15(f), only a manufacturing method of a source area and its neighboring area is exhibited so as to simplify descriptions, wherein it is assumed that the n-well 33 is already formed.

Figure 15A:
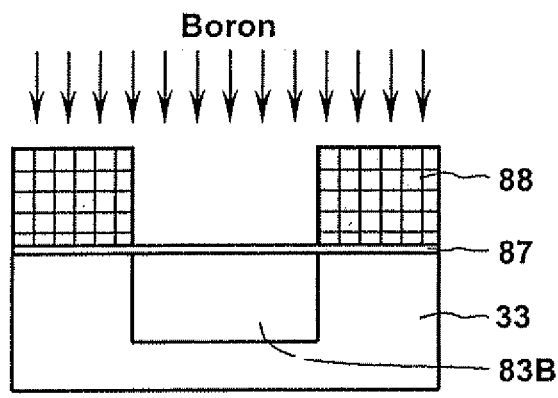
FIGS. 15(a) to 15(f) are cross sectional views showing a manufacturing process of the solid state image sensing device according to the fifth embodiment.

At first, as shown in FIG. 15(a), an oxide film 87 is formed all over the surface of the n-well 33. Then, resist 88 is formed on the surface of the oxide film 87 by the photo processing method, wherein the resist 88 is formed so as to exclude an area for forming in the n-well 33 a first conductive type source neighborhood area (hereinafter referred to as source neighborhood p-type area) 83B, which is processed to be the source neighborhood p-type area 83b in a later process.

Succeedingly, by applying the ion implantation method adopting the resist 88 as a mask, the source neighborhood p-type area 83B is produced by injecting boron as p-type impurity (first conductive type impurity in higher concentration) into the n-well 33 through the oxide film 87 under a condition such that the accelerating energy is 50 to 150 keV and the dose amount is 5E11 to 5E12 cm⁻².

Figure 15B:
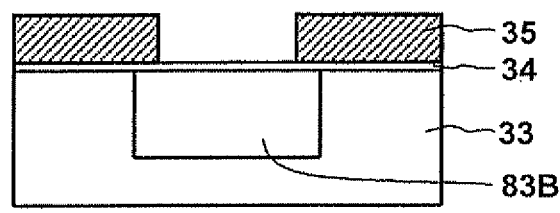

As shown in FIG. 15(b), a gate insulative film 34 having a thickness of 7 to 18 nm, for example, is formed over surfaces of the n-well 33 and the source neighborhood p-type area 83B after removing the oxide film 87 together with the resist 88. Then, a ring shaped gate electrode 35 having a thickness of 0.2 to 0.5 µm, for example, is formed on the surface of the gate insulative film 34 through the commonly known processing method.

Figure 15C:
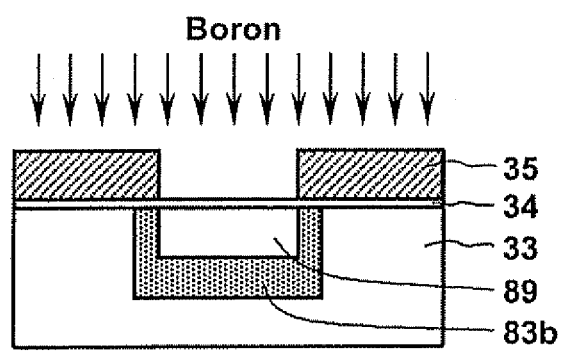

Succeedingly, by applying the ion implantation method adopting the ring shaped gate electrode 33 as a mask, as shown in FIG. 15(c), a first conductive type area (hereinafter referred to as p+-type area) 89 is formed in a shallower area of the source neighborhood p-type area 83B by injecting boron into the source neighborhood p-type area 83B under a condition such that the accelerating energy is 10 to 50 keV and the dose amount is 1E12 to 2E13 cm⁻². Consequently, a source neighborhood p-type area 83b is formed.

Figure 15D:
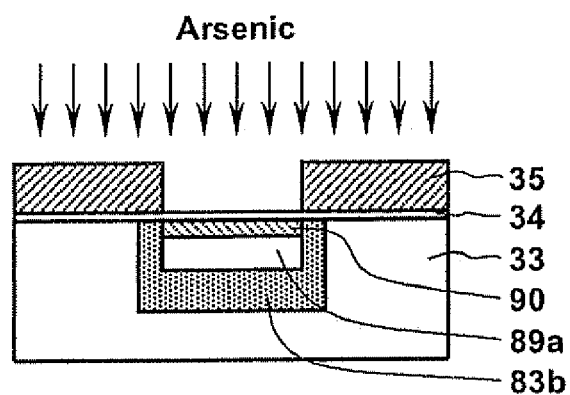

Next, by applying the ion implantation method adopting the ring shaped gate electrode 35 as a mask, as shown in FIG. 15(d), a second conductive type surface layer (hereinafter referred to as a surface n⁺ layer) 90 is formed by injecting arsenic as n-type impurity (second conductive type impurity) into a shallow area adjacent to the surface of the p+-type area 89 under a condition such that the accelerating energy is 10 to 50 keV and the dose amount is 1E12 to 2E13 cm⁻². Consequently, a p+-type area 89a is formed.

Figure 15E:
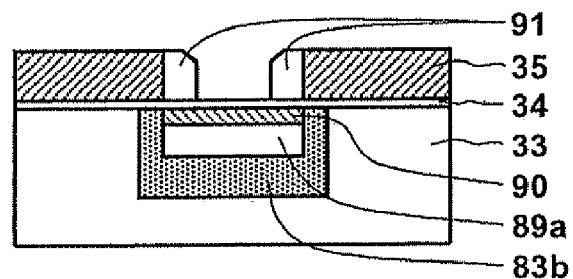

Succeedingly, as shown in FIG. 15(e), a side wall spacer 91 having a width of 0.1 to 0.4 µm, for example, is formed on an inner wall of an opening in the ring shaped gate electrode 35 by the commonly known processing method.

Figure 15F:
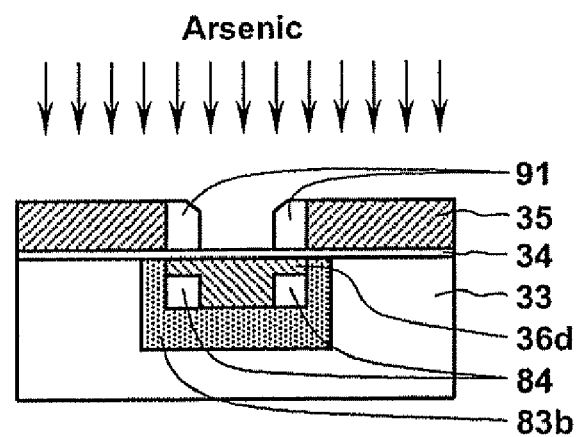

Finally, by applying the ion implantation method adopting the ring shaped gate electrode 35 as a mask, as shown in FIG. 15(f), a second conductive type source area (n⁺-type source area) 36d is formed by injecting arsenic in higher concentration as n-type impurity into the surface n⁺ layer 90 and the p+-type area 89a through the side wall spacer 91 under a condition such that the accelerating energy is 20 to 100 keV and the dose amount is 5E14 to 5E15 cm⁻². Consequently, forming the n+-type source area 36d makes a p⁺-type area 84 to be remained in the p+-type area 89a.

Accordingly, the n⁺-type source area 36d and the p⁺-type area 84 is formed through the self-aligning by the ring shaped gate electrode 35 and the side wall spacer 91, so that manufacturing in extremely high accuracy enables to be realized.

Sixth Embodiment

A sixth embodiment of the present invention is explained next.

Figure 16:
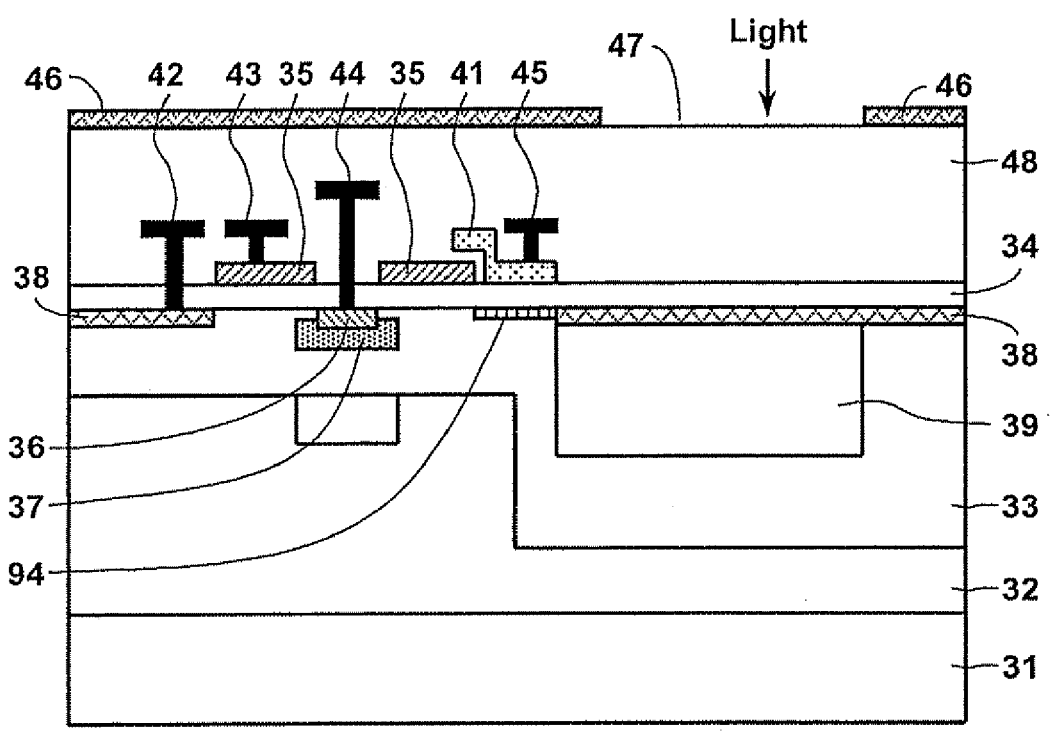
FIG. 16 is a cross sectional view of a solid state image sensing device according to a sixth embodiment of the present invention.

FIG. 16 is a cross sectional view of a solid state image sensing device according to a sixth embodiment of the present invention.

A solid state image sensing device according to the sixth embodiment is identical to that of the first embodiment except for a source area and its neighboring area, so that the same components are numbered by the same reference signs and their details are omitted.

The solid state image sensing device of the sixth embodiment shown in FIG. 16 is characterized by a first conductive type threshold adjusting layer (hereinafter referred to as p⁻-type threshold adjusting layer) 94 that is formed by injecting p-type impurity into the n-well 33 in comparison with the solid state image sensing device of the first embodiment, wherein the p⁻-type threshold adjusting layer 94 is disposed on the surface of the n-well 33 in a shallow area under the transfer gate electrode 41 shallower than the n+-type source area 36 and the n+-type drain area 38.

According to the sixth embodiment, threshold voltage for turning a transfer gate MOSFET on enables to be variable, so that flexibility of designating voltage to turn the transfer gate MOSFET on enables to be expanded.

Further, as mentioned above, forming the p⁻-type threshold adjusting layer 94 on the surface of the n-well 33 provides a so-called buried channel. In such a buried channel, an electric charge passes through inside a substrate away from a surface of the substrate a little, and does not pass over the surface of the substrate.

Accordingly, it is advantageous to the solid state image sensing device according to the sixth embodiment that the buried channel reduces drift noise in comparison with a case that an electric charge passes over a surface of a substrate.

Seventh Embodiment

A seventh embodiment of the present invention is explained next.

Figure 17:
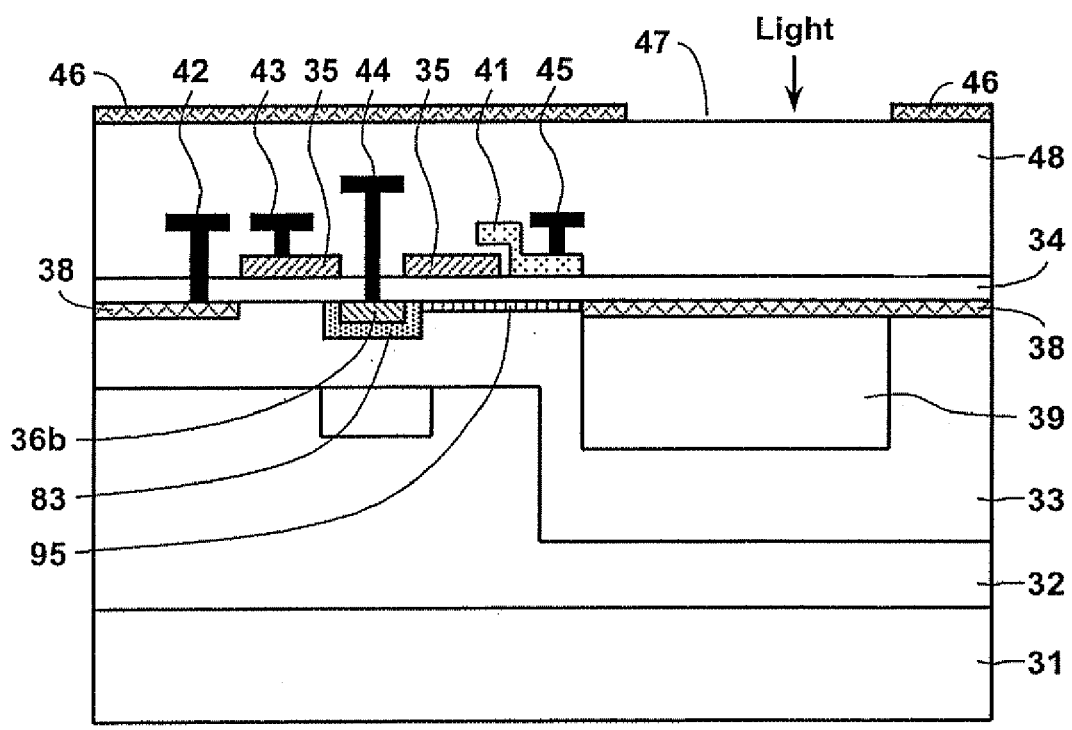
FIG. 17 is a cross sectional view of a solid state image sensing device according to a seventh embodiment of the present invention.

FIG. 17 is a cross sectional view of a solid state image sensing device according to a seventh embodiment of the present invention.

A solid state image sensing device according to the seventh embodiment is identical to that of the third embodiment except for a source area and its neighboring area, so that the same components are numbered by the same reference signs and their details are omitted.

The solid state image sensing device of the seventh embodiment is formed with a first conductive type threshold adjusting layer (hereinafter referred to as p⁻-type threshold adjusting layer) 95 on the surface of the n-well 33 by injecting p-type impurity into the n-well 33 as the same manner as the sixth embodiment. The p⁻-type threshold adjusting layer 95 is disposed on the surface of the n-well 33 in a shallow area under the ring shaped gate electrode 35 as well as the transfer gate electrode 41 and allocated in a depth shallower than the n+-type source area 36b and the n+-type drain area 38. The p⁻-type threshold adjusting layer 95 forms an buried channel and reduces drift noise that possibly occurs in a path reaching to the source neighborhood p-type area 83.

Eighth Embodiment

A eighth embodiment of the present invention is explained next.

Figure 18:
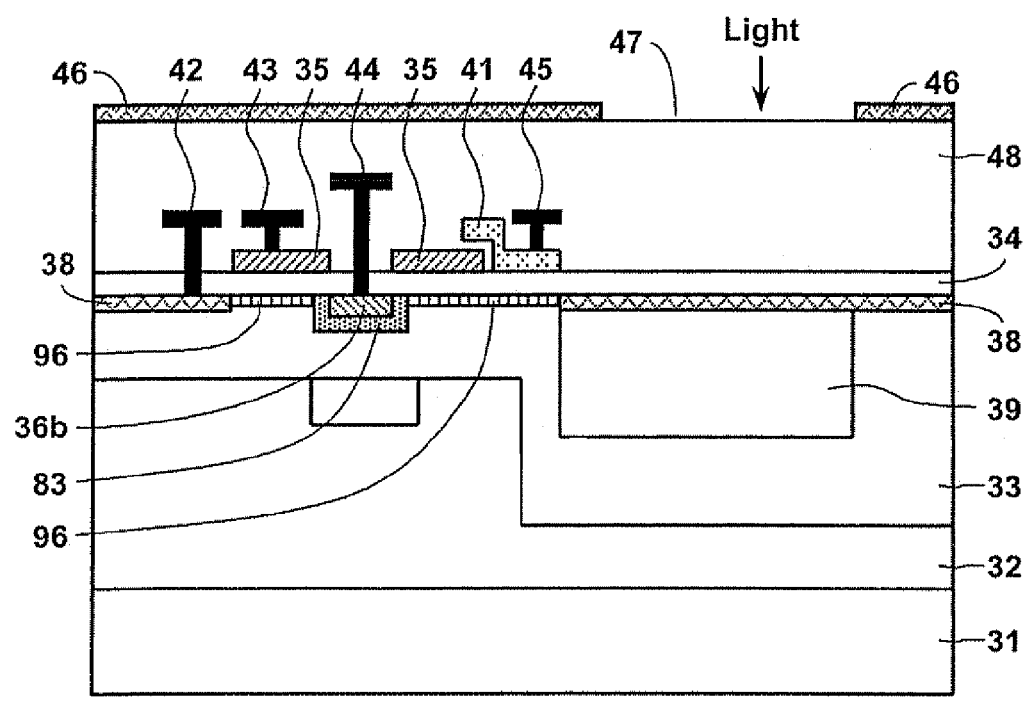
FIG. 18 is a cross sectional view of a solid state image sensing device according to an eighth embodiment of the present invention.

FIG. 18 is a cross sectional view of a solid state image sensing device according to a eighth embodiment of the present invention.

A solid state image sensing device according to the eighth embodiment is identical to that of the seventh embodiment except for the p⁻-type threshold adjusting layer 95, so that the same components are numbered by the same reference signs and their details are omitted.

As shown in FIG. 18, the solid state image sensing device according to the eighth embodiment is formed with a first conductive type threshold adjusting layer (hereinafter referred to as p⁻-type threshold adjusting layer) 96 on the surface of the n-well 33 by injecting p-type impurity into the n-well 33 as the same manner as the sixth embodiment. The p⁻-type threshold adjusting layer 96 is disposed on the surface of the n-well 33 in a shallow area with surrounding the source neighborhood p-type area 83 under the whole area of the ring shaped gate electrode 35 as well as the transfer gate electrode 41 and allocated in a depth shallower than the n+-type source area 36b and the n+-type drain area 38. The p⁻-type threshold adjusting layer 96 is provided for balancing potential distribution in the ring shaped gate electrode 35.

At a glance, providing the p⁻-type threshold adjusting layer 96 in the n-well 33 as mentioned above may mislead the solid state image sensing device of the eighth embodiment into being similar to the conventional solid state image sensing devices of the prior arts shown in FIGS. 33 and 34 in which the p-type area such as the p-well 613 and the p-type semiconductor area 725 is disposed under the ring shaped gate electrode 614 or 727. However, a difference between the eighth embodiment and the prior arts is apparently distinguished by the configuration such that the p⁻-type threshold adjusting layer 96 is disposed in a depth shallower than the n+-type source area 36b and the n+-type drain area 38.

Ninth Embodiment

Figure 19:
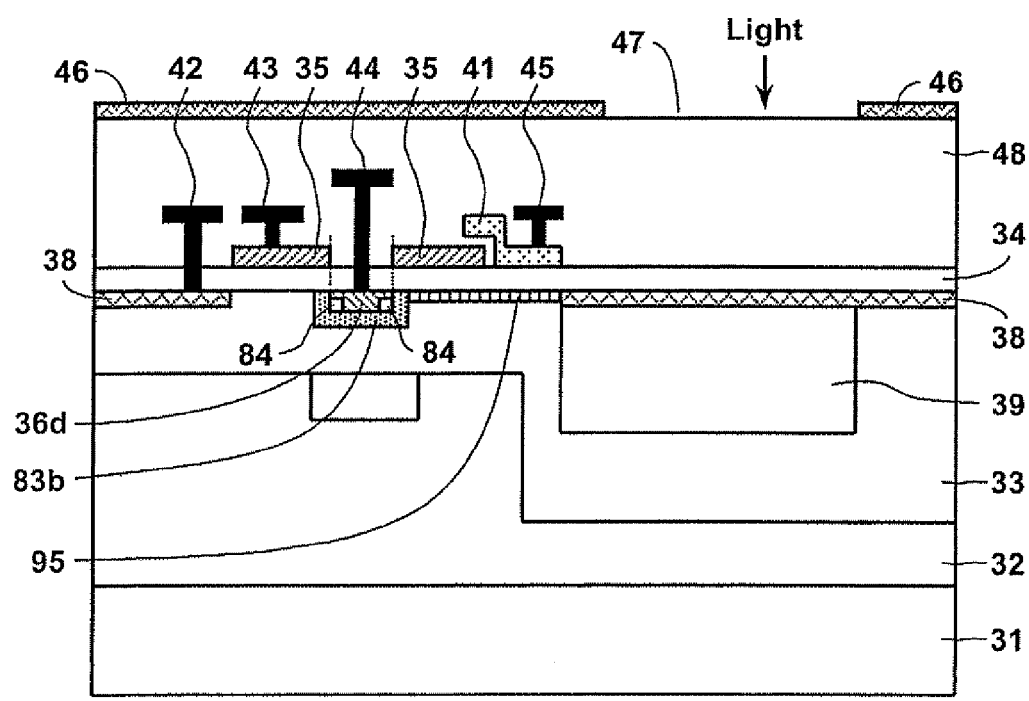
FIG. 19 is a cross sectional view of a solid state image sensing device according to a ninth embodiment that is in a combined configuration of the fifth and seventh embodiments.

FIG. 19 is a cross sectional view of a solid state image sensing device according to a ninth embodiment.

A solid state image sensing device according to a ninth embodiment is in a combined configuration of the fifth and the seventh embodiments, so that further details are omitted. As shown in FIG. 19, the p⁻-type threshold adjusting layer 95 shown in FIG. 17 is added to the solid state image sensing device of the fifth embodiment shown in FIG. 14.

Tenth Embodiment

Figure 20:
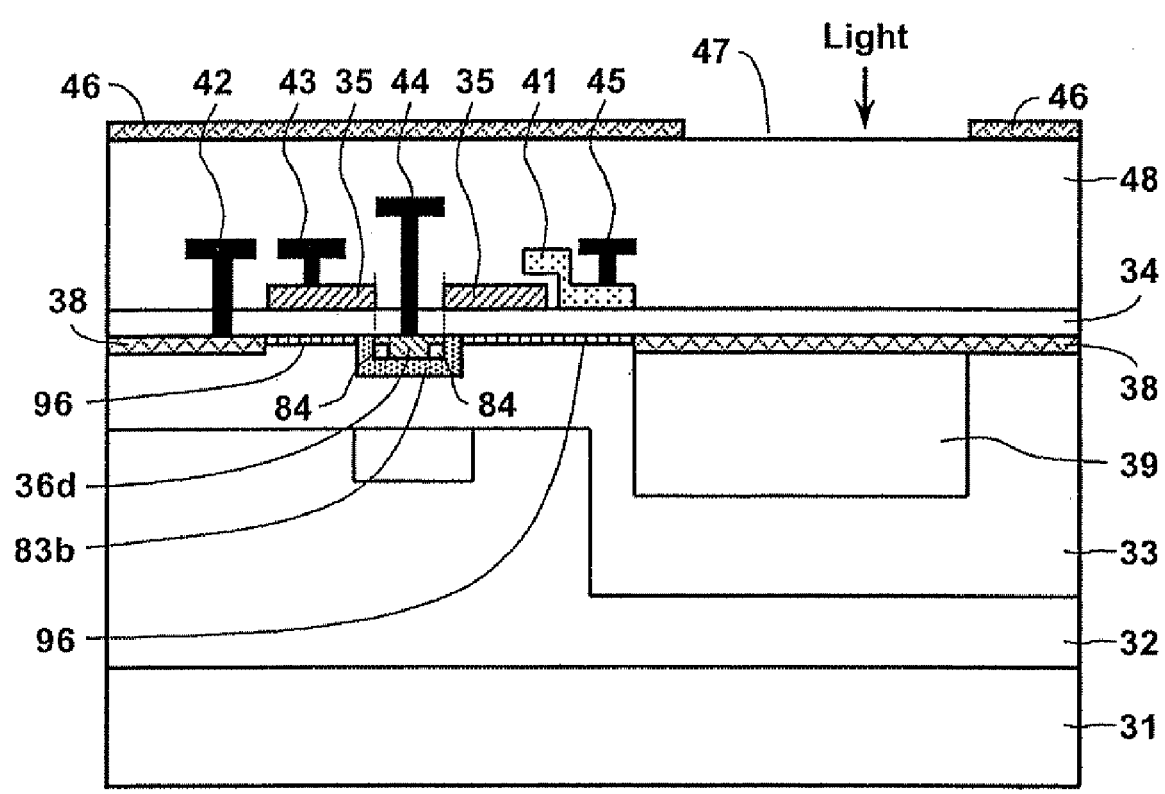
FIG. 20 is a cross sectional view of a solid state image sensing device according to a tenth embodiment that is in a combined configuration of the fifth and eighth embodiments.

FIG. 20 is a cross sectional view of a solid state image sensing device according to a tenth embodiment.

A solid state image sensing device according to a tenth embodiment is in a combined configuration of the fifth and the eighth embodiments, so that further details are omitted. As shown in FIG. 20, the p⁻-type threshold adjusting layer 96 shown in FIG. 18 is added to the solid state image sensing device of the fifth embodiment shown in FIG. 14.

It is preferable for exposure time of a solid state image sensing device to be variable. In this connection, with referring to FIGS. 21(a) to 21(p), a driving method of a solid state image sensing device, which enables to change exposure time of the solid state image sensing device, is explained in case the solid state image sensing device according to the above-mentioned each embodiment is utilized for taking a still picture.

Figure 21A:
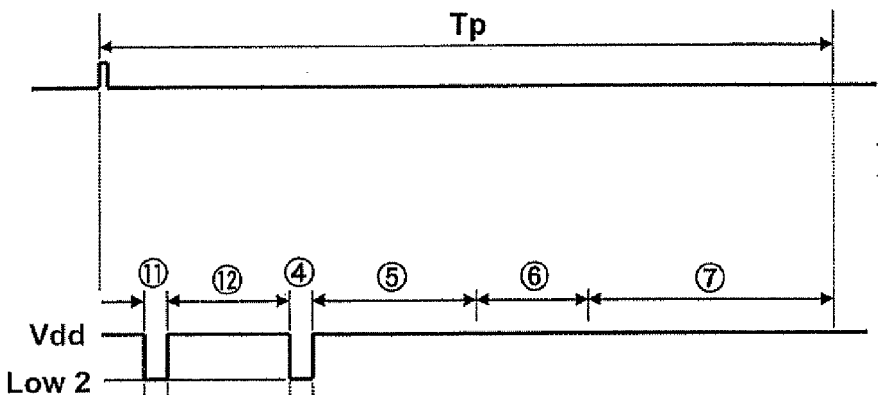
FIGS. 21(a) to 21(p) are timing charts for explaining operations in a driving method of a solid state image sensing device according to the present invention when taking a still picture.

FIGS. 21(a) to 21(p) are timing charts for explaining operations in a driving method of a solid state image sensing device according to the present invention when taking a still picture.

The timing charts shown in FIGS. 21(a) to 21(p) are similar to those shown in FIGS. 3(a) to 3(p) and exhibited with defining that the pixel 52 at the line "s" and the column "t" is read out from the pixel bedding area 51 in "m" lines and "n" columns as shown in FIG. 2.

As shown in FIG. 21(a), a start signal in one shot pulse is generated when a shutter button of a digital still camera, for example, is pressed down, and initiates to take a picture and to read out during a time duration Tp.

Figure 21B:
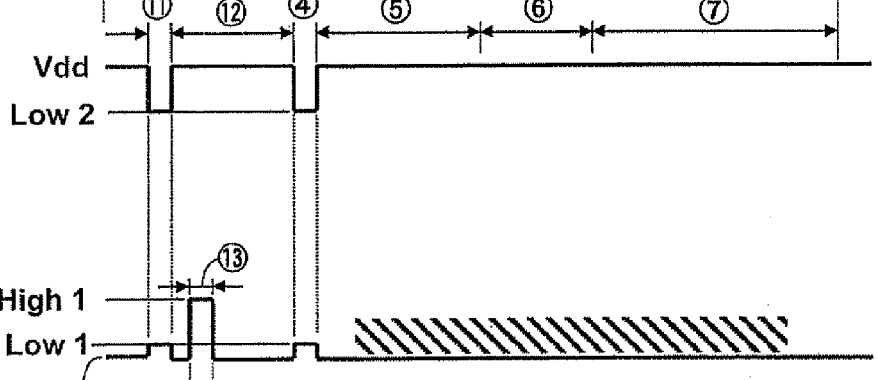
Figure 21C:
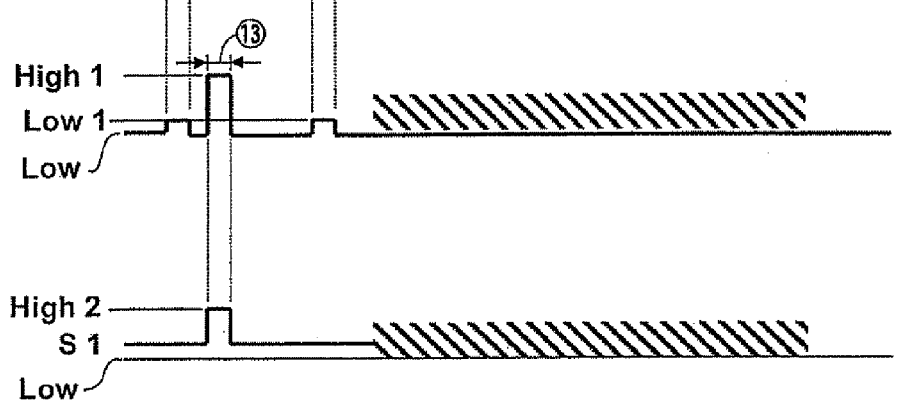
Figure 21D:
Figure 21E:
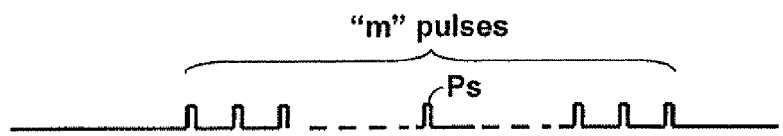
Figure 21F:

At first, during a period ① shown in FIG. 21(b), an extra electric charge that may remain in a photo diode such as the reference sign 54 in FIG. 2 is exhausted. For that purpose, as shown in FIG. 21(b), an electric potential of each transfer gate electrode of all pixels is lowered to "Low 2", so that a transfer gate MOSFET such as the reference sign 55 in FIG. 2 is turned on. Then, as shown in FIG. 21(c), an electric potential of each ring shaped gate electrode of all pixels is raised to "Low 1". Consequently, electric charges accumulated in a photo diode of each pixel are transferred to a source neighborhood p-type area such as the reference sign 37 shown in FIG. 1(b) through the same process as shown in FIG. 4(c), and resulting in emptying each photo diode of all pixels of its electric charges.

During a period ②, as shown in FIG. 21(b), an electric potential of each transfer gate electrode of all pixels is raised to Vdd in high level, so that each transfer gate MOSFET of all pixels such as the reference sign 55 in FIG. 2 is turned off. Consequently, a photo diode such as the reference sign 54 in FIG. 2 starts to expose, and resulting in accumulating holes in the photo diode through the photoelectric conversion process. Exposure time enables to be changed and is continued for designated time duration.

While the photo diode such as the reference sign 54 in FIG. 2 is exposed by raising the electric potential of the transfer gate electrode to Vdd, as shown in FIG. 21(*c*), an electric potential of a ring shaped gate electrode is once raised to "High 1" during a period ③. On the other hand, as shown in FIG. 21 (*d*), a source electrode potential of a ring shaped gate MOSFET such as the reference sign 53 in FIG. 2 of all pixels is raised to "High 2" during the period ③, and resulting in exhausting needless electric charges, which are transferred to a source neighborhood p-type area in the ring shaped gate MOSFET, to a substrate. This operation is similar to that shown in FIG. 4(*f*) except that this operation is simultaneously conducted with respect to all pixels.

When exhausting is completed, as shown in FIG. 21(*c*), each electric potential of ring shaped gate electrode of all pixels is lowered to "Low". On the other hand, as shown in FIG. 21(*d*), each source electrode potential of all pixels is lowered to "S1". Consequently, the operation is in idle activity.

When the designated exposure time is elapsed and time course comes into a next period ④ shown in FIG. 21(*b*), as shown in FIG. 21(*b*), an electric potential of each transfer gate electrode of all pixels is lowered to "Low 2", and at the same time, as shown in FIG. 21(*c*), each electric potential of ring shaped gate electrode of all pixels is raised to "Low 1". Consequently, an electric charge accumulated in each photo diode of all pixels is transferred to each source neighborhood p-type area of a ring shaped gate MOSFET corresponding to the photo diode respectively.

Succeedingly, reading out a pixel signal is conducted through periods ⑤ to ⑦ shown in FIG. 21(*b*). In this connection, the reading out operation is the same as that of the first embodiment illustrated in FIGS. 3(*a*) to 3(*p*), so that further details of reading out operation are omitted.

Further, FIGS. 21(*e*) to 21(*g*) are timing charts of the vertical shift register 58, the horizontal shift register 69 and the output signal Vout shown in FIG. 2 respectively.

Furthermore, FIGS. 21(*h*) to 21(*p*) are identical to FIGS. 3(*h*) to 3(*p*) respectively, so that their details are omitted.

According to the above-mentioned operations, the solid state image sensing device of the present invention enables to be applied for either short exposure time, that is, a short shutter as short as one ten thousandth (1/10000) second or a long exposure time, that is, long shutter as long as two seconds or five seconds when taking a still picture. This is a method of changing exposure time with respect to a still picture.

On the contrary, in case of a moving picture, a number of pictures is defined to as 30 frames per second or 60 frames per second, so that maximal exposure time is defined by a number of pictures to be taken. In case that a moving picture is constituted by 30 pictures per second, for example, maximal exposure time is impossible to be extended more than one thirtieth (1/30) second. Consequently, a log shutter is impossible to be realized. However, in some cases, a short shutter of less than 1/30 second is required. In case of taking a picture of swiftly moving object such as a moving vehicle, for example, a picture image keeps stable when taken by short exposure time. Consequently, a short shutter is effective.

However, as it is apparent from FIGS. 3(*a*) and 3(*b*), reading out operation of a pixel signal, that is, the period ⑥ overlaps the duration of accumulating photo diode charges in case of taking a moving picture. Therefore, an electric charge accumulated in the photo diode can not be exhausted to a source neighborhood p-type area until the reading out operation is completed as same as taking a still picture, and resulting in disabling to shorten exposure time. Consequently, a new system for exhausting an electric charge while reading out a pixel signal from a pixel is required in order to realize a short shutter.

Eleventh Embodiment

A solid state image sensing device, which enables to realize a short shutter, is explained next.

FIG. 22(*a*) is a plan view of a solid state image sensing device according to an eleventh embodiment of the present invention.

FIG. 22(*b*) is a fragmentary cross sectional view taken along line ZC-ZC of FIG. 22(*a*).

A solid state image sensing device according to the eleventh embodiment is identical to that of the first embodiment except for a photo diode and its neighboring area, so that the same components are numbered by the same reference signs and their details are omitted.

As shown in FIGS. 22(*a*) and 22(*b*), a first conductive type buried area in high concentration (hereinafter referred to as $p^+$-type area) 101 is formed between a top surface of an n-well 33*a* and a bottom surface of $p^-$-type epitaxial layer 32*a* adjacent to a photo diode 40*a* beside an $n^+$-type drain area 38*a*. A gate electrode 102 is formed in an area allocated between a $p^-$-type area of the photo diode 40*a*, that is, an buried $p^-$-type area 39*a* and the $p^+$-type area 101 with sandwiching the gate insulative film 34. By this configuration, a photo diode reset MOSFET that is equivalent to a reference sign 104 in FIG. 23 (to be detailed) is constituted as a p-type MOSFET having the gate electrode 102 in which the buried $p^-$-type area 39*a* and the $p^+$-type area 101 functions as a source area and a drain area respectively.

Further, a metal wiring 103 for gate electrode is connected to the gate electrode 102.

Furthermore, a light shading film 46*a* is formed on a transparent insulative layer 48*a* that is formed on the gate insulative film 34 with isolating the metal wiring 42 through 45 and 103 separately.

With referring to FIG. 23, a pixel configuration and a total configuration of the solid state image sensing device according to the eleventh embodiment of the present invention is explained next.

Figure 23:
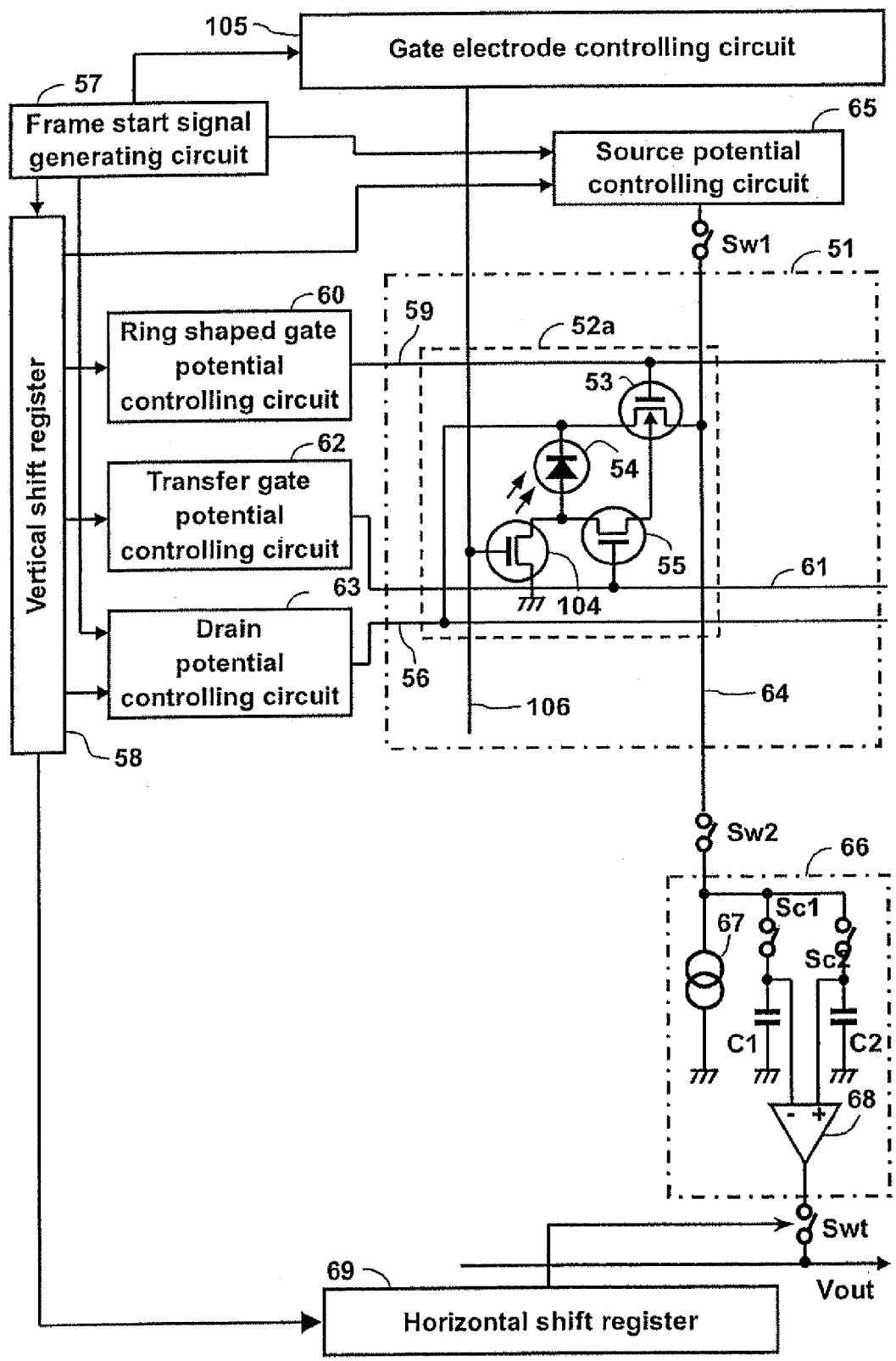
FIG. 23 is a diagram exhibiting a pixel configuration and a total configuration of the solid state image sensing device according to the eleventh embodiment of the present invention.

FIG. 23 is a diagram exhibiting a pixel configuration and a total configuration of the solid state image sensing device according to the eleventh embodiment of the present invention.

The diagram shown in FIG. 23 is identical to that of the first embodiment shown in FIG. 2 except for a pixel 52*a* and a controlling circuit 105, so that the same components are numbered by the same reference signs and their details are omitted. In FIG. 23, a pixel 52*a* at the line "s" and the column "t" is provided with the above-mentioned photo diode reset MOSFET 104 and a photo diode reset transistor gate electrode controlling circuit (hereinafter referred to as gate electrode controlling circuit) 105 is added and a wiring 106 for gate electrode, which is equivalent to the metal wiring 103 shown in FIG. 22(*b*), runs in the vertical direction in comparison with the diagram shown in FIG. 2.

Further, the gate electrode controlling circuit 105 controls all pixels commonly, so that the wiring 106 enables to run in either the vertical or the horizontal direction. However, in FIG. 23, the running direction of the wiring 106 is illustrated in the vertical direction.

Figure 24D:
FIGS. 24(a) to 24(q) are timing charts for explaining operations in a driving method of the solid state image sensing device according to the eleventh embodiment of the present invention.

With referring to FIGS. 24(a) to 24(q), a driving method of the solid state image sensing device shown in FIG. 23 according to the eleventh embodiment of the present invention is explained next. In FIGS. 24(a) to 24(q), a same signal waveform is indicated by the same reference sign as shown in FIGS. 3(a) to 3(p), so that its descriptions are omitted.

During a period ① shown in FIG. 24(c), as shown in FIG. 24(b), an output signal from the gate electrode controlling circuit 105 is in high level. The output signal in high level is supplied to the gate electrode of the photodiode reset MOSFET 104 through the wiring 106, and resulting in turning the photodiode reset MOSFET 104 off. In this period ①, an electric charge is accumulated in the photo diode 54.

Succeedingly, when a frame start signal is emitted as shown in FIG. 24(a), reading out a next frame is started as same manner as the first embodiment shown in FIGS. 3(a) to 3(p). In case of the eleventh embodiment, as shown in FIG. 24(b), when a reset pulse Prst of one shot pulse in low level is emitted from the gate electrode controlling circuit 105 at an arbitrary timing while an electric charge is accumulated in the photo diode 54 during a period T1 in FIG. 24(b). In other words, when the arbitrary period T1 elapses, the reset pulse Prst is emitted from the gate electrode controlling circuit 105 and supplied to the gate terminal of the photo diode reset MOSFET 104 through the wiring 106, and results in turning the photo diode reset MOSFET 104 on.

Figure 22A:
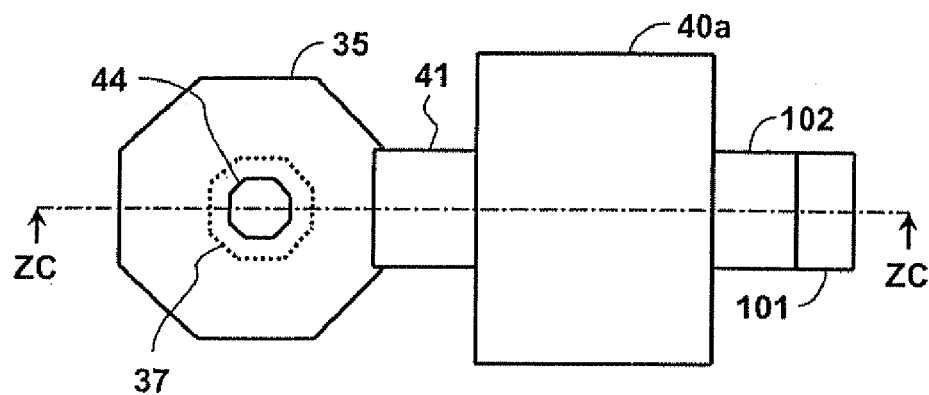
FIG. 22(a) is a plan view of a solid state image sensing device according to an eleventh embodiment of the present invention.
Figure 22B:
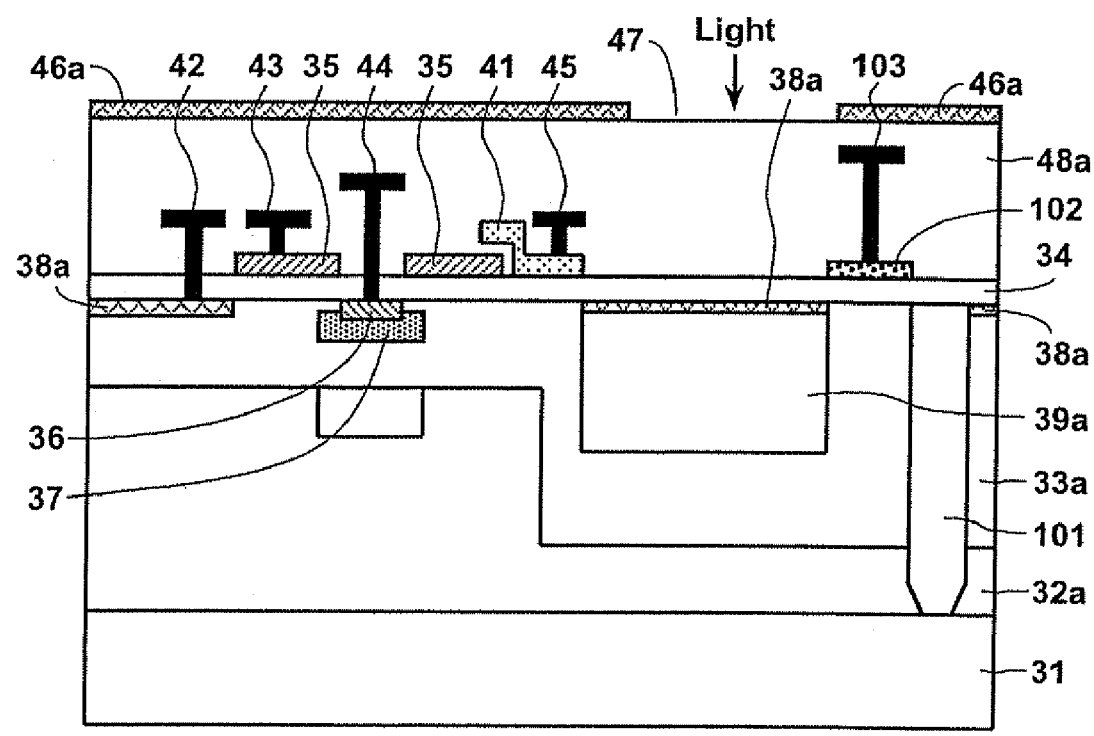
FIG. 22(b) is a fragmentary cross sectional view taken along line ZC-ZC of FIG. 22(a).

When the photo diode reset MOSFET 104 is turned on, an electric charge accumulated in the buried $p^-$-type area 39a of the photo diode 54 is exhausted to the $p^+$ substrate 31 through the drain terminal of the photo diode reset MOSFET 104 being turned on, wherein the photo diode 54 is equivalent to the photo diode 40a in FIG. 22(a) and the drain terminal of the photo diode reset MOSFET 104 is equivalent to the $P^+$-type area 101 in FIGS. 22(a) and 22(b).

Succeedingly, when the photo diode reset MOSFET 104 is turned off by a signal emitted from the gate electrode controlling circuit 105, accumulating an electric charge in the photo diode 54 is restarted and a time duration shown by T2 in FIG. 24(b) results in exposure time of a short shutter, wherein the period T2 is the time duration between the reset pulse Prst and a next timing when the transfer gate potential is lowered to "Low 2" again. The other operations are the same as the first embodiment shown in FIGS. 3(c) to 3(p), so that further details are omitted.

According to a driving method of the solid state image sensing device of the eleventh embodiment, it is advantageous to the driving method that exposure time of a short shutter enables to be arbitrarily designated by setting a timing of reset pulse Prst, which is outputted from the gate electrode controlling circuit 105

Twelfth Embodiment

A solid state image sensing device in which resetting a photo diode is realized by applying a positive high voltage to a drain gate of a ring shaped gate MOSFET is explained next.

Figure 25A:
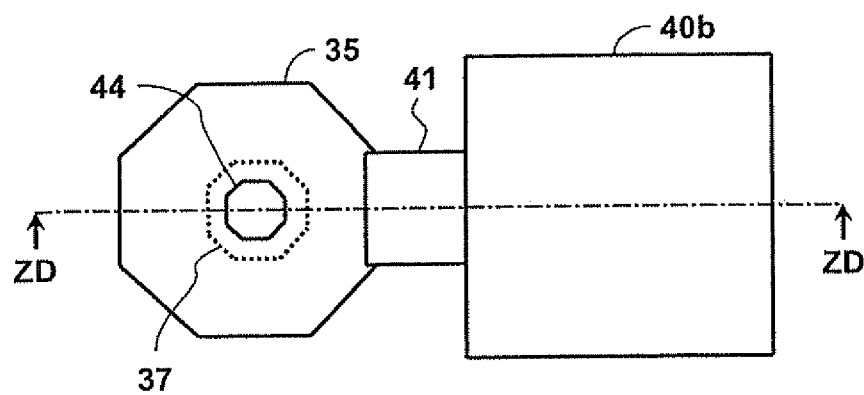
FIG. 25(a) is a plan view of a solid state image sensing device according to a twelfth embodiment of the present invention.

FIG. 25(a) is a plan view of a solid state image sensing device according to a twelfth embodiment of the present invention.

Figure 25B:
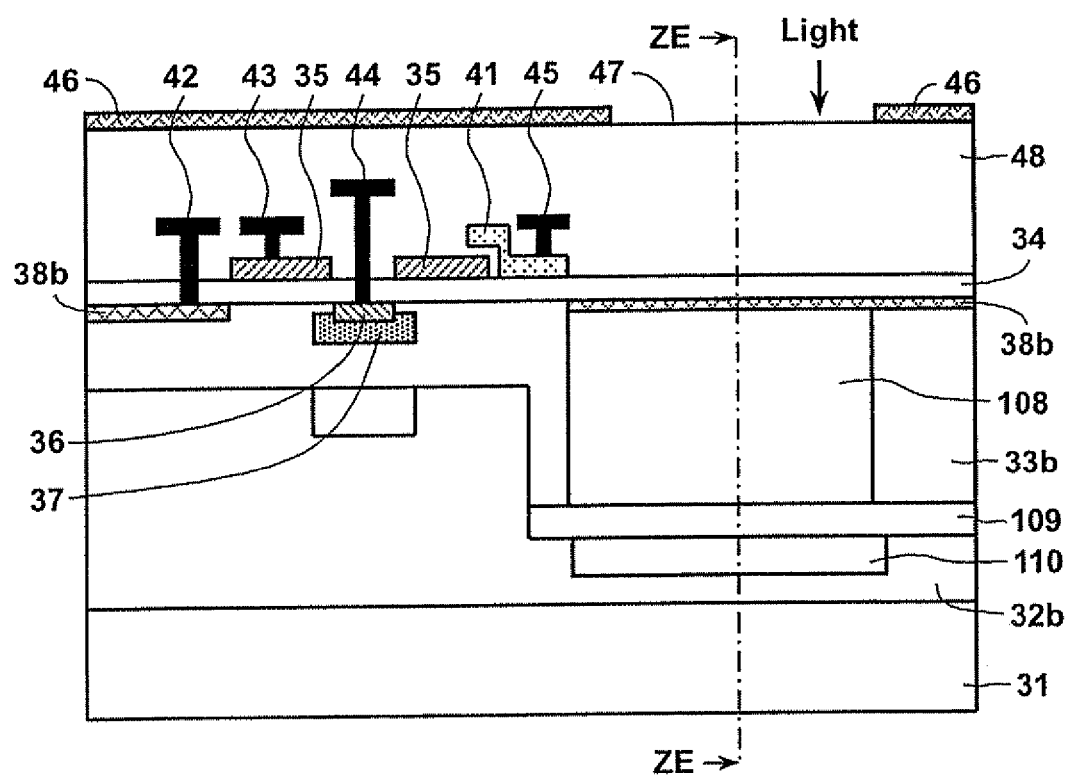
FIG. 25(b) is a fragmentary cross sectional view taken along line ZD-ZD of FIG. 25(a).

FIG. 25(b) is a fragmentary cross sectional view taken along line ZD-ZD of FIG. 25(a).

Figure 26A:
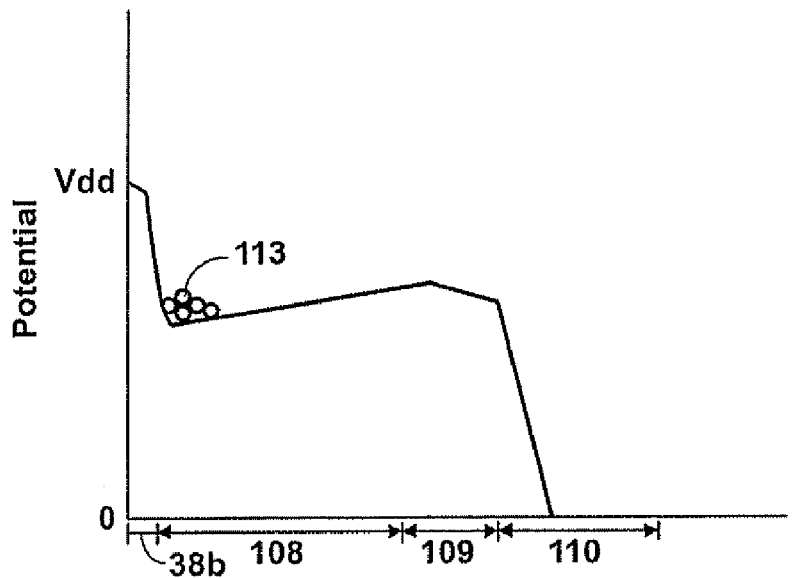
FIGS. 26(a) and 26(b) are electric potential diagrams in a cross sectional view taken along line ZE-ZE of FIG. 25(b).
Figure 26B:
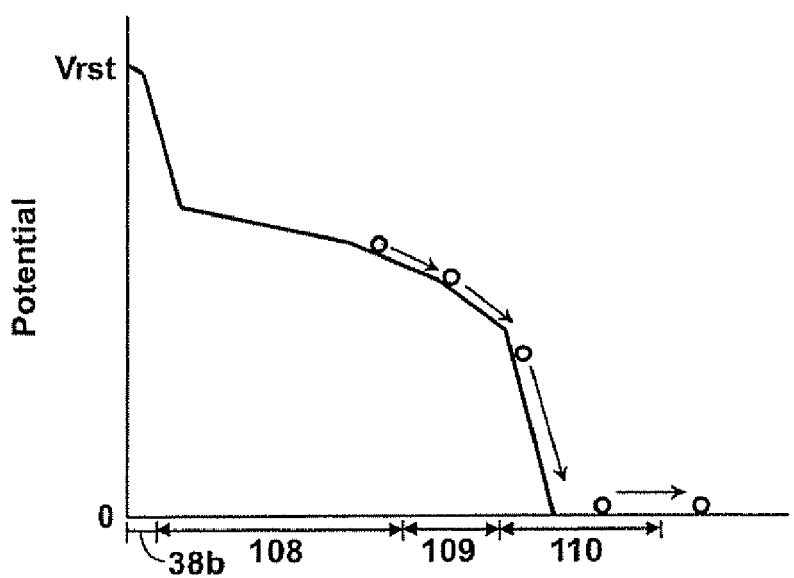

FIGS. 26(a) and 26(b) are electric potential diagrams in a cross sectional view taken along line ZE-ZE of FIG. 25(b).

Figure 27:
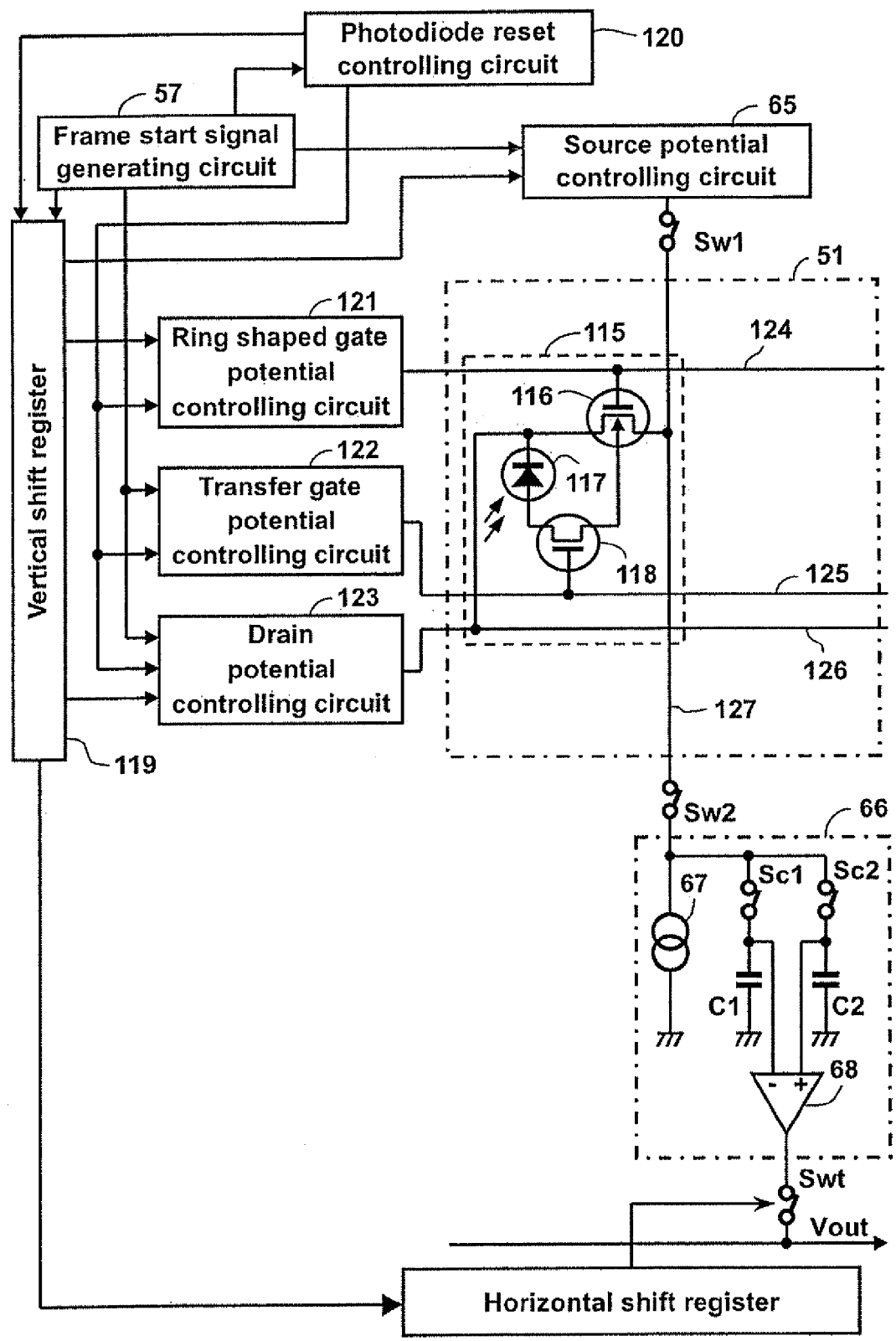
FIG. 27 is a diagram exhibiting a pixel configuration and a total configuration of the solid state image sensing device according to the twelfth embodiment of the present invention.

FIG. 27 is a diagram exhibiting a pixel configuration and a total configuration of the solid state image sensing device according to the twelfth embodiment of the present invention.

Figure 28A:
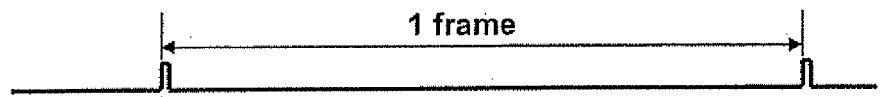
FIGS. 28(a) to 28(q) are timing charts for explaining operations in a driving method of the solid state image sensing device according to the twelfth embodiment of the present invention.
Figure 28B:
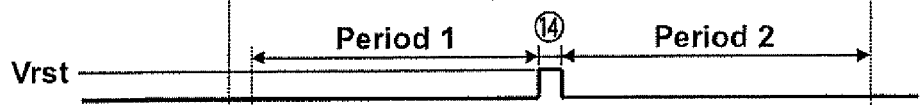
Figure 28C:
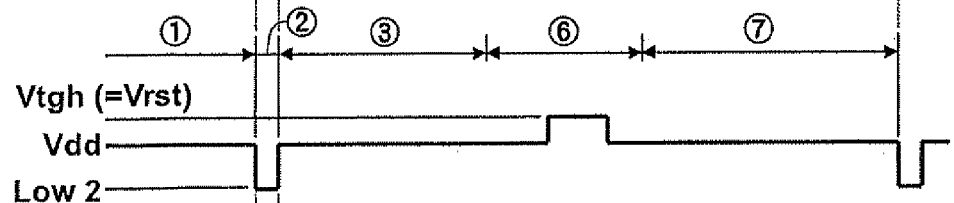
Figure 28E:
Figure 28F:
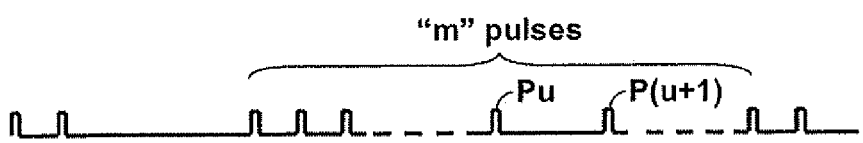
Figure 28G:
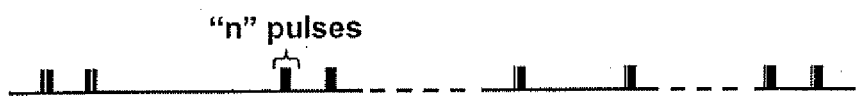
Figure 28H:
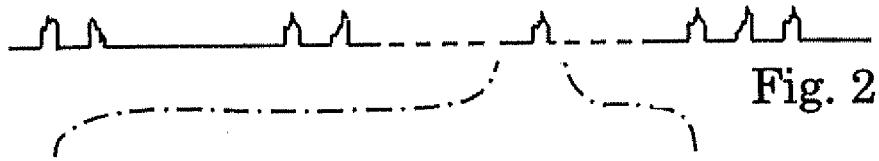
Figure 28I:
Figure 28J:
Figure 28K:
Figure 28L:
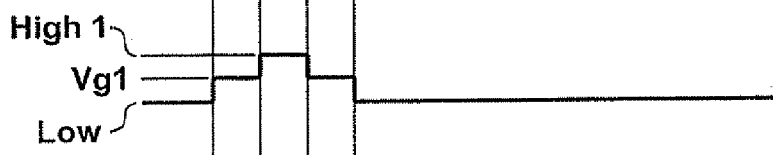
Figure 28M:
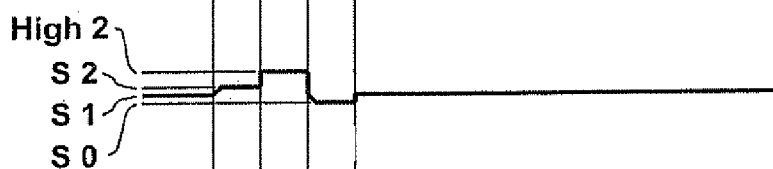
Figure 28N:
Figure 28O:
Figure 28P:
Figure 28Q:
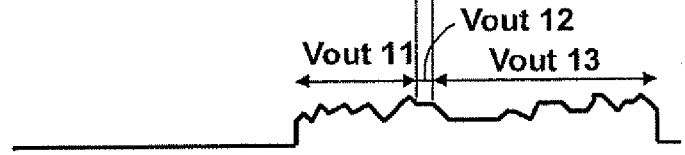

FIGS. 28(a) to 28(q) are timing charts for explaining operations in a driving method of the solid state image sensing device according to the twelfth embodiment of the present invention.

A solid state image sensing device according to the twelfth embodiment is identical to that of the first embodiment except for a photo diode and its neighboring area, so that the same components are numbered by the same reference signs and their details are omitted.

In FIG. 25(b), in order to release a hole as an electric charge to the $p^+$-type substrate 31 when a drain potential of an $n^+$-type drain area 38b of a ring shaped gate MOSFET is raised, the solid state image sensing device according to the twelfth embodiment is composed of a buried $p^-$-type area 108 that is formed right under the $n^+$-type drain area 38b, a second conductive type first area in low concentration (hereinafter referred to as $n^-$-type area) 109, and a first conductive type second area in high concentration (hereinafter referred to as $p^+$-type area) 110 formed in a n-well 33b and a $p^-$-type epitaxial layer 32b respectively so as to adjust impurity concentration at the bottom of the n-well 33b, wherein the buried $p^-$-type area 108 constitutes a photodiode 40b shown in FIG. 25(a). The $n^-$-type area 109 and the $p^+$-type area 110 is sequentially formed on the bottom of the buried $p^-$-type area 108 toward the $p^+$-type substrate 31.

When a drain voltage of the $n^+$-type drain area 38b is Vdd, each potential profile of the buried $p^-$-type area 108, the $n^-$-type area 109, and the $p^+$-type area 110 is shown in FIG. 26(a). As shown in FIG. 26(a), a hole 113 obtained through the photoelectric conversion process in the photo diode 40b is accumulated in the buried $p^-$-type area 108.

When a drain voltage of the $n^+$-type drain area 38b is raised to Vrst that is higher than Vdd, as shown in FIG. 26(b), the higher voltage Vrst makes gradient of the potential profile of the photo diode 40b gradually descend toward the $p^+$-type substrate 31. Consequently, the hole 113 is exhausted to the $p^+$-type substrate 31 by way of the $n^-$-type area 109 and the $p^+$-type area 110, and resulting in resetting the photo diode 40b.

In the meanwhile, in case of resetting the photodiode 40b by applying the high voltage Vrst to the $n^+$-type drain area 38b, following problems may occur. A first problem is such that a drain current value of the ring shaped gate MOSFET changes and a signal fluctuates if a drain voltage is changed when reading out the signal from a pixel.

A second problem is as follows: a voltage of the transfer gate electrode 41 becomes negative with respect to an n-well potential, the transfer gate MOSFET is turned on, an electric charge accumulated in the photo diode 40b is transferred to the source neighborhood p-type area 37, and there is a possibility of changing information stored in the source neighborhood p-type area 37 although an electric potential of the n-well 33b, which is connected to the ring shaped gate MOSFET, rises when a drain voltage of the ring shaped gate MOSFET is changed.

A third problem is such that an electric potential difference between the ring shaped gate electrode 35 and the n-well 33b becomes larger and there is a possibility of causing a reliability problem in dielectric strength of the gate insulative film 34.

In this connection, the solid state image sensing device according to the twelfth embodiment of the present invention solves the above-mentioned three problems as mentioned below.

With respect to the first problem, it is solved by that resetting the photo diode 40b is not performed while a pixel signal is read out. A reading out operation is once interrupted when reading out from a certain line is completed, and then the photo diode 40b is reset. Succeedingly, the interrupted reading out is restarted when resetting the photo diode 40b is completed. Consequently, a signal is prevented from affection of a drain voltage that changes.

With respect to the second problem, it is cleared by that an electric potential of the transfer gate electrode 41 is previously raised before a drain voltage of the ring shaped gate MOSFET is increased. Consequently, the transfer gate MOSFET is prevented from being accidentally turned on.

With respect to the third problem, it is solved by devising configuration of a device such that electric field does not concentrate on the gate insulative film 34 by using a phenomenon such as making deplete.

FIG. 27 is a diagram exhibiting a total configuration of the solid state image sensing device according to the twelfth embodiment of the present invention, which is provided with the methods of solving the above-mentioned three problems.

The diagram shown in FIG. 27 is identical to that of the first embodiment shown in FIG. 2 except for a pixel 115, a vertical shift register 119, and controlling circuits 120 to 123, so that the same components are numbered by the same reference signs and their details are omitted.

In FIG. 27, a pixel is allocated in the pixel bedding area 51 in "m" lines and "n" columns. One pixel 115 allocated at a line "u" and a column "v" out of the pixels allocated in "m" lines and "n" columns is illustrated in an equivalent circuit as a representative pixel in FIG. 27. As shown in FIG. 27, the pixel 115 is composed of a ring shaped gate MOSFET 116, a photo diode 117, and a transfer gate MOSFET 118. A drain terminal of the ring shaped gate MOSFET 116 is connected to a wiring 126 for a drain electrode, which is equivalent to the metal wiring 42 shown in FIG. 25(b), together with a cathode side terminal of the photo diode 117. A source terminal and a drain terminal of the transfer gate MOSFET 118 is connected to an anode side terminal of the photo diode 117 and a back gate terminal of the ring shaped gate MOSFET 116 respectively.

The above-mentioned ring shaped gate MOSFET 116 is equivalent to an n-channel MOSFET having the n$^+$-type source area 36 and the n$^+$-type drain area 38b, wherein the source neighborhood p-type area 37, which is provided right under the ring shaped gate electrode 35, is assumed as a gate area in FIG. 25(b).

Further, in FIG. 25(b), the above-mentioned transfer gate MOSFET 118 is equivalent to a p-channel MOSFET in which each of the n-well 33b provided right under the transfer gate electrode 41, the buried p$^-$-type area 108 of the photo diode 40b, and the source neighborhood p-type area 37 is assumed as a gate area, a source area, and a drain area respectively.

Furthermore, the photo diode 117 shown in FIG. 27 is equivalent to the photo diode 40b shown in FIG. 25(a).

More, a vertical shift register 119 is supplied with an output signal from a photodiode reset controlling circuit 120 and the frame start signal generating circuit 57 respectively.

Moreover, a ring shaped gate potential controlling circuit 121 outputs a ring shaped gate electrode potential to a wiring 124 for a ring shaped gate electrode that is equivalent to the reference sign 43 shown in FIG. 25(b). A transfer gate potential controlling circuit 122 outputs a transfer gate electrode potential to a wiring 125 for a transfer gate electrode that is equivalent to the reference sign 45 shown in FIG. 25(b). A drain potential controlling circuit 123 outputs a drain electrode potential to the wiring 126 that is equivalent to the reference sign 42 shown in FIG. 25(b). The source potential controlling circuit 65 is connected to a wiring 127 for a source electrode that is equivalent to the reference sign 44 shown in FIG. 25(b).

In addition thereto, in FIG. 27, the pixel 115 at the line "u" and the column "v" is illustrated as the representative pixel in the pixel bedding area 51 in "m" lines and "n" columns. On the contrary, in FIG. 2, the pixel 52 at the line "s" and the column "t" is illustrated as the representative pixel in the pixel bedding area 51 in "m" lines and "n" columns. Function-wise and operation-wise, these pixels 115 and 52 are identical to each other, so that a signal reading-out circuit in FIG. 27 connected to the pixel 115 is indicated by the same reference sign 66 as shown in FIG. 2.

With referring to FIGS. 28(a) to 28(q), a driving method of the solid state image sensing device shown in FIG. 27 according to the twelfth embodiment of the present invention is explained next.

In FIG. 27, when command of a short shutter is issued from a digital still camera or a movie camera installed with the solid state image sensing device of the twelfth embodiment, it is determined that an electric charge accumulated in the photo diode 117 is reset after reading out from which line by calculating back from a timing when the photo diode reset controlling circuit 120 transfers an electric charge to the source neighborhood p-type area 37. It should be understood that the photo diode reset controlling circuit 120 enables to be installed either inside the solid state image sensing device or outside. However, in this twelfth embodiment, the photo diode reset controlling circuit 120 exclusively utilized for calculation is defined to be installed inside the solid state image sensing device hereupon.

When reading out from a specific line, which is decided by a result of calculation, that is, the line "u" in case of the twelfth embodiment shown in FIGS. 28(a) to 28(q), is completed, the photo diode reset controlling circuit 120 interrupts an operation of the vertical shift register 119 temporarily so as not to read out from a next line, that is, a line "u+1" in case of the twelfth embodiment shown in FIG. 28(f).

As shown in FIG. 28(e), a source potential outputted from the source potential controlling circuit 65 is set to "Vsrst", and, as shown in FIG. 28(d), an electric potential of a ring shaped gate electrode outputted from the ring shaped gate potential controlling circuit 121 is set to "Vgrst". The electric potentials "Vsrst" and "Vgrst" are arbitrary designated as far as a hole accumulated in the source neighborhood p-type area 37 is not reset or an extra current does not flow. In other words, these electric potentials "Vsrst" and "Vgrst" are defined to satisfy inequalities "Vsrst<High 2" and "Vgsrt<High 1". Normally, they are defined as "Vsrst=S1" and "Vgsrt=Low". These designations are simultaneously conducted to all pixels.

The photo diode rest controlling circuit 120 controls the transfer gate potential controlling circuit 122 so as to output an electric potential "Vtgh" to the wiring 125. The electric potential "Vtgh" satisfies an inequality "Vtgh>Vdd" and is an electric potential for the transfer gate MOSFET 118 not to be turned on when a drain potential is set to "Vrst". Normally, as shown in FIG. 28(c), it is defined as "Vtgh=Vrst".

In order to raise the electric potential "Vtgh" of the transfer gate electrode 45 to the drain potential "Vrst" previously, in other words, to set the electric potential "Vtgh" to be equal to the drain potential "Vrst" (Vtgh=Vrst) previously, during a period ④ shown in FIG. 28(b), the photo diode reset controlling circuit 120 controls the drain potential controlling circuit 123 not to turn the transfer gate MOSFET 118 on when a drain potential to be supplied to the wiring 126 is raised to "Vrst" as shown in FIG. 28(b). Consequently, the transfer gate MOSFET 118 is not turned on when a drain potential is raised, and resulting in preventing a hole from being transferred to the source neighborhood p-type area 37.

On the other hand, during the period ④ shown in FIG. 28(b), a drain potential is increased to more than the drain potential Vdd of the n$^+$-type drain area 38b shown in FIG. 25(b) by the drain potential "Vrst" supplied to the wiring 126. Therefore, as shown in FIG. 26(b), the gradient of the potential profile of the photo diode 40b gradually descends toward the p$^+$-type substrate 31. Consequently, the hole 113 accumulated in the p$^-$-type area 108 is exhausted to the p$^+$-type substrate 31 by way of the n$^-$-type area 109 and the p$^+$-type area 110, and resulting in resetting the photo diode 40b.

After that, as shown in FIGS. 28(b) and 28(c), the photo diode reset controlling circuit 120 sequentially controls the drain potential controlling circuit 123 and the transfer gate potential controlling circuit 122 to return a drain electrode potential of the ring shaped gate MOSFET 116 and a transfer gate electrode potential of the transfer gate MOSFET 118 to the electric potential Vdd sequentially. Then, as shown in FIGS. 28(f) to 28(h), reading out a pixel signal once interrupted is restarted from a line "u+1". In case of a moving picture, reading out a pixel signal is conducted by each frame.

In FIG. 28(p), a reference sign Pv is a pulse at a column "v" outputted from the horizontal shift register 69, and resulting in turning the output switch Swt on. In FIG. 28(q), "Vout 11" is an output signal equivalent to pixels at column one to column "v−1", "Vout 12" is an output signal equivalent to pixels at the column "v", and "Vout 13" is an output signal equivalent to pixels at column "v+1" to column "n".

Further, FIGS. 28(i) to 28(q) are identical to the signals shown in FIGS. 3(h) to 3(p), so that further details are omitted.

Thirteenth Embodiment

Figure 29A:
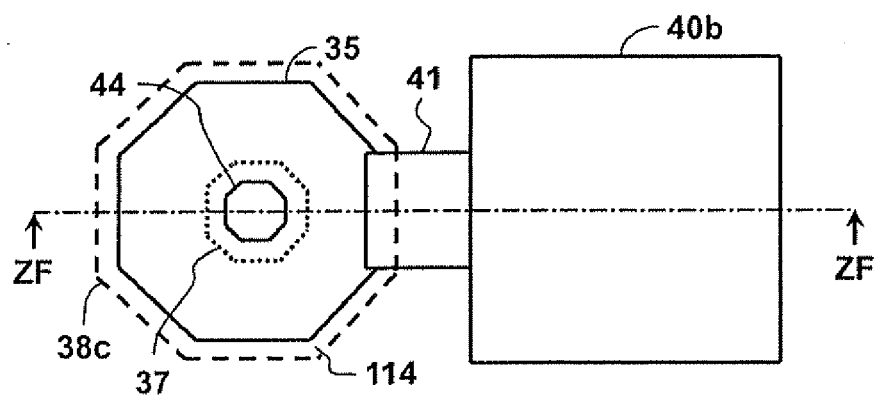
FIG. 29(a) is a plan view of a solid state image sensing device according to a thirteenth embodiment of the present invention.

FIG. 29(a) is a plan view of a solid state image sensing device according to a thirteenth embodiment of the present invention.

Figure 29B:
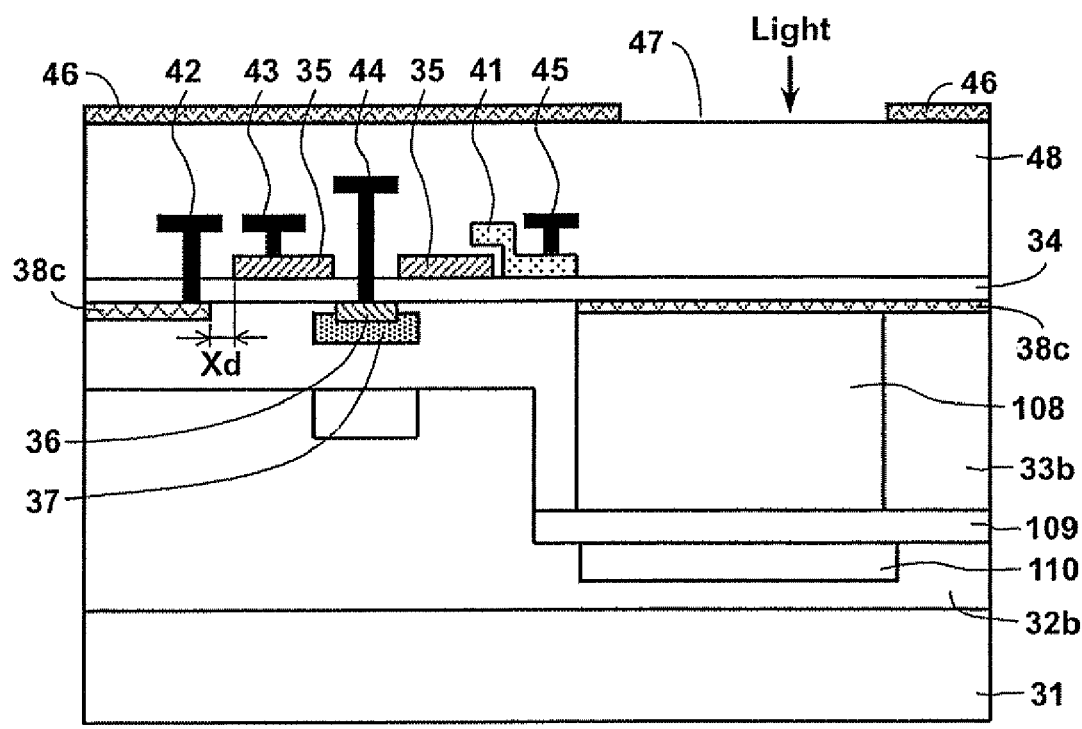
FIG. 29(b) is a fragmentary cross sectional view taken along line ZF-ZF of FIG. 29(a).

FIG. 29(b) is a fragmentary cross sectional view taken along line ZF-ZF of FIG. 29(a).

A solid state image sensing device according to the thirteenth embodiment is identical to that of the twelfth embodiment shown in FIGS. 25(a) and 25(b) except for a n$^+$-type drain area 38c, so that the same components are numbered by the same reference signs and their details are omitted.

As shown in FIGS. 29(a) and 29(b), a solid state image sensing device according to the thirteenth embodiment is provided with a n$^+$-type non-injected area 114 in the n-well 33b so as to surround the ring shaped gate electrode 35. An inner circumferential side section of the n$^+$-type drain area 38b is apart from the outer circumference of the ring shaped gate electrode 35 by a distance Xd. Consequently, the gate insulative film 34 is prevented from excessive electric field, which is caused by increasing potential difference between the ring shaped gate electrode 35 and the n-well 33b and exceeds dielectric strength of the gate insulative film 34.

It should be understood that the method of distancing the inner circumferential side section of the n$^+$-type drain area 38b from the outer circumference of the ring shaped gate electrode 35 by Xd enables to be applied for any of the solid state image sensing devices according to the first to eleventh embodiment.

Next, description is given to a driving method of realizing the pinning in the solid state image sensing device of the present invention.

The pinning is to form an inversion layer on an interfacial surface of a gate insulative film provided on a surface of a silicon substrate by setting a gate electrode potential to more than threshold voltage. Dark current causing noise is generated in an interfacial area of a gate insulative film. However, by the pinning, an electric charge generated in an interfacial area of a gate insulative film is controlled to move to a silicon substrate by a shielding effect of an inversion layer carrier in the interfacial area of the gate insulative film, and resulting in enabling to suppress noise.

Further, the inversion layer carrier fills an interfacial level of the gate insulative film. Therefore, an electric charge causing noise enables to be suppressed to generate in the interfacial area of the gate insulative film for a certain period of time although the gate insulative film is in a depleted state without an inversion layer.

In the case of the prior art that conducts the pinning method to a solid state image sensing device having a ring shaped gate electrode, the Japanese publication of unexamined patent applications No. 10-74928/1998 discloses the pinning method. According to the prior art, an inversion layer is formed under the gate electrode at each time reading out from one line or several lines so as to be in the pinning state, and resulting in suppressing noise.

Even in the solid state image sensing device according to each embodiment of the present invention, when dark current generates in an interfacial area of the gate insulative film 34 of the ring shaped gate electrode 35, a hole as a carrier immediately reaches to the source neighborhood p-type area 37 that is the lowest in potential, and resulting in noise. The pinning is also important for the solid state image sensing device according to the present invention in case the noise exceeds a prescribed allowance.

In order to conduct the pinning, a voltage condition that conducts an inversion state is necessary to be given to an area under a gate electrode. However, electric current flows through source and drain terminals when potential difference exists between the source and the drain terminals, so that the potential difference is necessary to be reduced to zero.

One method of reducing the potential difference is reducing a drain potential as low as a source potential. In other words, a drain voltage is reduced to a source potential at each time when reading out a signal for one line is completed, and a gate electrode potential is raised to more than threshold voltage. This method enables to be applied for reading out by each horizontal line, so that dark current is surely suppressed. However, in case the drain potential of over all pixels at each line is vertically changed, power consumption increases.

In this connection, according to the present invention, the pinning enables to be conducted at a predetermined horizontal readout line such as every two horizontal lines, every five horizontal lines and every ten horizontal lines, not at each one horizontal line. This interval depends on frequency of holes that generate in the interfacial area of the gate insulative film. In other words, the interval excessively depends on manufacturing processes, so that it is impossible to determine an interval at every how many lines. However, it enables to be experimentally confirmed.

Fourteenth Embodiment

With referring to FIGS. 30(a) to 30(q), a driving method, which enables to realize a pinning method according to a fourteenth embodiment of the present invention, is explained next.

FIGS. 30(a) to 30(q) are timing charts for explaining operations in a driving method of the solid state image sensing device according to the fourteenth embodiment of the present invention. The timing charts are illustrated such that the pinning is conducted at every two lines. However, the timing charts exhibit only two times of pinning periods ⑤ and ⑥ representatively, wherein a first pinning period ⑤ is conducted at a period while reading out from a line "u−1" is completed and next reading out from a line "u" is started, and wherein a second pinning period ⑥ is conducted at a period while reading out from a line "u+1" is completed and next reading out from a line "u+2" is started. In other words, a pinning operation is conducted at every two lines although pinning operations other than the pinning periods ⑤ and ⑥ are not illustrated in FIGS. 30(f) to 30(q).

In FIG. 30(p), a reference sign Pv is a pulse at a column "v" outputted from the horizontal shift register 69, and resulting in turning the output switch Swt on. In FIG. 30(q), a reference sign "Vout 11" is an output signal equivalent to pixels at column one to column "v−1", a reference sign "Vout 12" is an output signal equivalent to pixels at the column "v", and a reference sign "Vout 13" is an output signal equivalent to pixels at column "v+1" to column "n".

Further, FIGS. 30(f) to 30(q) are identical to FIGS. 3(e) to 3(p) except for the above-mentioned reference signs, so that further details are omitted.

The timing charts shown in FIGS. 30(a) to 30(q) enable to be applied for any solid state image sensing device according to the present invention. When a frame start signal shown in FIG. 30(a) is outputted, the frame start signal initiates a solid state image sensing device to start reading out a pixel signal for one frame. The reading out operation is temporary interrupted when reading out a pixel signal at a line "u−1" is completed. Then, during the first pinning period ⑤ shown in FIG. 30(b), as shown in FIG. 30(b), a drain electrode potential of each ring shaped gate MOSFET of all pixels is lowered from Vdd to S1, which is the same potential as a source electrode of the ring shaped gate MOSFET shown in FIG. 30(e). At the same time, as shown in FIG. 30(d), an electric potential of each ring shaped gate electrode of all pixels is raised to "Vth+" that is higher than threshold voltage Vth.

In this connection, in all pixels, an interfacial area of a gate insulative film such as the reference sign 34 in FIG. 1 disposed under a ring shaped gate electrode such as the reference sign 35 in FIG. 1 of each pixels is conducted to be an inversion state, and resulting in injecting an electron into the inversion layer from a source area such as the n$^+$-type source area 36 shown in FIG. 1, or from a drain area such as the n$^+$-type drain area 38 shown in FIG. 1.

During the first pinning period ⑤, the state of injecting an electron into the inversion layer is continued as the pinning. After the first pinning period ⑤, as shown in FIG. 30(b), the drain electrode potential of each ring shaped gate MOSFET of all pixels is raised to Vdd again, and, as shown in FIG. 30(d), the electric potential of each ring shaped gate elec-trode of all pixels is lowered to "Low" Succeedingly, reading out operation is conducted to lines "u" and "u+1", and then the above-mentioned pinning operation is repeated during the second pinning period ⑥. The pinning operation is conducted to reading out at every two lines.

Fifteenth Embodiment

With referring to FIGS. 31(a) to 31(q), a driving method, which enables to realize another pinning method according to a fifteenth embodiment of the present invention, is explained next.

Figure 31A:
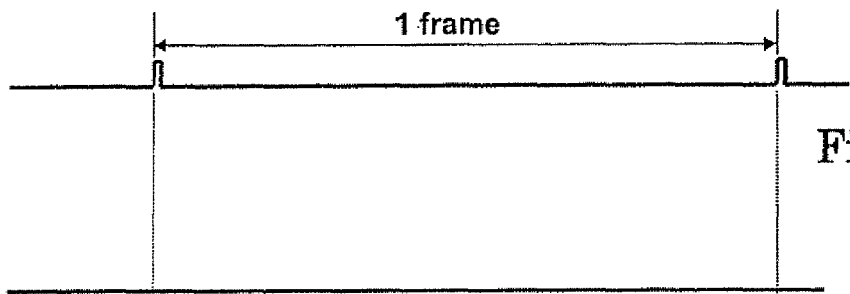
FIGS. 31(a) to 31(q) are timing charts for explaining operations in a driving method of a solid state image sensing device according to a fifteenth embodiment of the present invention.
Figure 31B:
Figure 31C:
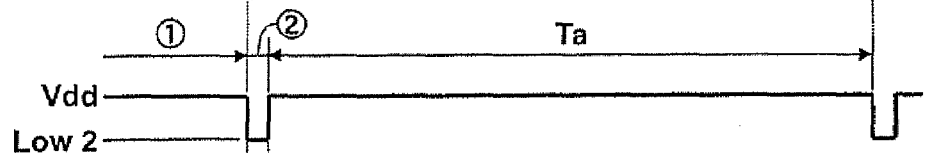
Figure 31D:
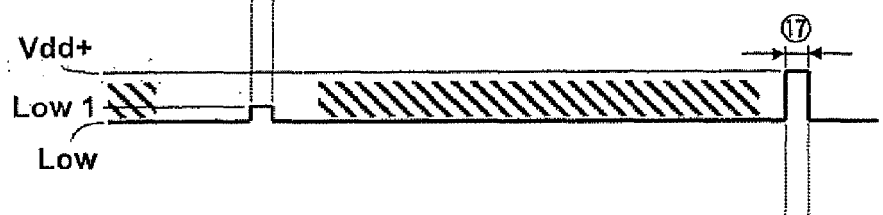
Figure 31E:
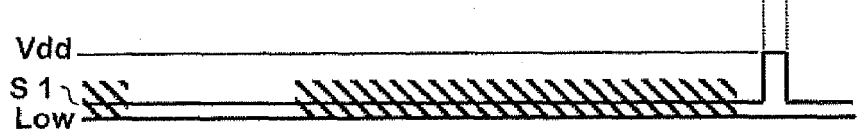
Figure 31F:
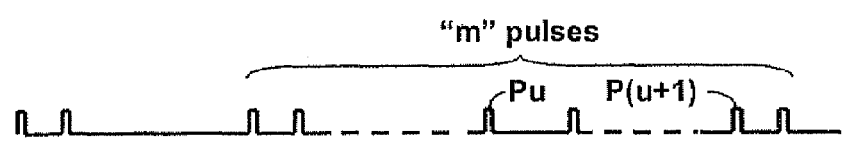
Figure 31G:
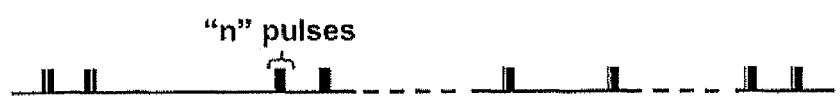
Figure 31H:
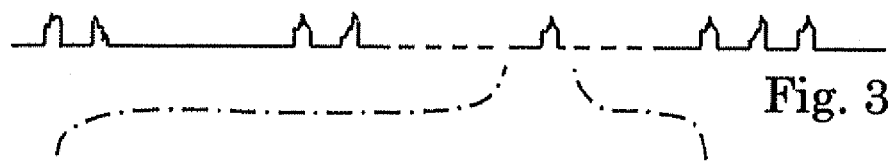
Figure 31I:
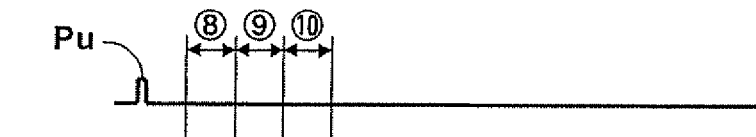
Figure 31J:
Figure 31K:
Figure 31L:
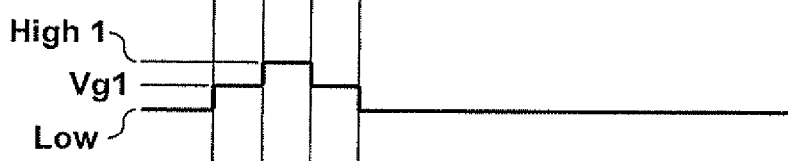
Figure 31M:
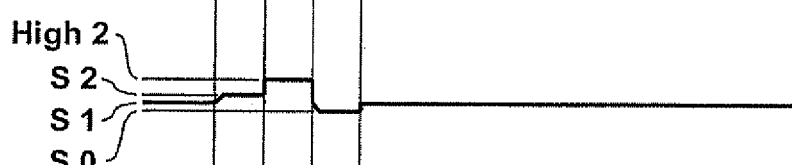
Figure 31N:
Figure 31O:
Figure 31P:
Figure 31Q:
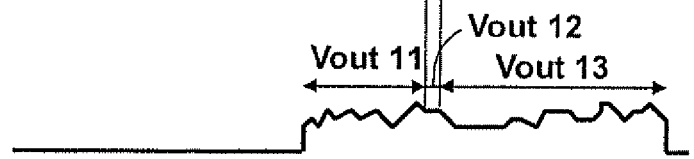
Figure 32:
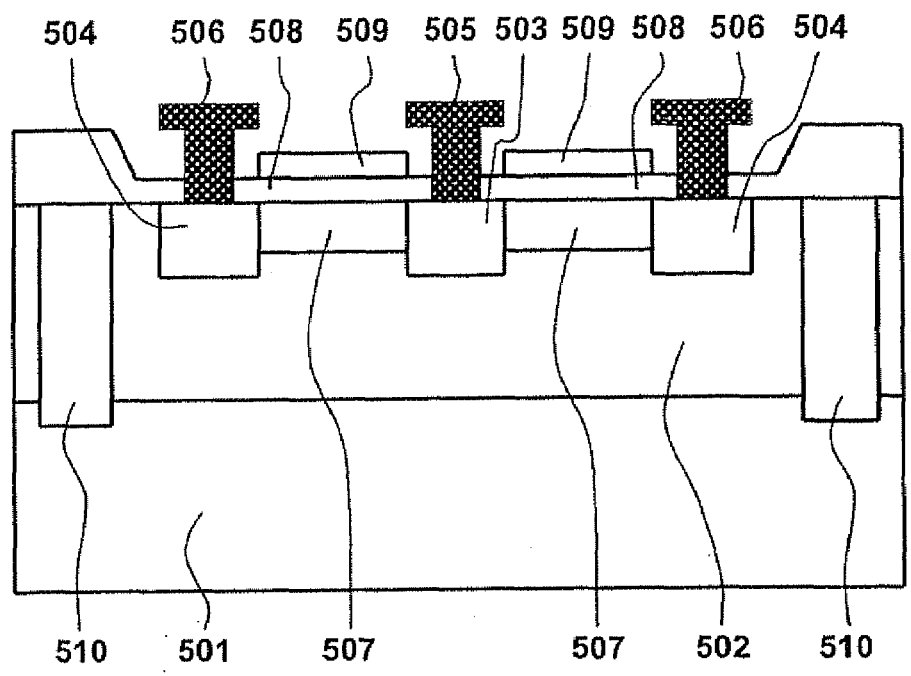
FIG. 32 is a first cross sectional view of a solid state image sensing device according to the first prior art.

FIGS. 31(a) to 31(q) are timing charts for explaining operations in a driving method of a solid state image sensing device according to a fifteenth embodiment of the present invention.

The other pinning method according to the fifteenth embodiment is identical to the pinning method according to the fourteenth embodiment shown in FIGS. 30(a) to 30(q) except for timing of the pinning operation, so that further details are omitted. In case of the fifteenth embodiment, the pinning is conducted during a pinning period ⑦ when reading out a pixel signal is completed over whole lines, not conducted at each 1H line. In other words, the pinning is conducted when information of one frame is read out.

Any solid state image sensing device according to the present invention is applied for a solid state image sensing device based on the other pinning method. In case of the fifteenth embodiment, operations are identical to those of the first embodiment until reading out from all lines in one frame is completed. However, when reading out from all lines is completed, as shown in FIG. 31(e), a source electrode potential of each ring shaped gate MOSFET of all pixels is raised to Vdd, and, as shown in FIG. 31(d), an electric potential of each ring shaped gate electrode is raised to "Vdd+".

Hereupon, relationship between potentials Vdd and "Vdd+" is as follows: "Vdd+">"Vdd"+"Vth", wherein Vth is threshold voltage of the ring shaped gate MOSFET. The electric potential "Vdd+" exceeds the threshold voltage Vth. Therefore, in all pixels, an interfacial area of a gate insulative film such as the reference sign 34 in FIG. 1 disposed under a ring shaped gate electrode such as the reference sign 35 in FIG. 1 of each pixels is conducted to be an inversion state, and resulting in injecting an electron into the inversion layer from a source area such as the n$^+$-type source area 36 shown in FIG. 1, or from a drain area such as the n$^+$-type drain area 38 shown in FIG. 1. Consequently, the pinning operation is completed.

As mentioned above, according to an aspect of the present invention, each electric charge of each pixel enables to be simultaneously transferred to a source neighborhood area disposed under a ring shaped gate electrode in each pixel, so that a frame shutter imaging system enables to be realized.

Further, a first conductive type area exists only in a neighboring area of a source electrode, and concentration of a first conductive type source neighborhood area enables to be lowered. Consequently, electric charges accumulated in the first conductive type source neighborhood area disposed under the ring shaped gate electrode enable to be exhausted to a substrate.

According to another aspect of the present invention, a second conductive type source area of a transistor for outputting a light signal enables to be formed in the source neighborhood area through self-aligning by the ring shaped gate electrode, so that a solid state image sensing device having less fluctuation in characteristic among pixels enables to be manufactured in higher accuracy than a method of forming a source neighborhood area and a source area by using a mask.

According to a further aspect of the present invention, by the solid state image sensing device of the present invention, a still picture enables to be taken at arbitrary exposure time covering from short exposure time, that is, a short shutter to long exposure time, that is, a long shutter.

According to a furthermore aspect of the present invention, an interfacial area of an insulative film disposed under a ring shaped gate electrode is conducted to be in an inversion state. Therefore, the pinning enables to be performed so as to suppress nose that generates in the interfacial area of the insulative film.

While the invention has been described above with reference to a specific embodiment thereof, it is apparent that many changes, modifications and variations in configuration, materials and the arrangement of equipment and devices can be made without departing form the invention concept disclosed herein. For example, a shape of a gate electrode is not limited to a circular shape. It is acceptable for the shape of the gate electrode to be in polygonal or any shape.

Further, it will be understood that the pinning operation shown in FIGS. 30(a) to 30(q) and 31a) to 31(q) enables to be conducted within one field.

Furthermore, it will be apparent to those skilled in the art that various modifications and variations could be made in the solid state image sensing device field in the present invention without departing from the scope of the invention.

What is claimed is:

1. A manufacturing method of a solid state image sensing device in which a plurality of unit pixels containing a transistor for outputting a light signal having a ring shaped gate electrode and a photo diode is regularly arranged on a first conductive type substrate, the manufacturing method comprising steps of:

forming a first conductive type source neighborhood area in a prescribed area allocated in a second conductive type well area provided over a surface of the first conductive type substrate;

forming the ring shaped gate electrode on the second conductive type well area with sandwiching a gate insulative film, wherein a center opening of the ring shaped gate electrode is arranged to be allocated above the first conductive type source neighborhood area;

forming a first conductive type high concentration area in the first conductive type source neighborhood area by injecting first conductive type impurity in high concentration into the first conductive type source neighborhood area through the ring shaped gate electrode as a mask;

forming a second conductive type surface layer in high concentration by injecting second conductive type impurity into the first conductive type high concentration area through the ring shaped gate electrode as a mask;

forming a side wall spacer on an inner wall of the center opening of the ring shaped gate electrode; and forming a second conductive type source area of the transistor for outputting a light signal on the second conductive type surface layer by injecting second conductive type impurity in high concentration into the second conductive type surface layer through the side wall spacer.

* * * * *